(12) United States Patent
Pott et al.

(10) Patent No.: US 9,165,932 B2
(45) Date of Patent: Oct. 20, 2015

(54) MEMORY CELL AND METHOD OF MANUFACTURING A MEMORY CELL

(75) Inventors: Vincent Pott, Singapore (SG); Navab Singh, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 455 days.

(21) Appl. No.: 13/531,792

(22) Filed: Jun. 25, 2012

(65) Prior Publication Data

US 2013/0020631 A1    Jan. 24, 2013

(30) Foreign Application Priority Data

Jun. 24, 2011  (SG) ................. 201104680-2

(51) Int. Cl.
| | | |
|---|---|---|
| H01L 29/76 | (2006.01) | |
| H01L 27/105 | (2006.01) | |
| H01L 29/68 | (2006.01) | |
| G11C 23/00 | (2006.01) | |

(52) U.S. Cl.
CPC ............ *H01L 27/1052* (2013.01); *G11C 23/00* (2013.01); *H01L 29/685* (2013.01)

(58) Field of Classification Search
CPC .................. H01L 41/0933; H01L 41/094
USPC .................. 257/324, E29.255, 288; 438/287
See application file for complete search history.

(56) References Cited

U.S. PATENT DOCUMENTS

| | | | |
|---|---|---|---|
| 5,677,823 A | 10/1997 | Smith | |
| 6,473,361 B1 | 10/2002 | Chen et al. | |
| 6,882,256 B1 | 4/2005 | Yip | |
| 7,420,729 B2* | 9/2008 | Mochizuki et al. | ........... 359/290 |
| 7,626,237 B1 | 12/2009 | Dariavach et al. | |
| 7,768,821 B2 | 8/2010 | Thomas et al. | |
| 2008/0144364 A1* | 6/2008 | Lee et al. | ...................... 365/164 |

OTHER PUBLICATIONS

Govoreanu, et al., On the Roll-Off of the Activation Energy Plot in High-Temperature Flash Memory Retention Tests and its Impact on the Reliability Assessment, 29 IEEE Electron Device Letters 177 (2008).
Fang, et al., Bias Temperature Instability of Binary Oxide Based ReRAM, Techn. Digest of IRPS, 964 (2010).
Lee, et al., Design Consideration of Magnetic Tunnel Junctions for Reliable High-Temperature Operation of STT-MRAM, 46 IEEE Transactions on Magnetics 1537 (IEEE 2010).
Wong, et al., Phase Change Memory, 98 Proc. IEEE 2201 (IEEE 2010).
Kamp, et al., A High-Rel Embedded Ferroelectric Memory, Proceedings of NVMTS, 56 (2007).
Pott, et al., Mechanical Computing Redux: Relays for Integrated Circuit Applications, 98 Proc. IEEE 2076, (IEEE 2010).

(Continued)

*Primary Examiner* — Kenneth Parker
*Assistant Examiner* — John Lin
(74) *Attorney, Agent, or Firm* — K. David Crockett, Esq.; Niky Economy Syrengelas, Esq.; Crockett & Crockett, PC

(57) ABSTRACT

A memory cell and a method of manufacturing a memory cell are provided. The memory cell includes a substrate; at least one first electrode disposed above the substrate; at least one second electrode disposed above the at least one first electrode; a moveable electrode disposed between the at least one first electrode and the at least one second electrode; wherein the moveable electrode is configured to move between the at least one first electrode and the at least one second electrode; wherein the moveable electrode comprises metal.

17 Claims, 41 Drawing Sheets

(56) References Cited

OTHER PUBLICATIONS

Halg, On a Micro-Electro-Mechanical Nonvolatile Memory Cell, 37 IEEE Transactions of Electron Devices 2230 (IEEE 1990).
Choi, et al., Compact Nano-Electro-Mechanical Non-Volatile Memory (NEMory) for 3D Integration, 603 (IEEE 2007).
Kang, et al., Electrostatically Telescoping Nanotube Nonvolatile Memory Device, 18 Nanotech (2007).
Jang, et al., Mechanically Operated Random Access Memory (MORAM) Based on an Electrostatic Microswitch for Nonvolatile Memory Applications, 55 IEEE Transactions on Electron Devices 2785 (IEEE 2008).
Lee, et al., AFM Characterization of Adhesion Force in Micro-Relays, 232 (IEEE 2010).
Delrio, et al., The Role of Van Der Waals Forces in Adhesion of Micromachined Surfaces, 4 Nature Materials 629 (2005).

* cited by examiner

*Van der Waals flight*

*Acceleration phase*

*Middle flight* g) Free flight h) Landing + shuttle discharge i) Stable

| | | |
|---|---|---|
| Writing 'down' | WL=$V_{DD}$ & S1=D1=$V_p$ & G1=0 | $V_{DD} > V_p$ | — 2602
| Writing 'up' | WL=$V_{DD}$ & S1=D1=0 & G1=$V_p$ | $V_{DD} > V_p$ | — 2604
| Half-selected | WL=$V_{DD}$ & S1=D1=G1=0 | No potential difference between terminals | — 2606
| Unselected | WL=0 & G1=0 or $V_p$ | Floating source (S) / drain (D) following voltage changes in 'G' | — 2608

TOP VIEW

TOP VIEW

MEMORY CELL AND METHOD OF MANUFACTURING A MEMORY CELL

This application claims the benefit of priority of Singapore Patent Application No. 201104680-2, filed 24 Jun. 2011, the contents of which being hereby incorporated by reference in its entirety for all purposes.

FIELD OF THE INVENTIONS

Various embodiments relate generally to a memory cell and a method of manufacturing a memory cell.

BACKGROUND OF THE INVENTIONS

Non-volatile memories are components of electronic systems. Some examples of non-volatile memories include FLASH memory, ferroelectric random access memory (Fe-RAM), magnetoresistive random access memory (M-RAM), phase change random access memory (PC-RAM), resistive random access memory (R-RAM) and conductive briding random access memory (CB-RAM).

Non-volatile memories usually use storage layers. Some examples of solid-state storage layers are charge storage layers used in FLASH memory, polarized dielectric layers used in RAM, flipping magnetic alloys used in M-RAM, phase-change alloys used in PC-RAM, and resistive-change materials used in R-RAM and CB-RAM.

However, storage layers may fail and leak. Thus, memories based on a storage layer may suffer from poor retention at high temperature (e.g. at a temperature greater than 150° C.) and high voltage writing, and may wear out while cycling. Therefore, it is desirable to have memories which can provide reliable high temperature data storage.

SUMMARY

According to one embodiment, a memory cell is provided. The memory cell includes a substrate; at least one first electrode disposed above the substrate; at least one second electrode disposed above the at least one first electrode; a moveable electrode disposed between the at least one first electrode and the at least one second electrode; wherein the moveable electrode is configured to move between the at least one first electrode and the at least one second electrode; wherein the moveable electrode includes metal.

According to another embodiment, a method of manufacturing a memory cell is provided. The method includes providing a first metal layer and patterning the first metal layer to form at least one first electrode; depositing a first sacrificial layer above the first metal layer; depositing a second metal layer above the first sacrificial layer; depositing a second sacrificial layer above the second metal layer; depositing a third metal layer above the second sacrificial layer; depositing a first sacrificial pillar structure at one side of the first sacrificial layer, the second metal layer, the second sacrificial layer and the third metal layer, and a second sacrificial pillar structure at the other side of the first sacrificial layer, the second metal layer, the second sacrificial layer and the third metal layer; depositing a first insulator layer above the third metal layer, the first sacrificial pillar structure, the second sacrificial pillar structure and the first metal layer; etching an opening in the first insulator layer to expose a portion of the third metal layer; depositing a fourth metal layer above the first insulator layer and the exposed portion of the third metal layer; etching an opening in the fourth metal layer and the third metal layer to form at least one second electrode; removing the first sacrificial layer, the second sacrificial layer, the first sacrificial pillar structure and the second sacrificial pillar structure to form a moveable electrode and to provide a cavity for guiding movement of the moveable electrode between the at least one first electrode and the at least one second electrode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 26 shows a logic table of an addressing scheme of a memory array having memory cells according to one embodiment.

DETAILED DESCRIPTION OF THE INVENTIONS

Embodiments of a memory cell and a method of manufacturing a memory cell will be described in detail below with reference to the accompanying figures. It will be appreciated that the embodiments described below can be modified in various aspects without changing the essence of the invention.

Figure 1A:
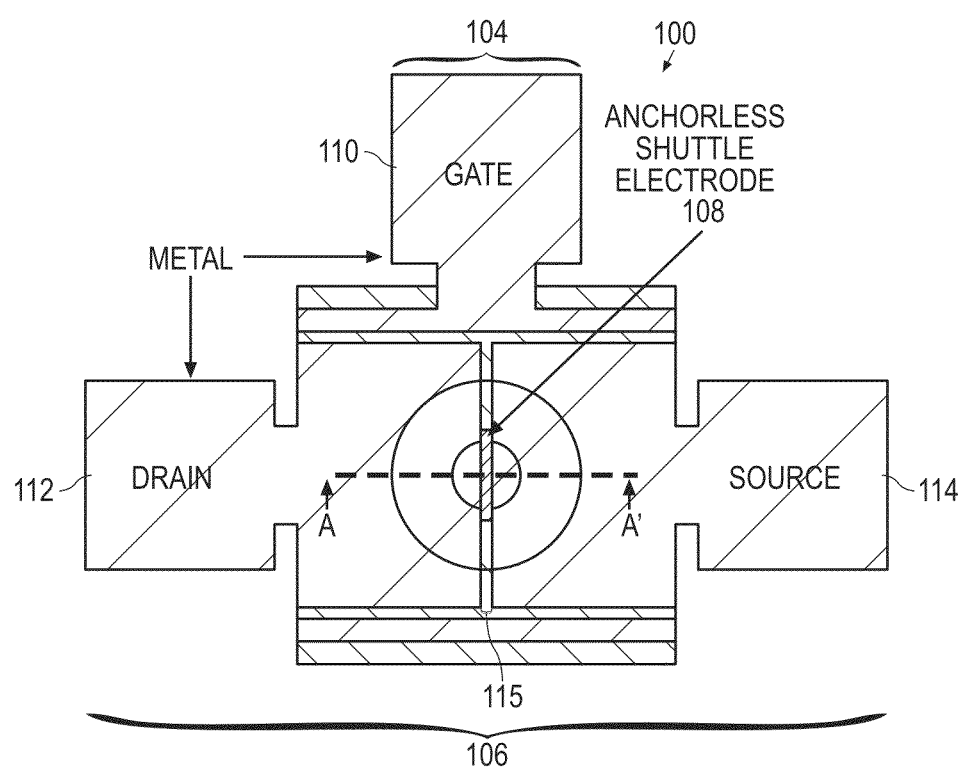
FIG. 1a shows a top view of a memory cell according to one embodiment.
Figure 1B:
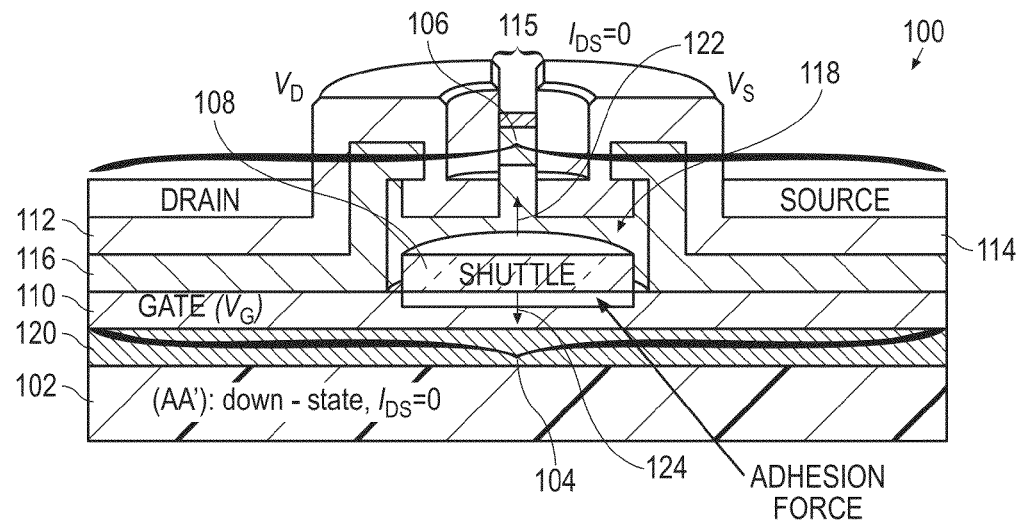
FIGS. 1b and 1c show cross-sectional views of a memory cell according to one embodiment.
Figure 1C:
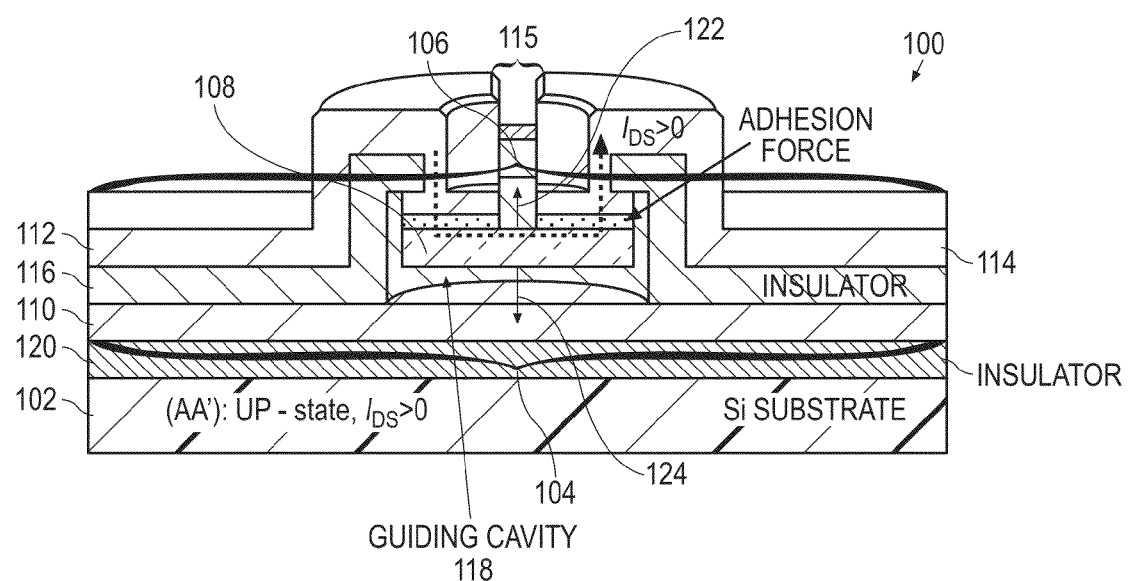
Figure 1D:
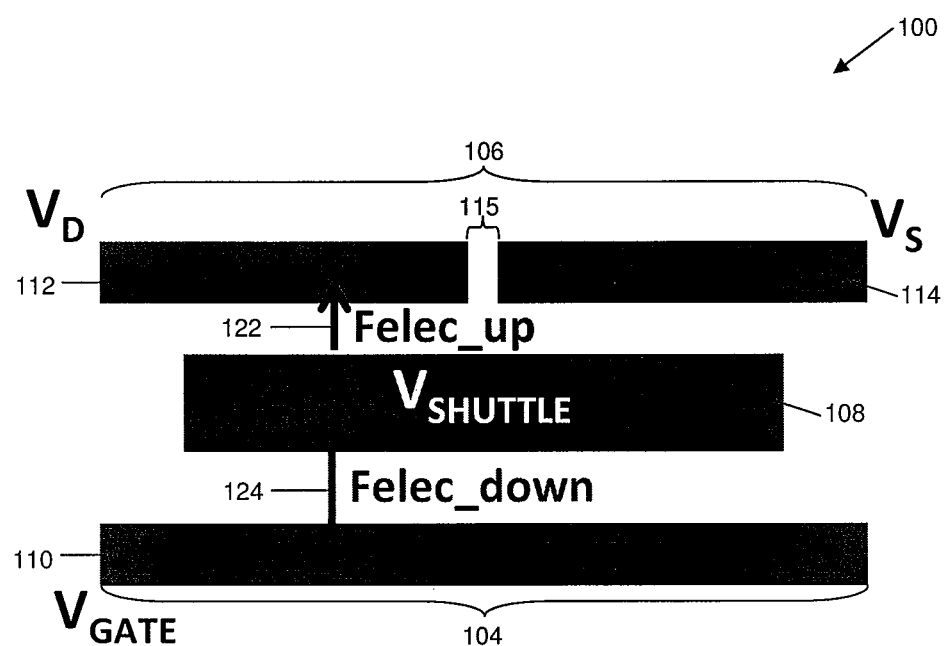
FIG. 1d shows a schematic diagram of a memory cell according to one embodiment.

FIG. 1a shows a top view of a memory cell 100 according to one embodiment. FIGS. 1b and 1c show cross-sectional views of the memory cell 100. FIG. 1d shows a schematic diagram of the memory cell 100. The memory cell 100 includes a substrate 102, at least one first electrode 104, at least one second electrode 106 and a moveable electrode 108. The at least one first electrode 104 is disposed above the substrate 102. The at least one second electrode 106 is disposed above the at least one first electrode 104. The moveable electrode 108 is disposed between the at least one first electrode 104 and the at least one second electrode 106. The moveable electrode 108 is moveable between the at least one first electrode 104 and the at least one second electrode 106.

In one embodiment, the at least one first electrode 104 includes a gate electrode 110, and the at least one second electrode 106 includes a drain electrode 112 and a source electrode 114. The drain electrode 112 may be arranged adjacent to the source electrode 114 such that the drain electrode 112 and the source electrode 114 are separated by a gap 115.

The memory cell 100 further includes an insulator layer 116 disposed between the at least one first electrode 104 and the at least one second electrode 106. The insulator layer 116, the at least one first electrode 104 and the at least one second electrode 106 define a cavity 118 for guiding a movement of the moveable electrode between the at least one first electrode 104 and the at least one second electrode 106.

The memory cell 100 also includes a further insulator layer 120 disposed between the substrate 102 and the at least one first electrode 104.

In one embodiment, the moveable electrode 108 includes metal. Various types of metal may be used for the moveable electrode 108. The materials used for the moveable electrode 108 may include metals which makes reliable electro-mechanical contacts. One example of metal used for the moveable electrode 108 is tantalum nitride. In one embodiment, tantalum nitride (TaN) is used for the moveable electrode 108 as it is a hard material and does not tarnish or oxidize easily, even at high temperature. Other examples of metal used for the moveable electrode 108 may include but are not limited to titanium nitride (TiN), ruthenium (Ru) and molybdenum (Mo).

In one embodiment, the at least one first electrode 104 and the at least one second electrode 106 includes metal. Various types of metal may be used for the at least one first electrode 104 and the at least one second electrode 106. The materials used for the at least one first electrode 104 and the at least one second electrode 106 may include metals which makes reliable electro-mechanical contacts. One example of metal used for the at least one first electrode 104 and the at least one second electrode 106 is tantalum nitride. In one embodiment, tantalum nitride (TaN) is used for the at least one first electrode 104 and the at least one second electrode 106 as it is a hard material and does not tarnish or oxidize easily, even at high temperature. Other examples of metal used for the at least one first electrode 104 and the at least one second electrode 106 may include but are not limited to titanium nitride (TiN), ruthenium (Ru) and molybdenum (Mo).

In one embodiment, the materials used for the substrate 102 may include but are not limited to silicon and glass. The materials used for the insulator layer 116 and the further insulator layer 120 may include but are not limited to silicon nitride (SiN), aluminum oxide (Al2O3) and amorphous silicon (a-Si).

Figure 2:
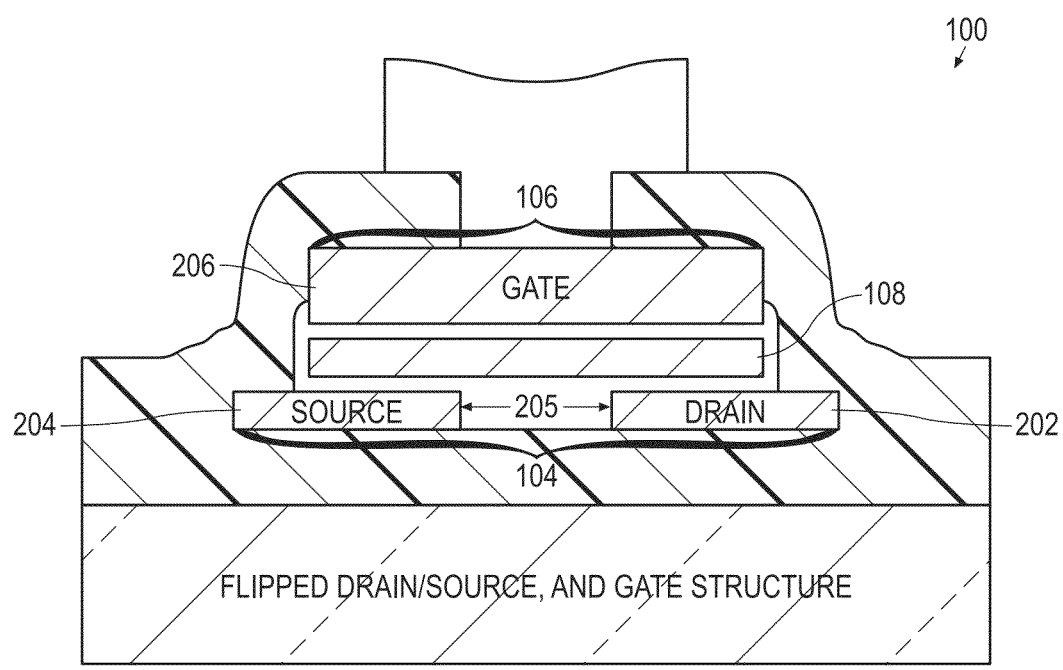
FIG. 2 shows a cross-sectional view of a memory cell according to one embodiment.

FIG. 2 shows a cross-sectional view of a memory cell 100 according to one embodiment. In one embodiment, the at least one first electrode 104 includes a drain electrode 202 and a source electrode 204. The drain electrode 202 may be arranged adjacent to the source electrode 204 such that the drain electrode 202 and the source electrode 204 are separated by a gap 205. The at least one second electrode 106 includes a gate electrode 206.

In one embodiment, the memory cells 100 shown in FIGS. 1 and 2 are a three-terminal shuttle memory device. The memory cells 100 shown in FIGS. 1 and 2 may be non-volatile and may be a pulsed mode memory.

Figure 3:
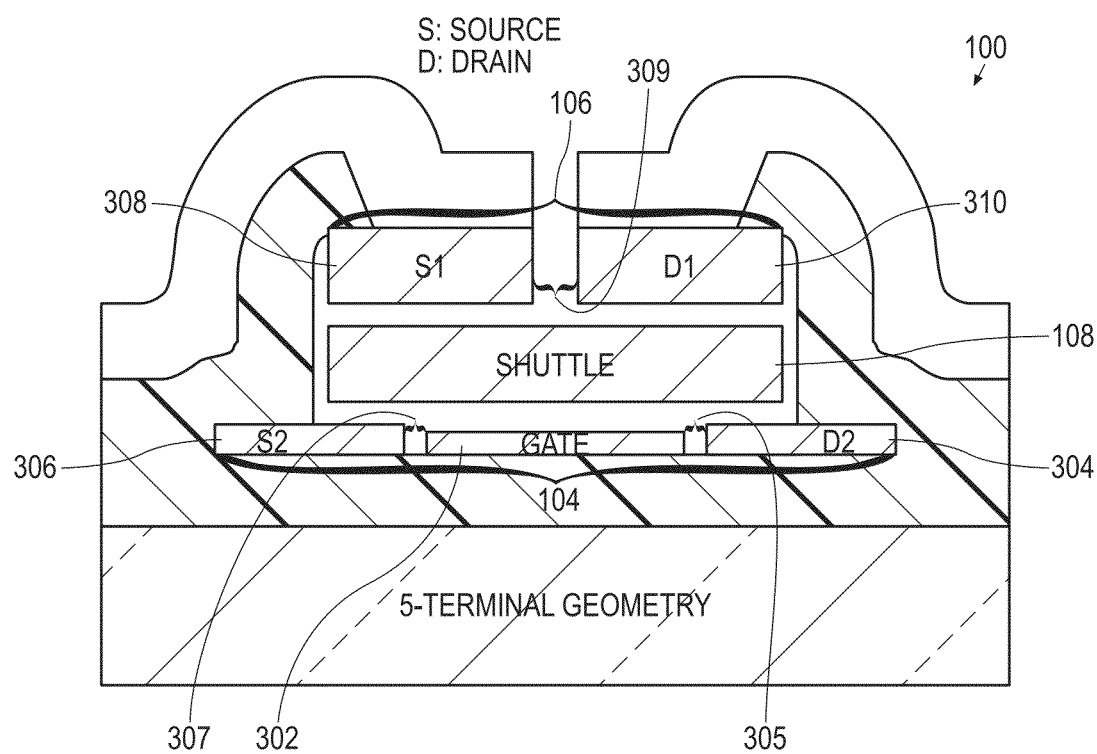
FIG. 3 shows a cross-sectional view of a memory cell according to one embodiment.

FIG. 3 shows a cross-sectional view of a memory cell 100 according to one embodiment. In one embodiment, the at least one first electrode 104 includes a gate electrode 302, a drain electrode 304 and a source electrode 306. The gate electrode 302 may be arranged adjacent to the drain electrode 304 and the source electrode 306 such that the gate electrode 302 and the drain electrode 304 are separated by a first gap 305 and the gate electrode 302 and the source electrode 306 are separated by a second gap 307. The at least one second electrode 106 includes a drain electrode 308 and a source electrode 310. The drain electrode 308 may be arranged adjacent to the source electrode 310 such that the drain electrode 308 and the source electrode 310 are separated by a gap 309.

In one embodiment, the memory cell 100 of FIG. 3 is a five-terminal memory device. The memory cell 100 of FIG. 3 may be non-volatile.

Figure 4:
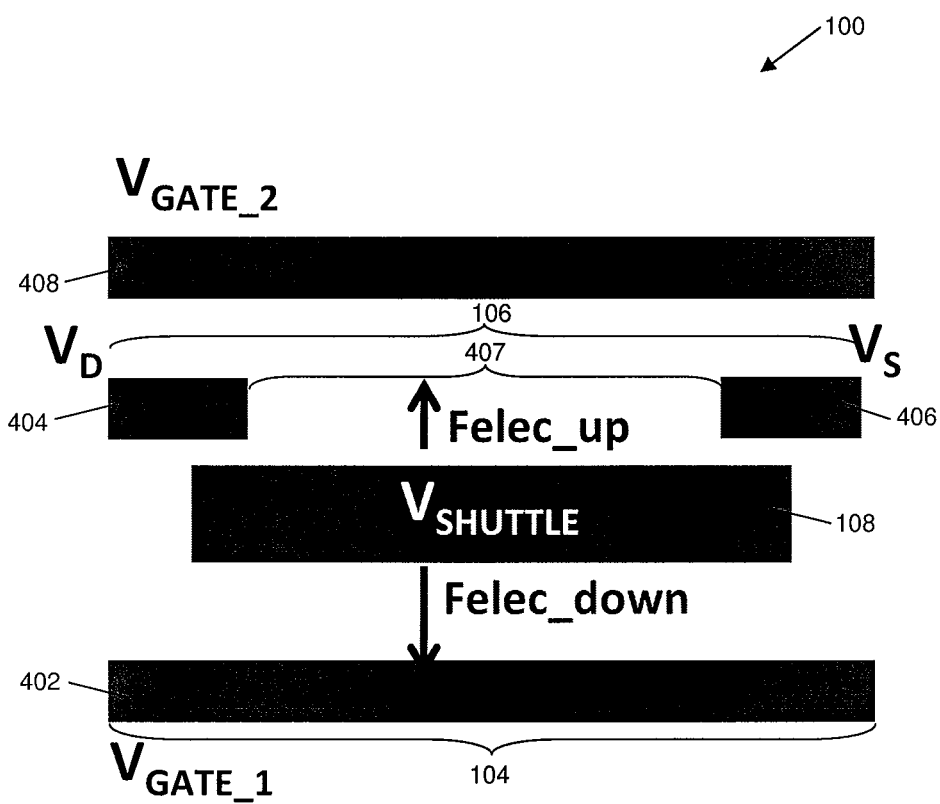
FIG. 4 shows a schematic diagram of a memory cell according to one embodiment.

FIG. 4 shows a schematic diagram of a memory cell 100 according to one embodiment. In one embodiment, the at least one first electrode 104 includes a gate electrode 402, and the at least one second electrode 106 includes a drain electrode 404 and a source electrode 406. The drain electrode 404 may be arranged adjacent to the source electrode 406 such that the drain electrode 404 and the source electrode 406 are separated by a gap 407. The memory cell 100 further includes a further gate electrode 408 disposed above the drain electrode 404 and the source electrode 406.

In one embodiment, the memory cell 100 of FIG. 4 is a four-terminal memory device. The memory cell 100 of FIG. 4 may be a four-terminal pass-gate logic switch. The memory cell 100 of FIG. 4 may be non-volatile. The drain electrode 404 and the source electrode 406 of the memory cell 100 shown in FIG. 4 may act as shuttle bumpers. The memory cell 100 of FIG. 4 may be a non-pulsed mode memory.

Operation of the memory cell 100 is described in detail in the following and with reference to FIGS. 1b, 1c and 1d.

The moveable electrode 108 may move from the at least one first electrode 104 to the at least one second electrode 106 or from the at least one second electrode 106 to the at least one first electrode 104 depending on the voltages applied to the at least one first electrode 104 and to the at least one second electrode 106 respectively.

FIG. 1b shows the moveable electrode 108 contacting the at least one first electrode 104. FIG. 1c shows the moveable electrode 108 contacting the at least one second electrode 106. FIG. 1d shows the moveable electrode 108 moving from the at least one first electrode 104 to the at least one second electrode 106 or from the at least one second electrode 106 to the at least one first electrode 104.

If the moveable electrode 108 is at an initial position, i.e. contacting the at least one first electrode 104 as shown in FIG. 1b, the moveable electrode 108 may move from the at least one first electrode 104 to the at least one second electrode 106 when a voltage applied to the at least one second electrode 106 is larger than a voltage applied to the at least one first electrode 104. The voltage applied to the at least one second electrode 106 causes a first electrostatic force in a direction 122 towards the at least one second electrode 106 to be applied to the moveable electrode 108. The voltage applied to the at least one first electrode 104 causes a second electrostatic force in a direction 124 towards the at least one first electrode 104 to be applied to the moveable electrode 108. The first electrostatic force is larger than the second electrostatic force and an adhesion force between the moveable electrode 108 and the at least one first electrode 104. The adhesion force is the force which keeps the moveable electrode 108 in contact with the at least one first electrode 104. When the first electrostatic force is larger than the second electrostatic force and the adhesion force between the moveable electrode 108 and the at least one first electrode 104, the moveable electrode 108 moves from the at least one first electrode 104 to the at least one second electrode 106. The moveable electrode 108 contacts the at least one second electrode 106 when no voltage is applied to the at least one first electrode 104 and the at least one second electrode 106.

If the moveable electrode 108 is at an initial position, i.e. contacting the at least one second electrode 106 as shown in FIG. 1c, the moveable electrode 108 may move from the at least one second electrode 106 to the at least one first electrode 104 when a voltage applied to the at least one first electrode 104 is larger than a voltage applied to the at least one second electrode 106. The voltage applied to the at least one first electrode 104 causes a first electrostatic force in a direction 124 towards the at least one first electrode 104 to be applied to the moveable electrode 108. The voltage applied to the at least one second electrode 106 causes a second electrostatic force in a direction 122 towards the at least one second electrode 106 to be applied to the moveable electrode 108. The first electrostatic force is larger than the second electrostatic force and an adhesion force between the moveable electrode 108 and the at least one second electrode 106. The adhesion force is the force which keeps the moveable electrode 108 in contact with the at least one second electrode 106. When the first electrostatic force is larger than the second electrostatic force and the adhesion force between the moveable electrode 108 and the at least one second electrode 106, the moveable electrode 108 moves from the at least one second electrode 106 to the at least one first electrode 104. The moveable electrode 108 contacts the at least one first electrode 104 when no voltage is applied to the at least one first electrode 104 and the at least one second electrode 106.

In one embodiment, reading of the memory cell 100 is carried out by passing a small current between the drain electrode 112 and the source electrode 114 when the moveable electrode 108 is contacting the drain electrode 112 and the source electrode 114. The moveable electrode 108 acts as a shorting conductive bridge between the drain electrode 112 and the source electrode 114.

The movement of the moveable electrode 108 between the at least one first electrode 104 and the at least one second electrode 106 is described in more detail in the following.

Figure 5:
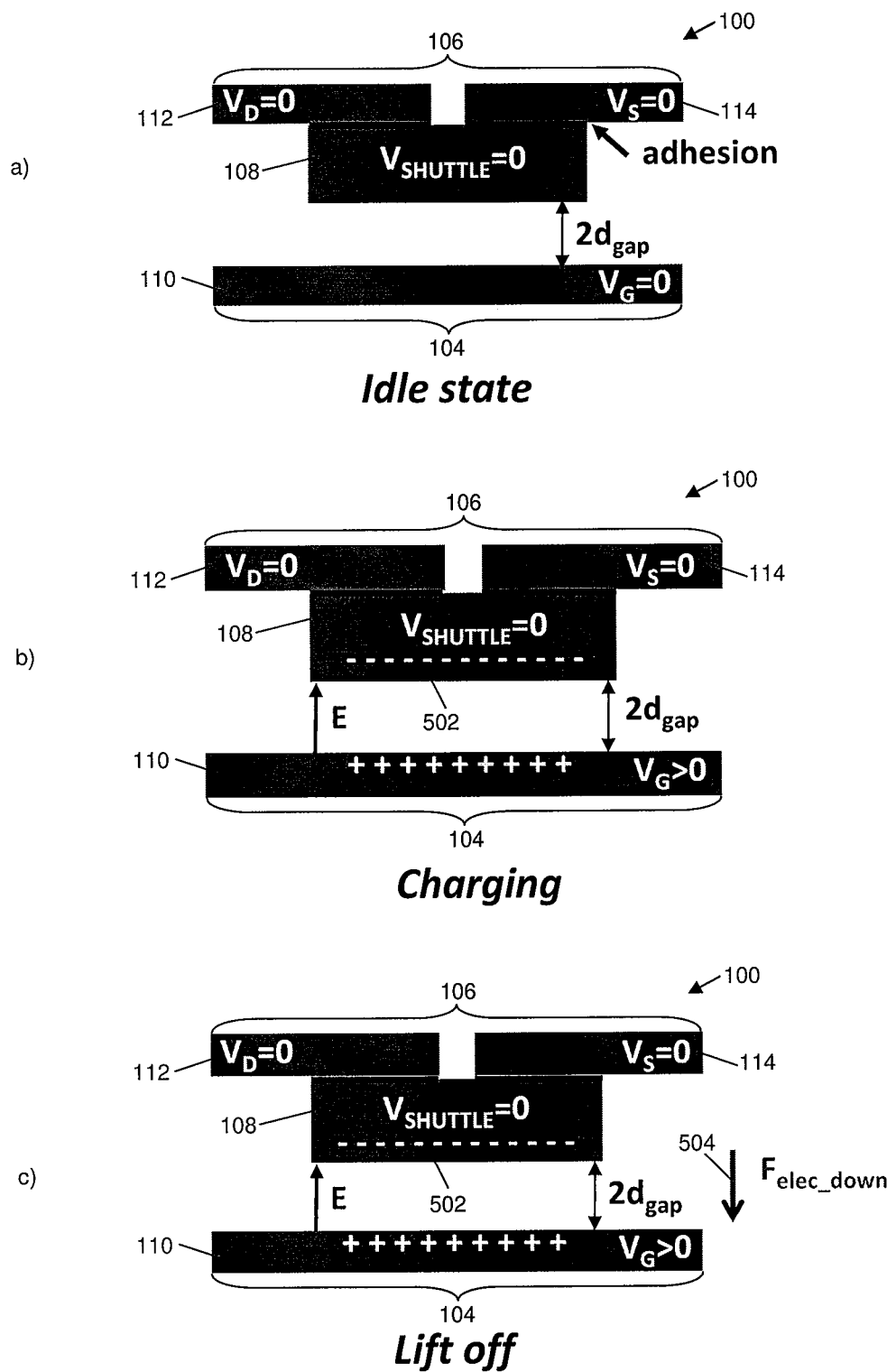
FIG. 5 illustrates a movement of a moveable electrode of a memory cell according to one embodiment.
Figure 5:
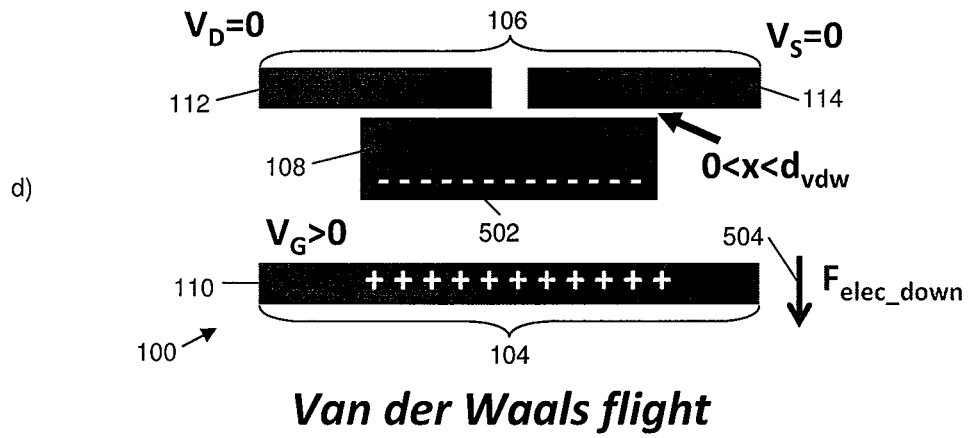
Figure 5:
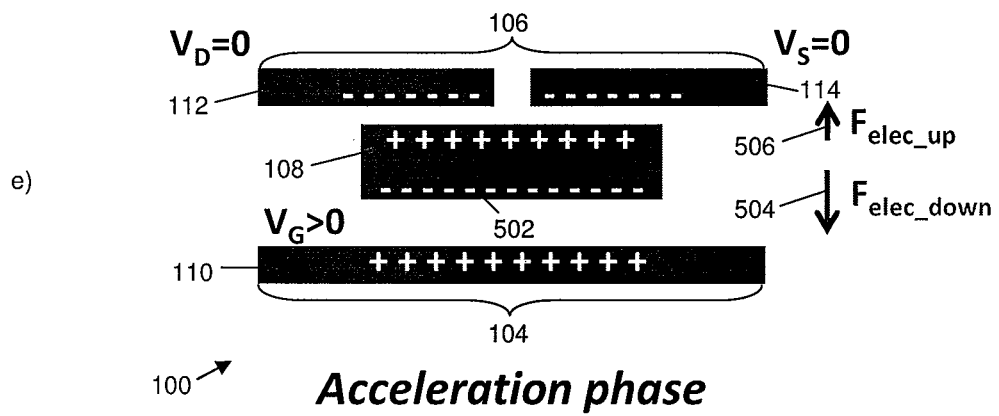
Figure 5:
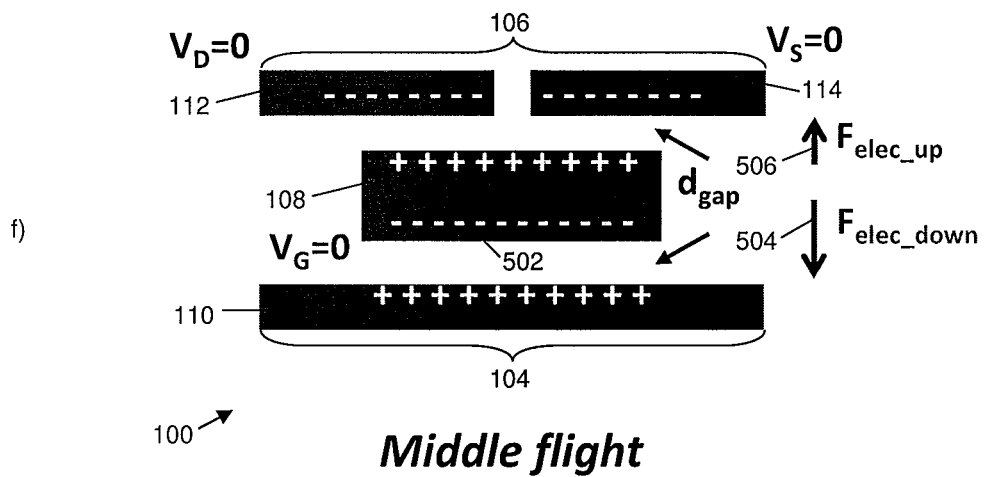
Figure 5:
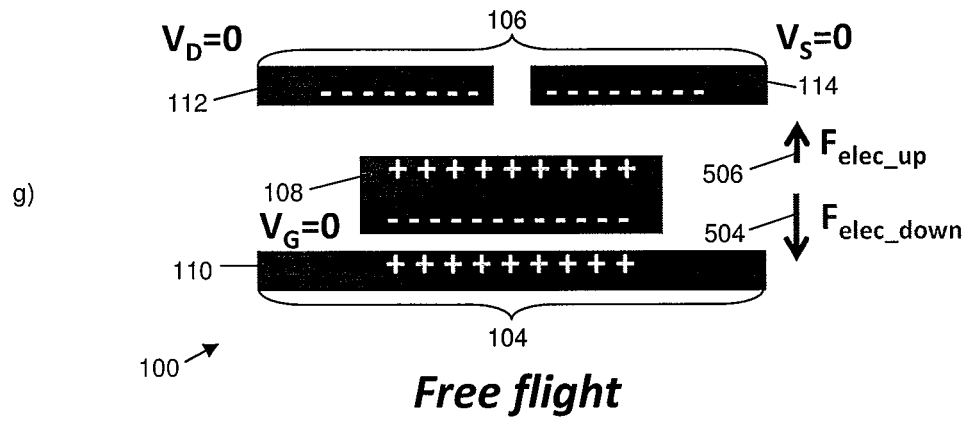
Figure 5:
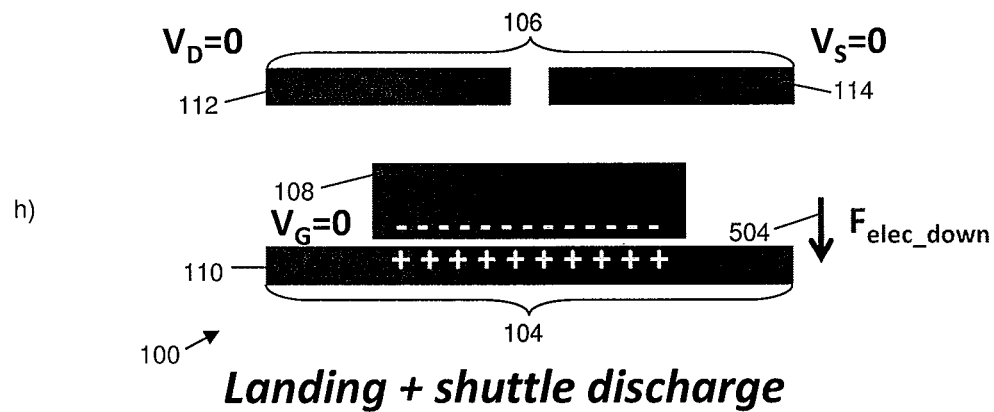
Figure 5:
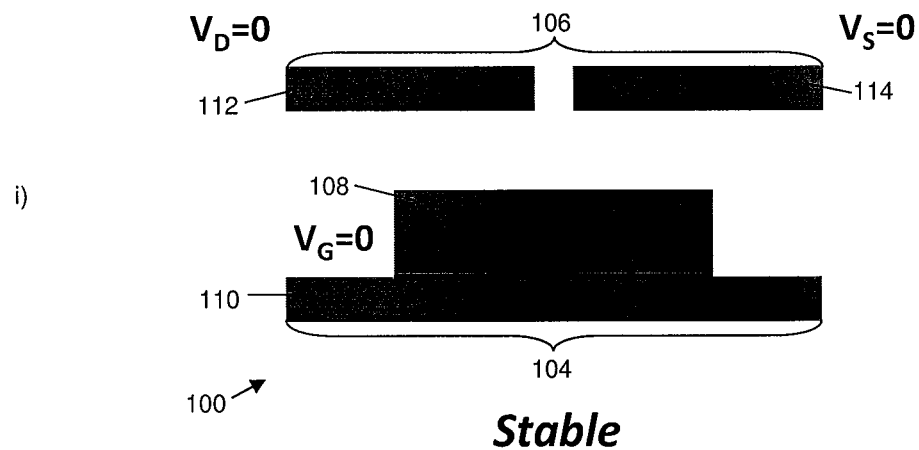

FIG. 5 illustrates the movement of the moveable electrode 108 from the at least one second electrode 106 to the at least one first electrode 104. FIG. 5a shows the moveable electrode 108 contacting the at least one second electrode 106, i.e. the drain electrode 112 and the source electrode 114. In one embodiment, the moveable electrode 108 may have a length of about 2 µm, a width of about 2 µm and a thickness of about 300 nm. The distance between the moveable electrode 108 and the at least one first electrode 104, i.e. the gate electrode 110 may be $2d_{gap}$. The distance dgap may be termed as an actuation gap. As an example, the distance between the moveable electrode 108 and the gate electrode 110 may be about 200 nm. Thus, the distance $d_{gap}$ may be about 100 nm. In one embodiment, the distance $d_{gap}$ may range from about 10 nm to about 200 nm. The distance between the moveable electrode 108 and the gate electrode 110 may range from about 20 nm to about 400 nm.

The moveable electrode 108 may be kept in contact with the drain electrode 112 and the source electrode 114 by an adhesion force between the moveable electrode 108 and the drain electrode 112 and the source electrode 114. The same voltage may be applied to both the at least one first electrode 104 and the at least one second electrode 106. The voltage may be about 0 V.

Figure 6:
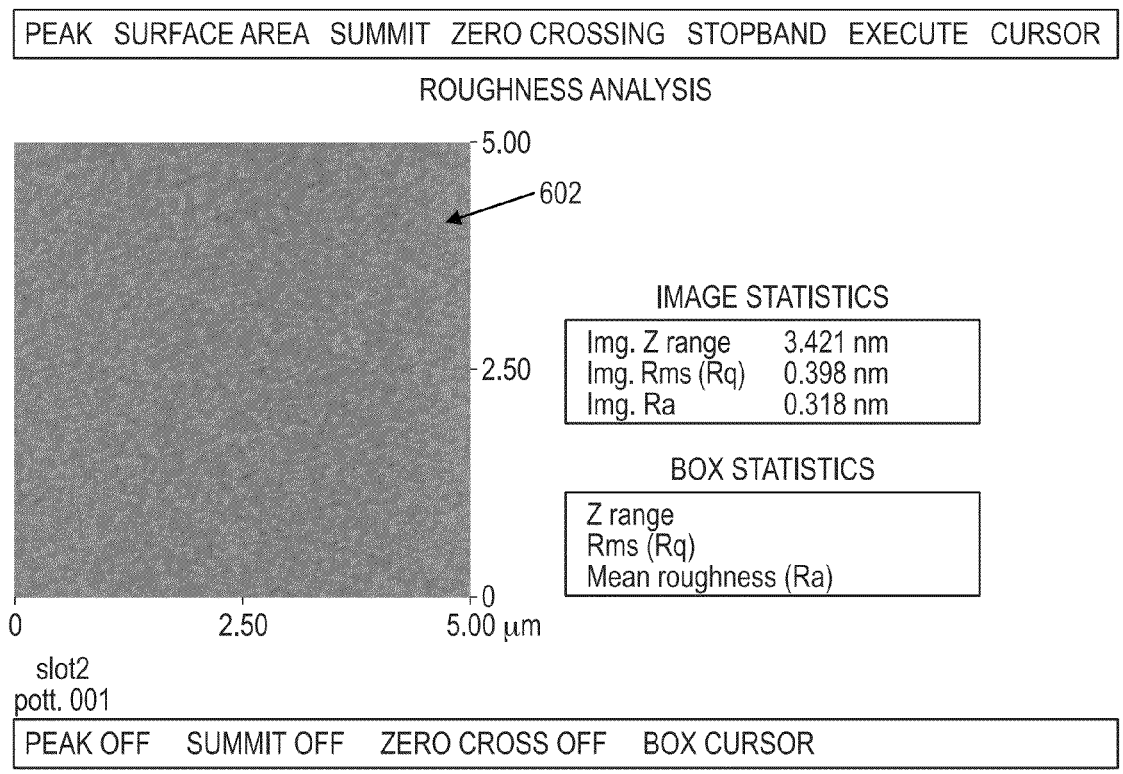
FIG. 6 shows an experimental roughness analysis of an atomic force microscopy (AFM) scan of a physical vapour deposition (PVD) tantalum nitride (TaN) surface according to one embodiment.

The adhesion force can be experimentally extracted and may be dependent on various factors such as micro-welding in contact area, van der Waals forces, ambient (humidity, temperature), and surface roughness. The adhesion force can be engineered by material choice and proper surface treatment (e.g. chemical mechanical planarization (CMP), atomic layer deposition (ALD) coating). FIG. 6 shows an experimental roughness analysis of an atomic force microscopy (AFM) scan of a physical vapour deposition (PVD) tantalum nitride (TaN) surface 602. The root mean square (RMS) of the surface roughness obtained from the experiment is about 0.398 nm.

Adhesion energy can be obtained by using the following equation:

$$\Gamma = \frac{A_{TaN}}{12 \cdot \pi \cdot D_{rms}^2}$$

whereby $\Gamma$ is the adhesion energy, $A_{TaN}$ is Hamaker constant of the TaN-TaN system, and Drms is the root mean square (RMS) surface roughness of tantalum nitride (TaN).

The adhesion force can then be obtained by using the following equation:

$$F_{a\_contact} = \frac{2\Gamma \cdot \alpha}{d_{vdw}}$$

whereby $F_{a\_contact}$ is the adhesion force, $\Gamma$ is the adhesion energy, $d_{vdw}$ is Van der Waals distance, and a is a ratio of a real contact area between the moveable electrode 108 and the at least one second electrode 106 and an apparent contact area between the moveable electrode 108 and the at least one second electrode 106.

If the moveable electrode 108 and the at least one second electrode 106 are made of tantalum nitride (TaN), the adhesion force between the moveable electrode 108 and the at least one second electrode 106 can be as high as 15 kN/m². As such, gravity acting on the moveable electrode 108 is negligible as compared to the adhesion force.

FIG. 5b shows a voltage applied to the gate electrode 110. The moveable electrode 108 may be charged due to the voltage applied to the gate electrode 110.

The charge of the moveable electrode 108 may be obtained using the following equation:

$$Q = CV = \varepsilon_0 \cdot \frac{A}{2d_{gap}} \cdot V_G$$

whereby Q is the charge of the moveable electrode 108, C is the capacitance of the moveable electrode 108, V is the voltage applied on the gate electrode 110, $\in_0$ is the dielectric constant of vacuum, A is the area of the surface 502 of the moveable electrode 108 facing the gate electrode 110, $2d_{gap}$ is the distance between the moveable electrode 108 and the gate electrode 110, and $V_G$ is the voltage applied on the gate electrode 110.

A voltage may also be applied to the drain electrode 112 and the source electrode 114. The voltage applied to the drain electrode 112 and the source electrode 114 may be smaller than the voltage applied to the gate electrode 110.

In one embodiment, the voltage applied to the gate electrode 110 is about 10 V. The voltage applied to the drain electrode 112 and the source electrode 114 is about 0 V. In other embodiments, different values of voltages can be applied to the gate electrode 110 and to the drain electrode 112 and the source electrode 114 respectively.

Figure 7:
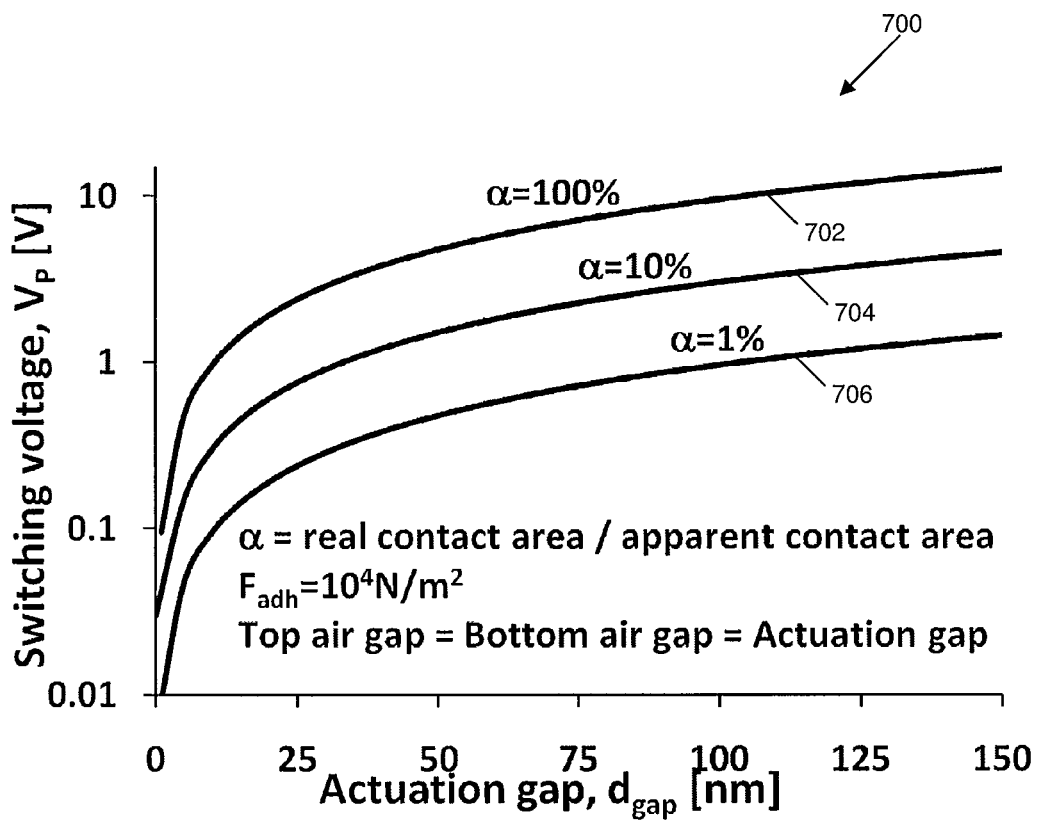
FIG. 7 shows a graph illustrating a switching voltage plotted against an actuation gap according to one embodiment.

To initiate switching of the moveable electrode 108 from the drain electrode 112 and the source electrode 114 to the gate electrode, a minimum voltage difference between the at least one second electrode 106 (i.e. the drain electrode 112 and the source electrode 114) and the at least one first electrode 104 (i.e. the gate electrode) may be obtained. The minimum voltage difference between the at least one second electrode 106 and the at least one first electrode 104 may be termed as a switching voltage. FIG. 7 shows a graph 700 illustrating a switching voltage plotted against an actuation gap. Graph 700 shows a plot 702 of the switching voltage plotted against the actuation gap for $\alpha$=100%, a plot 704 of the switching voltage plotted against the actuation gap for $\alpha$=10%, and plot 706 of the switching voltage plotted against the actuation gap for $\alpha$=1%. Taking the adhesion force into consideration, a switching voltage for the moveable electrode 108 may be in the range of about 2 V to about 8 V.

Figure 8:
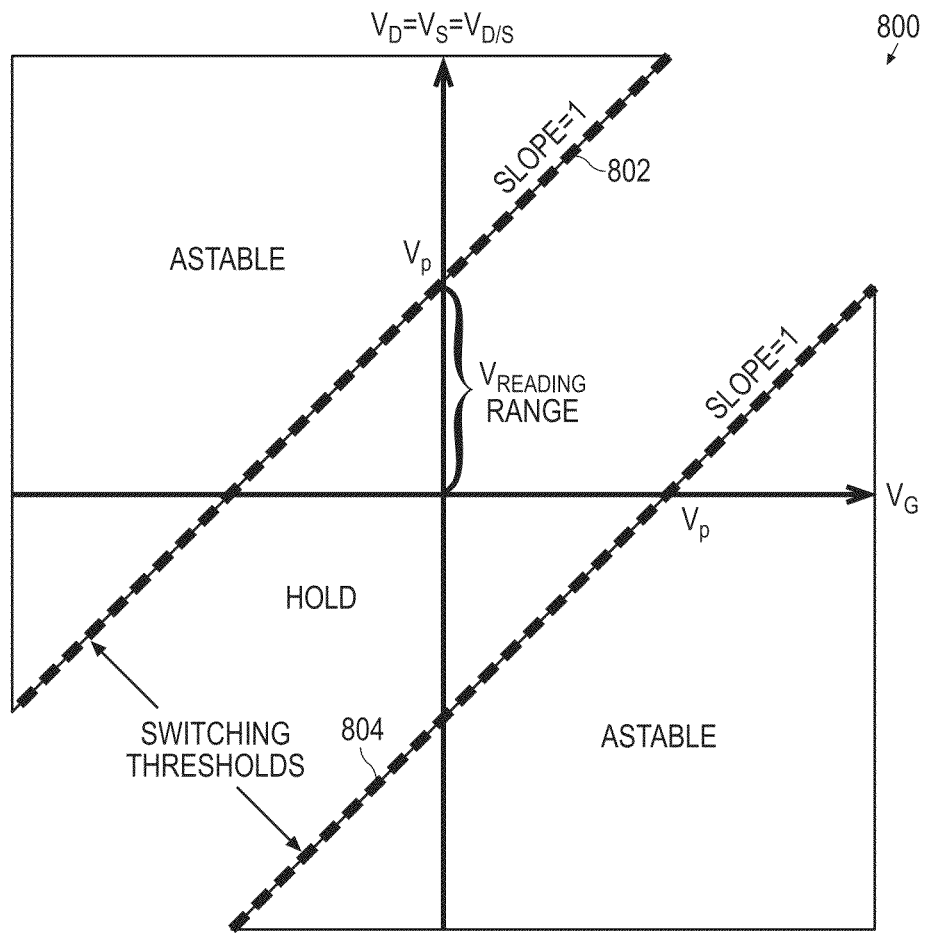
FIG. 8 shows a stability plot of a memory cell according to one embodiment.

The switching voltage to initiate switching of the moveable electrode 108 from the at least one first electrode 104 to the at least one second electrode 106 may be different from the switching voltage to initiate switching of the moveable electrode 108 from the at least one second electrode 106 to the at least one first electrode 104. The difference between the two switching voltages may be small due to the narrow slit between the drain electrode 112 and the source electrode 114. FIG. 8 shows a stability plot 800 of the memory cell 100. FIG. 8 shows the switching voltage $V_p$ and a range of the reading voltage $V_R$. FIG. 8 also shows the switching thresholds indicated by dotted lines 802, 804. A hysteresis, ideally centre at $V_D=V_S=V_G=0$ is designed to ensure permanent data storage for the memory 100. As such, the memory 100 may be non-volatile. The memory 100 is astable, e.g. capable of switching between two states. The two states refer to the two positions of the moveable electrode 108, i.e. either contacting the at least one first electrode 104 or contacting the at least one second electrode 106. Therefore, it is desirable to switch the memory 100 between the two states using a single squared pulse voltage. Otherwise, the moveable electrode 108 of the memory 100 may rebound and behave like a pendulum.

FIG. 5c shows a first electrostatic force in a direction 504 towards the gate electrode 110 applied to the moveable electrode 108. The first electrostatic force may be obtained using the following equation:

$$F_{elec\_down} = \frac{1}{2} \cdot \frac{\varepsilon_0 \cdot A \cdot (V_G - V_{SHUTTLE})^2}{(2d_{gap} - x)^2} = \frac{1}{2} \cdot \frac{\varepsilon_0 \cdot A \cdot V_G^2}{(2d_{gap})^2} = \frac{1}{8} \cdot \frac{\varepsilon_0 \cdot A \cdot V_G^2}{d_{gap}^2}$$

wherein $F_{elec\_down}$ is the first electrostatic force applied to the moveable electrode 108, $\in_0$ is the dielectric constant of vacuum (8.85×10⁻¹² F/m), A is the area of the surface 502 of the moveable electrode 108 facing the gate electrode 110, $d_{gap}$ is the distance between the moveable electrode 108 and the gate electrode 110, x is the distance between the moveable electrode 108 and the drain electrode 112 and the source electrode 114, $V_G$ is the voltage applied to the gate electrode 110, and $V_{shuttle}$ is the voltage of the moveable electrode 108.

As shown in FIG. 5c, the moveable electrode 108 is still contacting the drain electrode 112 and the source electrode 114. Thus, the distance x between the moveable electrode 108 and the drain electrode 112 and the source electrode 114 is 0 (i.e. x=0).

In one embodiment, there is no second electrostatic force applied to the moveable electrode 108 in a direction opposite to that of the first second electrostatic force since the voltage applied to the drain electrode 112 and the source electrode 114 is about 0 V.

FIG. 5d shows the moveable electrode 108 moving away from the drain electrode 112 and the source electrode 114 and moving towards the gate electrode 110. Actuation of the moveable electrode 108 starts when the first electrostatic force is greater than the adhesion force between the moveable electrode 108 and the drain electrode 112 and the source electrode 114. If the voltage applied to the drain electrode 112 and the source electrode 114 is greater than 0 V, there may be a second electrostatic force applied to the moveable electrode 108 in a direction opposite to that of the first second electrostatic force. As such, actuation of the moveable electrode 108 may start when the first electrostatic force is greater than the second electrostatic force and the adhesion force between the moveable electrode 108 and the drain electrode 112 and the source electrode 114. The distance x between the moveable electrode 108 and the drain electrode 112 and the source electrode 114 may be greater than 0 but smaller than the Van der Waals distance $d_{vdw}$. The Van der Waals distance $d_{vdw}$ may have a range between about 0 nm and about 5 nm. No or negligible discharge of the moveable electrode 108 may occur.

FIG. 5e shows a second electrostatic force ($F_{elec\_up}$) in a direction 506 facing towards the drain electrode 112 and the source electrode 114 applied to the moveable electrode 108. Redistribution of charges may occur. The second electrostatic force ($F_{elec\_up}$) may naturally build up due to redistribution of charges to the drain electrode 112 and the source electrode 114.

Figure 9:
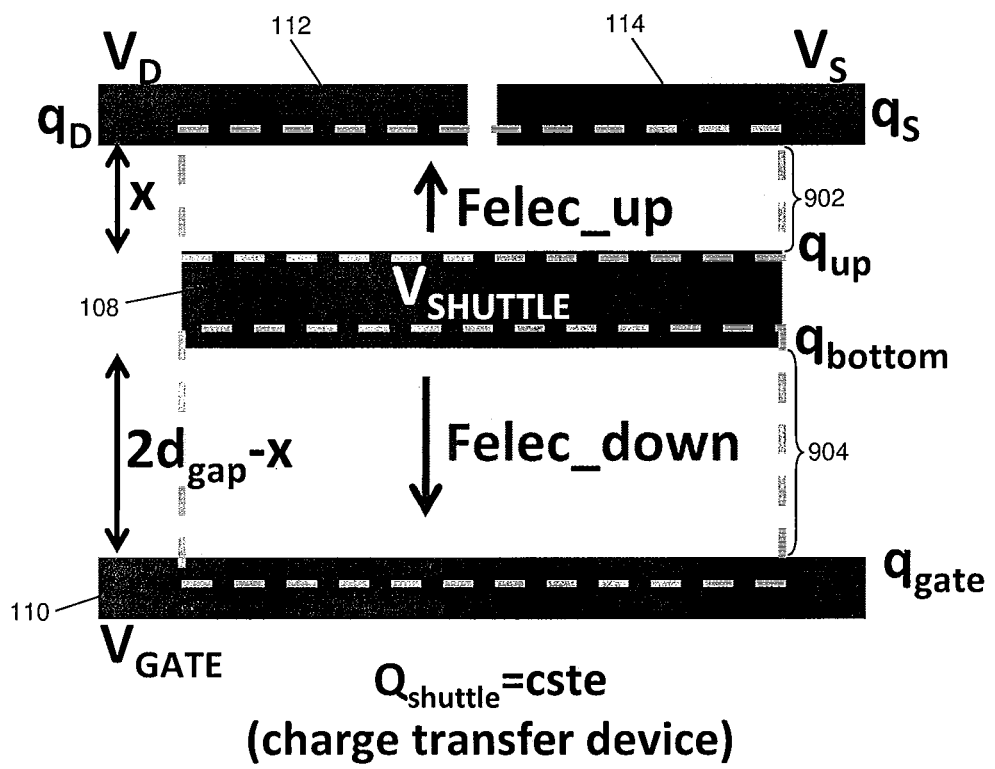
FIG. 9 shows a schematic diagram illustrating redistribution of charges in a memory cell according to one embodiment.

FIG. 9 shows a schematic diagram illustrating redistribution of charges. The moveable electrode 108 has a charge $Q_{shuttle}$ and a voltage $V_{shuttle}$. The drain electrode 112 has a charge $q_D$ and a voltage $V_D$. The source electrode 114 has a charge $q_S$ and a voltage $V_S$. The gate electrode 110 has a charge $q_{gate}$ and a voltage $V_{gate}$. An air gap 902 between the moveable electrode 108 and the drain electrode 112 and the source electrode 114 has a distance of x and a charge of $q_{up}$. An air gap 904 between the moveable electrode 108 and the gate electrode 110 has a distance of $(2d_{gap}-x)$ and a charge of a $q_{bottom}$.

The values of the charges can be calculated using the following equations:

$$q_D = q_S$$
$$q_D + q_S + q_{up} = 0$$
$$q_{bottom} + q_{gate} = 0$$
$$q_{up} + q_{bottom} = Q_{shuttle}$$
$$q_{gate} = -q_{bottom} = \frac{\varepsilon_0 \cdot A}{(2d_{gap} - x)} \cdot (V_G - V_{SHUTTLE})$$
$$q_u = -q_D - q_S = \frac{\varepsilon_0 \cdot A}{x} \cdot (V_{SHUTTLE} - V_{D/S})$$

The charge $Q_{shuttle}$ of the moveable electrode 108 can be found to be $$Q_{shuttle} = \frac{\varepsilon_0 \cdot A}{2 \cdot d_{gap}} \cdot V_{gate}$$

Before switching, the moveable electrode 108 may be charged by a fixed number of carriers (e.g. as shown in FIG. 5b) and may then transfer this charge to the other side (e.g. the drain electrode 112 and the source electrode 114) of the memory 100. The moveable electrode 108 may have a fixed charge while moving from the drain electrode 112 and the source electrode 114 to the gate electrode 110.

Based on the charge redistribution and on the capacitor equation Q=CV, the first electrostatic force $F_{elec\_down}$ and the second electrostatic force $F_{elec\_up}$ which naturally build up during switching can be determined. The first electrostatic force $F_{elec\_down}$ may be determined using the equation:

$$F_{elec\_down} = \frac{q_{bottom}^2}{2 \cdot \varepsilon_0 \cdot A} = \frac{q_{gate}^2}{2 \cdot \varepsilon_0 \cdot A},$$

and the second electrostatic force $F_{elec\_up}$ can be determined using the equation:

$$F_{elec\_up} = \frac{q_{up}^2}{2 \cdot \varepsilon_0 \cdot A} = \frac{(q_D + q_S)^2}{2 \cdot \varepsilon_0 \cdot A}.$$

FIG. 5f shows a case wherein the distance between the moveable electrode 108 and the drain electrode 112 and the source electrode 114 and the distance between the moveable electrode 108 and the gate electrode 110 are the same. The voltage applied to the gate electrode 110 may change. The voltage applied to the gate electrode 110 may be reduced to about 0 V. Redistribution of charges may occur.

FIG. 5g shows the moveable electrode 108 moving towards and nearer to the gate electrode 110. The first electrostatic force applied to the moveable electrode 108 may be greater than the second electrostatic force applied to the moveable electrode 108.

FIG. 5h shows the moveable electrode 108 reaching the gate electrode 110. There may be a discharge of the charges of the moveable electrode 108.

FIG. 5i shows the moveable electrode 108 contacting the gate electrode 110 in a stable state.

FIGS. 5a to 5i uses the memory cell 100 shown in FIG. 1 as an example to illustrate the movement of the moveable electrode 108. A skilled person would be able to derive the movement of the moveable electrode 108 in other memory cells (e.g. memory cells 100 shown in FIGS. 2 to 4) from the movement of the moveable 108 described above with reference to FIGS. 5a to 5i. FIGS. 5a to 5i illustrate the movement of the moveable electrode 108 from the at least one second electrode 106 (i.e. the drain electrode 112 and the source electrode 114) to the at least one first electrode 104 (i.e. the gate electrode 110). A skilled person would be able to derive the movement of the moveable electrode 108 from the at least one first electrode 104 (i.e. the gate electrode 110) to the at least one second electrode 106 (i.e. the drain electrode 112 and the source electrode 114).

Experimental results for the movement of the moveable 108 described above with reference to FIGS. 5a to 5i are illustrated in FIGS. 10 to 21.

Figure 10:
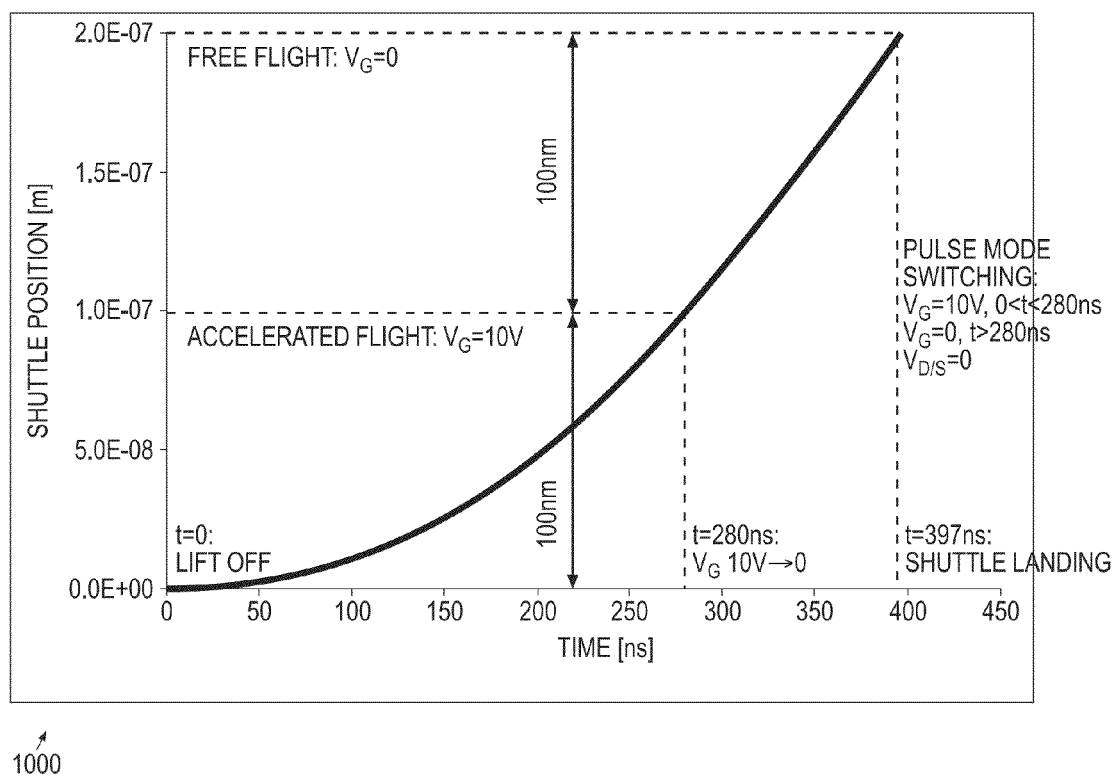
FIG. 10 shows a graph of a shuttle position of a moveable electrode of a memory cell plotted against time according to one embodiment.

FIG. 10 shows a graph 1000 of a shuttle position of the moveable electrode 108 plotted against time. The shuttle position of the moveable electrode 108 refers to the distance that the moveable electrode 108 travels from an initial position (e.g. the at least one second electrode 106 shown in FIG. 5a). Graph 1000 shows that the moveable electrode 108 travels a distance of about 100 nm in about 280 ns when the voltage applied to the gate electrode 110 is about 10V. This section of graph 1000 illustrates the movement of the moveable electrode 108 shown in FIGS. 5a to 5f. The movement of the moveable electrode 108 shown in FIGS. 5a to 5f can be referred as an accelerated flight.

Graph 1000 also shows that the moveable electrode 108 travels a further distance of about 100 nm before contacting the gate electrode 110 after the voltage applied to the gate electrode 110 is reduced from about 10 V to about 0 V. This section of graph 100 illustrates the movement of the moveable electrode 108 shown in FIGS. 5*f* to 5*i*. The movement of the moveable electrode 108 shown in FIGS. 5*f* to 5*i* can be referred as a free flight. It can be observed from graph 1000 that the moveable electrode 108 takes about 397 ns to reach the gate electrode 110.

Figure 11:
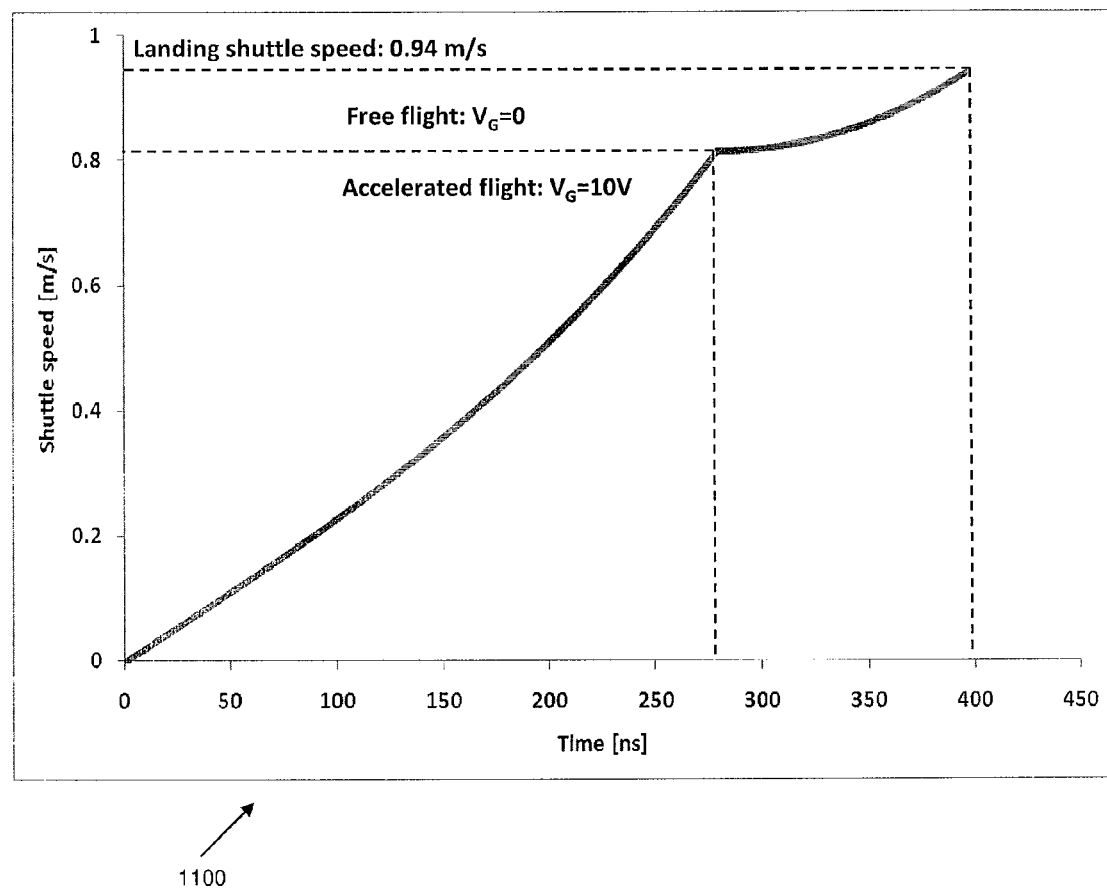
FIG. 11 shows a graph of a speed of a moveable electrode of a memory cell against time according to one embodiment.

FIG. 11 shows a graph 1100 of a speed of the moveable electrode 108 plotted against time. It can be observed from graph 1100 that the speed of the moveable electrode 108 increases from 0 m/s to 0.82 m/s during the accelerated flight and the speed of the moveable electrode 108 increases from 0.82 m/s to 0.94 m/s during the free flight.

Figure 12:
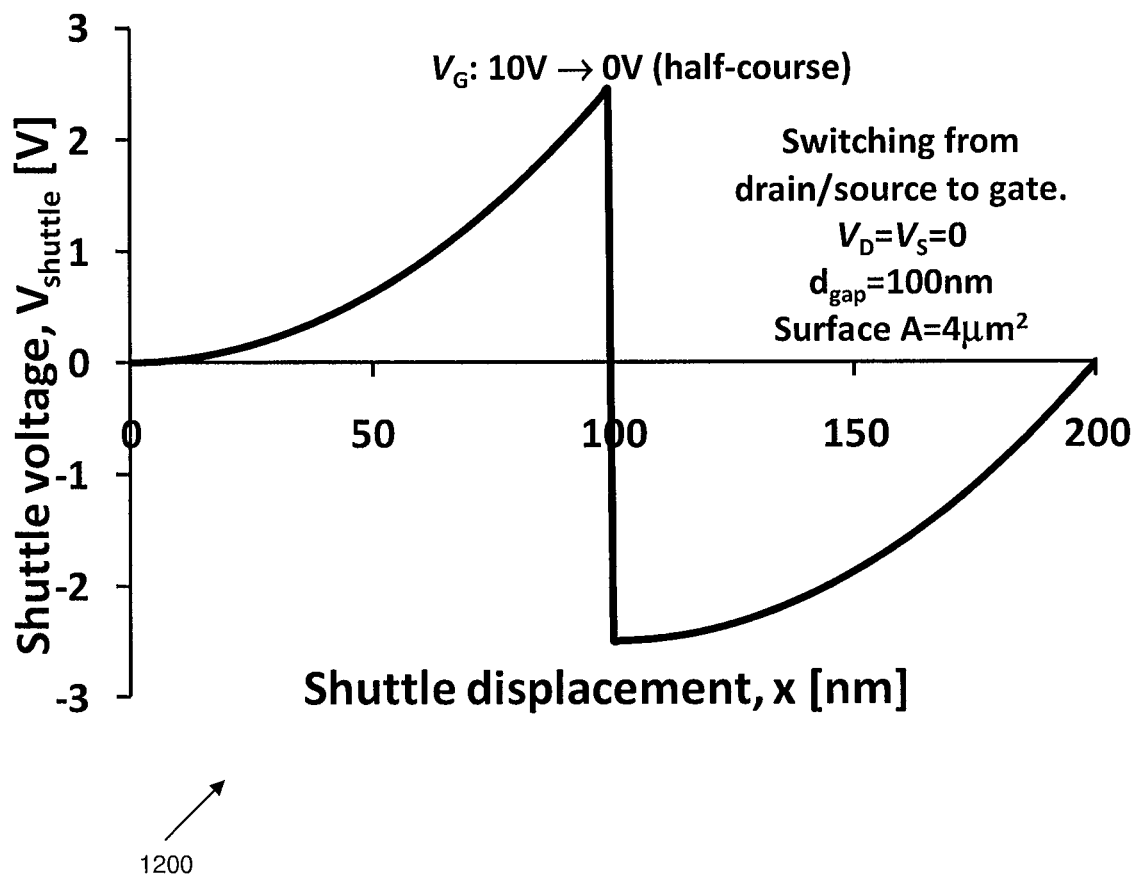
FIG. 12 shows a graph of a shuttle voltage of a moveable electrode of a memory cell plotted against a shuttle displacement of the moveable electrode according to one embodiment.

FIG. 12 shows a graph 1200 of a shuttle voltage plotted against a shuttle displacement. Shuttle voltage refers to the voltage of the moveable electrode 108 throughout the switching process of the moveable electrode 108 from the at least one first electrode 104 to the at least one second electrode 106 or vice versa (e.g. from the at least one second electrode 106 to the at least one first electrode 104 shown in FIG. 5). Shuttle displacement refers to the distance travelled by the moveable electrode 108 from an initial position (e.g. the at least one second electrode 106 shown in FIG. 5*a*). It can be observed from graph 1000 that the shuttle voltage increases as the shuttle displacement increases (i.e. as the moveable electrode 108 moves towards the gate electrode 110 (e.g. as shown in FIGS. 5*a* to 5*e*)) and reaches a maximum value when the shuttle displacement reaches about 100 nm (e.g. as shown in FIG. 5*f*). The shuttle voltage decreases from the maximum value to a minimum value as the voltage applied to the gate electrode 110 is reduced from about 10 V to about 0 V. The shuttle voltage increases from the minimum value as the shuttle displacement increases from about 100 nm (i.e. as the moveable electrode 108 continues to move towards the gate electrode 110 (e.g. as shown in FIGS. 5*g* to 5*h*)) and becomes 0 V when the shuttle displacement reaches about 200 nm (i.e. when the moveable electrode 108 contacts the gate electrode 110 (e.g. as shown in FIG. 5*i*)). Cold switching is used for the memory 100 to obtain a better reliability.

Figure 13:
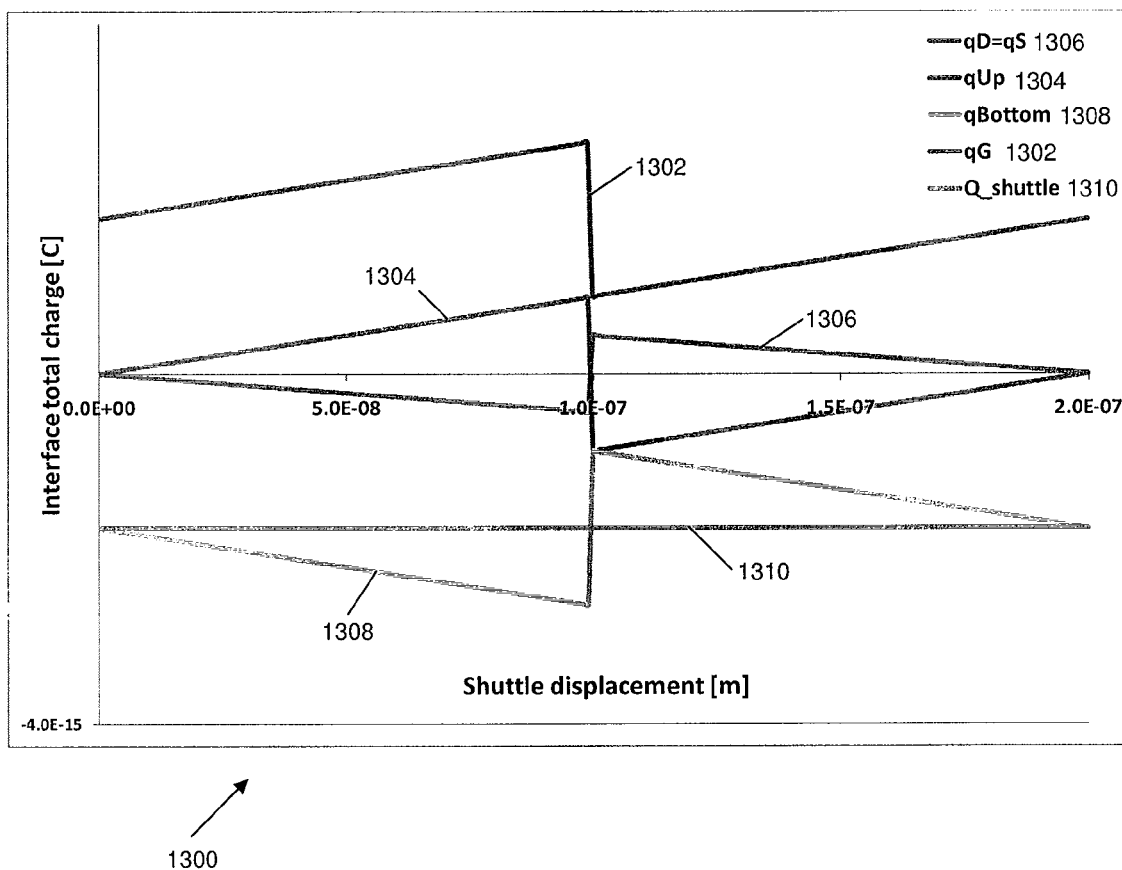
FIG. 13 shows a graph of charge plotted against shuttle displacement of a moveable electrode of a memory cell according to one embodiment.

FIG. 13 shows a graph 1300 of charge plotted against shuttle displacement. Plot 1302 shows a charge of the gate electrode 110 plotted against the shuttle displacement of the moveable electrode 108. Plot 1304 shows a charge of the air gap 902 between the moveable electrode 108 and the drain electrode 112 and the source electrode 114 plotted against the shuttle displacement of the moveable electrode 108. Plot 1306 shows a charge of the drain electrode 112 plotted against the shuttle displacement of the moveable electrode 108. Plot 1306 also shows a charge of the source electrode 114 plotted against the shuttle displacement of the moveable electrode 108. Plot 1308 shows a charge of the air gap 904 between the moveable electrode 108 and the drain electrode 112 plotted against the shuttle displacement of the moveable electrode 108. Plot 1310 shows a charge of the moveable electrode 108 plotted against the shuttle displacement of the moveable electrode 108.

It can be observed from plot 1302 and plot 1304 that the charge of the gate electrode 110 and the charge of the air gap 902 increase as the shuttle displacement increases (i.e. as the moveable electrode 108 moves towards the gate electrode 110 (e.g. as shown in FIGS. 5*a* to 5*e*)) and reach a respective maximum value when the shuttle displacement reaches about 100 nm (e.g. as shown in FIG. 5*f*). The charge of the gate electrode 110 and the charge of the air gap 902 then decrease from respective maximum value to a respective minimum value. The charge of the gate electrode 110 and the charge of the air gap 902 increase from the respective minimum value as the shuttle displacement increases from about 100 nm (i.e. as the moveable electrode 108 continues to move towards the gate electrode 110 (e.g. as shown in FIGS. 5*g* to 5*h*)) until the shuttle displacement reaches about 200 nm (i.e. the moveable electrode 108 contacts the gate electrode 110 (e.g. as shown in FIG. 5*i*)). The charge of the air gap 902 is 0 when the shuttle displacement reaches about 200 nm.

It can be observed from plot 1306 and plot 1308 the charge of the drain electrode 112, the charge of the source electrode 114 and the charge of the air gap 904 decrease as the shuttle displacement increases (i.e. as the moveable electrode 108 moves towards the gate electrode 110 (e.g. as shown in FIGS. 5*a* to 5*e*)) and reach a respective minimum value when the shuttle displacement reaches about 100 nm (e.g. as shown in FIG. 5*f*). The charge of the drain electrode 112, the charge of the source electrode 114 and the charge of the air gap 904 increase from the respective minimum value to a respective maximum value and then decrease from the respective maximum value as the shuttle displacement increases from about 100 nm (i.e. as the moveable electrode 108 continues to move towards the gate electrode 110 (e.g. as shown in FIGS. 5*g* to 5*h*)) until the shuttle displacement reaches about 200 nm (i.e. the moveable electrode 108 contacts the gate electrode 110 (e.g. as shown in FIG. 5*i*)). The charge of the drain electrode 112 and the charge of the source electrode 114 are 0 when the shuttle displacement reaches about 200 nm.

It can be observed from plot 1310 that the charge of the moveable electrode 108 is fixed (i.e. does not change) as the shuttle displacement increases from 0 nm to 200 nm (i.e. as the moveable electrode 108 moves from the drain electrode 112 and the source electrode 114 to the gate electrode 110 (e.g. as shown in FIGS. 5*a* to 5*i*)). In one embodiment, the charge of the moveable electrode 108 may be about $-1.77 \times 10^{-15}$ couloumb (C).

Figure 14:
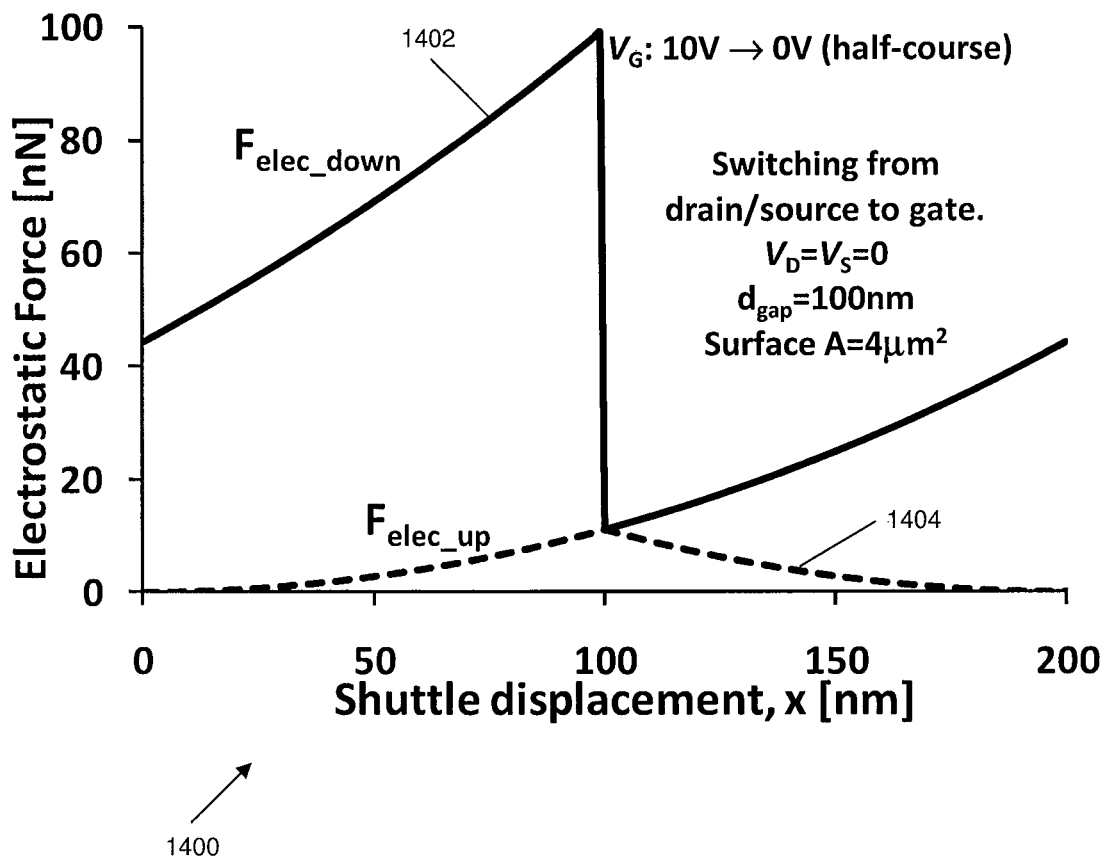
FIG. 14 shows a graph of electrostatic forces applied on a moveable electrode of a memory cell plotted against shuttle displacement of the moveable electrode according to one embodiment.

FIG. 14 shows a graph 1400 of electrostatic forces plotted against shuttle displacement. Plot 1402 shows a first electrostatic force $F_{elec\_down}$ applied on the moveable electrode 108 plotted against the shuttle displacement of the moveable electrode 108. Plot 1404 shows a second electrostatic force $F_{elec\_up}$ applied on the moveable electrode 108 plotted against the shuttle displacement of the moveable electrode 108.

It can be observed from plot 1402 that the first electrostatic force $F_{elec\_down}$ increases as the shuttle displacement increases (i.e. as the moveable electrode 108 moves towards the gate electrode 110 (e.g. as shown in FIGS. 5*a* to 5*e*)) and reaches a maximum value when the shuttle displacement reaches about 100 nm (e.g. as shown in FIG. 5*f*). The first electrostatic force $F_{elec\_down}$ decreases from the maximum value to a minimum value as the voltage applied to the gate electrode 110 is reduced from about 10V to about 0 V. The first electrostatic force $F_{elec\_down}$ increases from the minimum value as the shuttle displacement increases from about 100 nm (i.e. as the moveable electrode 108 continues to move towards the gate electrode 110 (e.g. as shown in FIGS. 5*g* to 5*h*)) until the shuttle displacement reaches about 200 nm (i.e. the moveable electrode 108 contacts the gate electrode 110 (e.g. as shown in FIG. 5*i*)).

It can be observed from plot 1404 that the second electrostatic force $F_{elec\_up}$ increases from 0 as the shuttle displacement increases (i.e. as the moveable electrode 108 moves towards the gate electrode 110 (e.g. as shown in FIGS. 5*a* to 5*e*)) and reaches a maximum value when the shuttle displacement reaches about 100 nm (e.g. as shown in FIG. 5*f*). The second electrostatic force $F_{elec\_up}$ decreases from the maximum value as the shuttle displacement increases from about 100 nm (i.e. as the moveable electrode 108 continues to move towards the gate electrode 110 (e.g. as shown in FIGS. 5g to 5h)) and becomes 0 when the shuttle displacement reaches about 200 nm (i.e. when the moveable electrode 108 contacts the gate electrode 110 (e.g. as shown in FIG. 5i)).

The moveable electrode 108 is preferably controlled by a pulse voltage to avoid rebound of the moveable electrode 108 after contacting the at least one first electrode 104 or the at least one second electrode 106. The pulse voltage may be the voltage applied to the at least one first electrode 104 if the moveable electrode 108 is moving from the at least one second electrode 106 to the at least one first electrode 104. The pulse voltage may be the voltage applied to the at least one second electrode 106 if the moveable electrode 108 is moving from the at least one first electrode 104 to the at least one second electrode 106. With reference to FIG. 5, the pulse voltage is the voltage applied to the gate electrode 110. The pulse voltage may be a single squared pulse.

In one embodiment, a pulse voltage equal to or higher than a switching voltage applied to the gate electrode 110 may cause the moveable electrode 108 to move to the gate electrode 110 (assuming that the voltage applied to the drain electrode 112 and the source electrode 114 is about 0 V). A DC voltage equal to or higher than a switching voltage applied to the drain electrode 112 and the source electrode 114 may cause the moveable electrode 108 to move to the drain electrode 112 and the source electrode 114 (assuming that the voltage applied to the source electrode 110 is about 0 V).

Figure 15A:
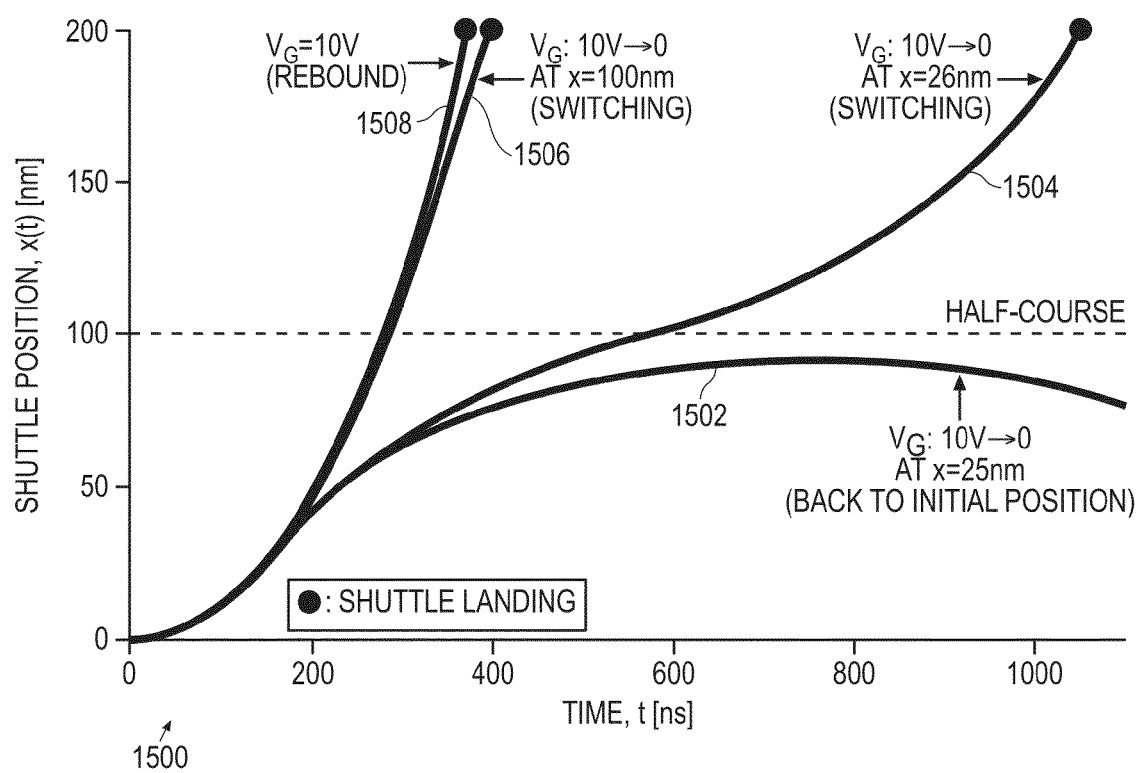
FIG. 15a shows a graph of a shuttle position of a moveable electrode of a memory cell plotted against time according to one embodiment.

FIG. 15a shows a graph of a shuttle position of the moveable electrode 108 plotted against time. The shuttle position of the moveable electrode 108 refers to the distance that the moveable electrode 108 travels from an initial position (e.g. the at least one second electrode 106 as shown in FIG. 5a). Plot 1502 shows the shuttle position of the moveable electrode 108 plotted against time when the voltage applied to the gate electrode 110 ($V_G$) is reduced from 10 V to 0 V when the moveable electrode 108 is at a shuttle position of about 25 nm. Plot 1502 shows that the moveable electrode 108 moves back to the initial position. The pulse of the voltage applied to the gate electrode 110 ($V_G$) is too short if the voltage applied to the gate electrode 110 ($V_G$) is reduced from 10 V to 0 V when the moveable electrode 108 is at a shuttle position of about 25 nm. Thus, there is no switching of the state of the moveable electrode 108.

Plot 1504 shows the shuttle position of the moveable electrode 108 plotted against time when the voltage applied to the gate electrode 110 ($V_G$) is reduced from 10 V to 0 V when the moveable electrode 108 is at a shuttle position of about 26 nm. Plot 1504 shows that the movement of the moveable electrode 108 from the initial position (in this case, the drain electrode 112 and the source electrode 114) to the gate electrode 110 takes about 1050 ns.

Plot 1506 shows the shuttle position of the moveable electrode 108 plotted against time when the voltage applied to the gate electrode 110 ($V_G$) is reduced from 10 V to 0 V when the moveable electrode 108 is at a shuttle position of about 100 nm. Plot 1506 shows that the movement of the moveable electrode 108 from the initial position (in this case, the drain electrode 112 and the source electrode 114) to the gate electrode 110 takes about 400 ns.

Comparing plot 1504 and plot 1506, the switching of the moveable electrode 108 from the initial position (in this case, the drain electrode 112 and the source electrode 114) to the gate electrode 110 is faster when the voltage applied to the gate electrode 110 ($V_G$) is reduced from 10 V to 0 V when the moveable electrode 108 is at a shuttle position of about 100 nm.

Plot 1508 shows the shuttle position of the moveable electrode 108 plotted against time when the voltage applied to the gate electrode 110 ($V_G$) is maintained at 10V as the moveable electrode 108 moves from the initial position (in this case, the drain electrode 112 and the source electrode 114) to the gate electrode 110. The pulse of the voltage applied to the gate electrode 110 ($V_G$) is too long if the voltage applied to the gate electrode 110 ($V_G$) is maintained at 10V as the moveable electrode 108 moves from the initial position (in this case, the drain electrode 112 and the source electrode 114) to the gate electrode 110. As such, the moveable electrode 108 may rebound after contacting the gate electrode 110.

In order to avoid a pendulum effect of the moveable electrode 108, a pulse duration of the voltage applied to the gate electrode 110 ($V_G$) is preferred to be shorter than the switching time (i.e. time taken for the moveable electrode 108 to move from the at least one first electrode 104 to the at least one second electrode 106 or vice versa). For example, the pulse duration of the voltage applied to the gate electrode 110 ($V_G$) may be half of the switching time.

Figure 15B:
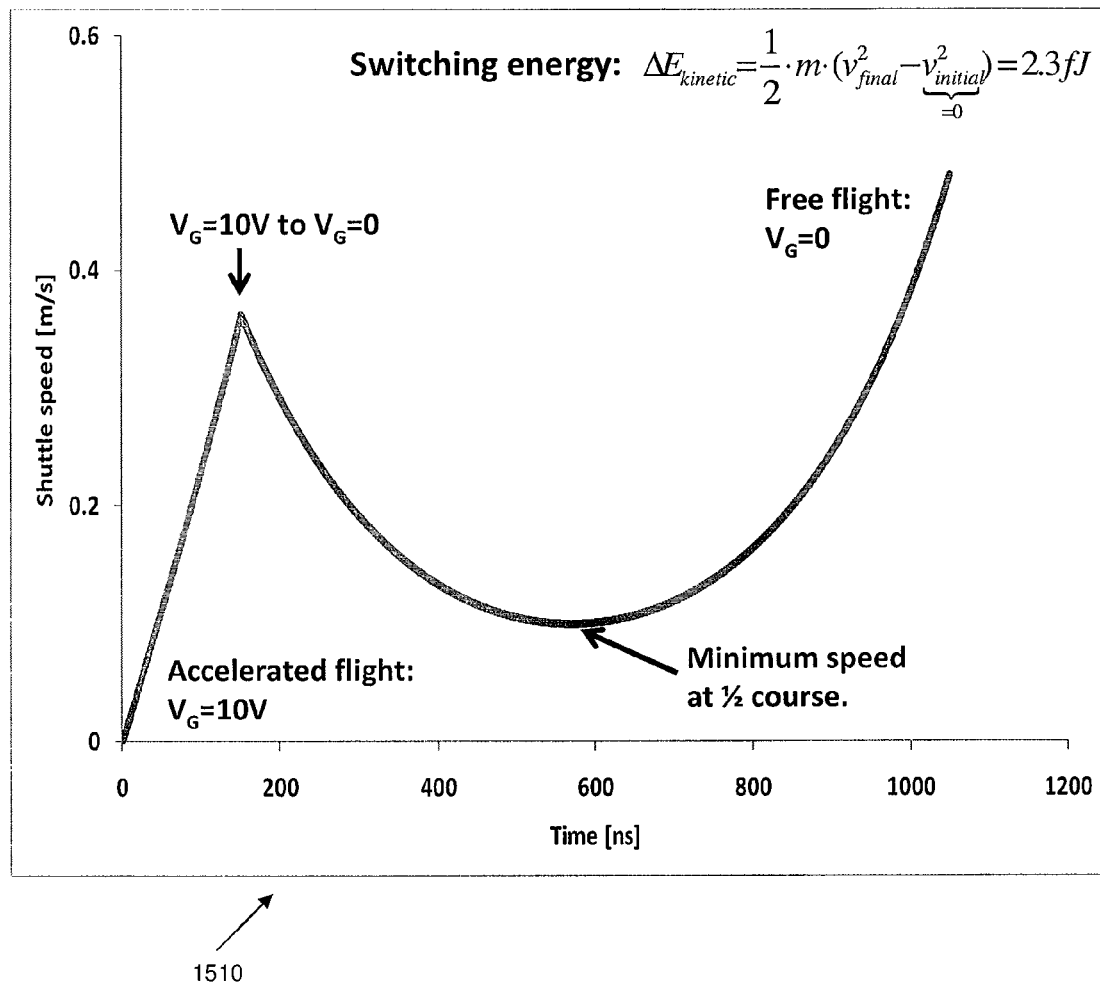
FIGS. 15b to 15d show graphs of a speed of a moveable electrode of a memory cell plotted against time according to one embodiment.

FIG. 15b shows a graph 1510 of a speed of the moveable electrode 108 plotted against time. Graph 1510 shows the change in the speed of the moveable electrode 108 as the moveable electrode 108 travels along a path indicated by plot 1504 of FIG. 15a. The moveable electrode 108 has a maximum speed at about 150 ns. The moveable electrode 108 has a maximum speed at the end of the accelerated flight (e.g. at the point where the voltage applied to the gate electrode 110 ($V_G$) is reduced from 10 V to 0 V). The moveable electrode 108 has a minimum speed at about 600 ns. The moveable electrode 108 has a minimum speed when the moveable electrode 108 is in the middle of the total travel distance (e.g. when the distance between the moveable electrode 108 and the gate electrode 110 and the distance between the moveable electrode 108 and the drain electrode 112 and the source electrode 114 are about the same). The switching energy is about 2.3 fJ.

Figure 15C:
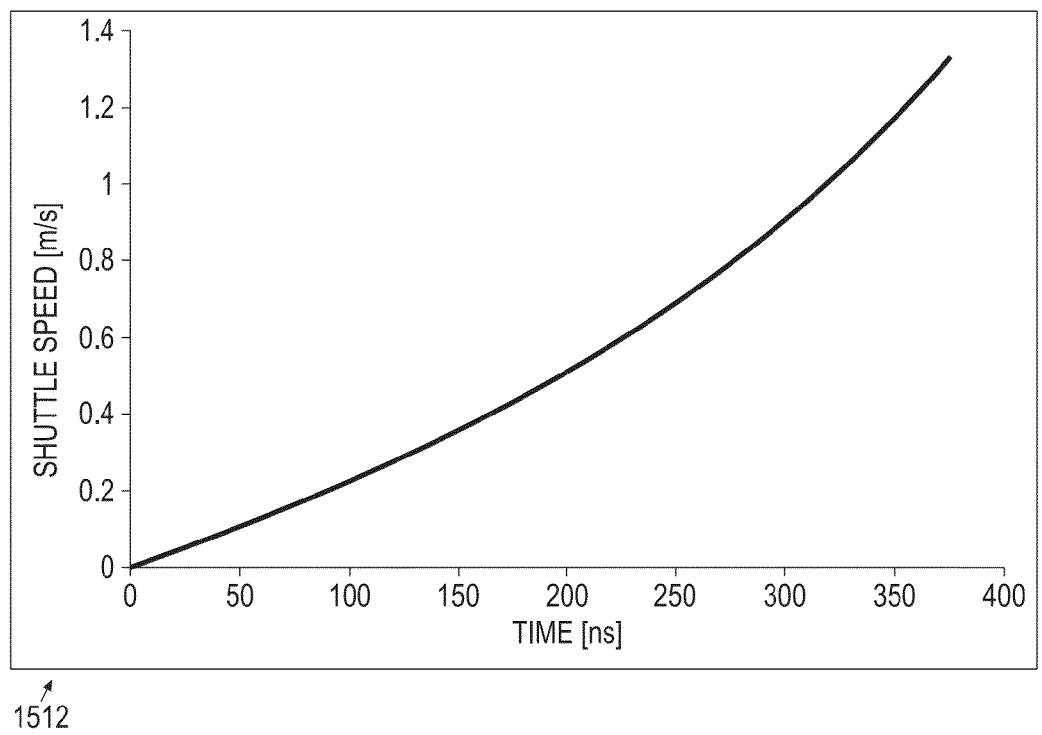

FIG. 15c shows a graph 1512 of a speed of the moveable electrode 108 plotted against time. Graph 1512 shows the change in the speed of the moveable electrode 108 as the moveable electrode 108 travels along a path indicated by plot 1508 of FIG. 15a. The speed of the moveable electrode 108 increases as the moveable electrode 108 moves from the drain electrode 112 and the source electrode 114 to the gate electrode 110. The switching energy is about 17.7 fJ.

Figure 15D:
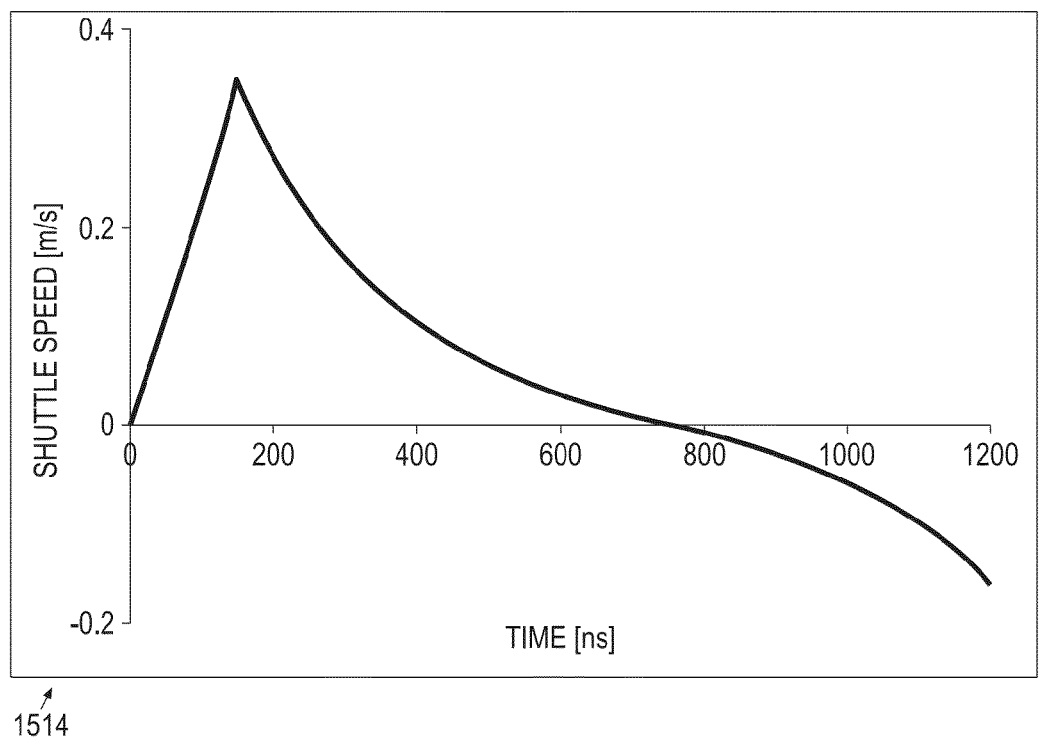

FIG. 15d shows a graph 1514 of a speed of the moveable electrode 108 plotted against time. Graph 1514 shows the change in the speed of the moveable electrode 108 as the moveable electrode 108 travels along a path indicated by plot 1502 of FIG. 15a. The speed of the moveable electrode 108 increases to a maximum value and decreases to 0 as the moveable electrode 108 moves from the drain electrode 112 and the source electrode 114 to the gate electrode 110. The speed of the moveable electrode 108 decreases below 0 as the moveable electrode 108 moves back to the initial position (i.e. moves back to the drain electrode 112 and the source electrode 114).

The pulse duration and the amplitude of the voltage applied to the at least one first electrode 104 or the at least one second electrode 106 can be two main parameters for controlling the switching of the memory cell 100 between the two states, i.e. the movement of the moveable electrode 108 between the at least one first electrode 104 and the at least one second electrode 106. Further, there is a trade-off between the pulse duration of the voltage applied to the at least one first electrode 104 or the at least one second electrode 106 and the switching time.

Figure 16:
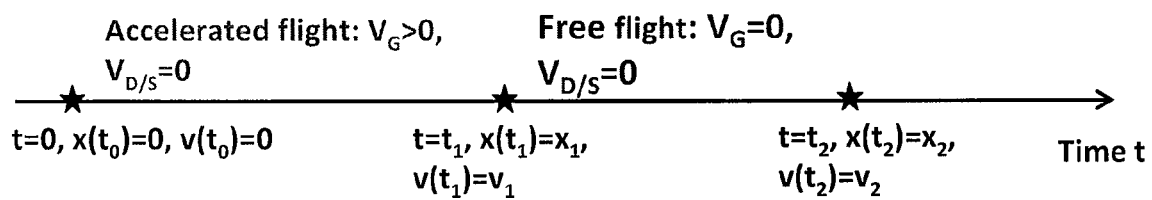
FIG. 16 illustrates a movement of a moveable electrode of a memory cell according to one embodiment.

FIG. 16 illustrates a movement of the moveable electrode 108. The movement illustrated in FIG. 16 corresponds to the movement of the moveable electrode 108 described above with reference to FIG. 5. The flight of the moveable electrode 108 is separated into accelerated flight (e.g. $V_G$>0) and free flight (e.g. $V_G$=0). Time $t_0$ refers to the time at which a voltage is applied to the gate electrode 110 and the moveable electrode 108 is charged (e.g. as shown in FIG. 5b). Time $t_1$ refers to the time at which the voltage applied to the gate electrode 110 is reduced to 0 V (e.g. as shown in FIG. 5f). Time $t_1$ may be referred as pulse turn-off time. Time $t_2$ refers to the time at which the moveable electrode 108 contacts the gate electrode 110 (e.g. as shown in FIG. 5i). Time $t_2$ may be referred as landing time.

According to Newton's second law of motion, $$m \cdot \frac{d^2 x(t)}{dt^2} = \frac{q_{BOTTOM}^2}{2 \cdot \varepsilon_0 \cdot A} - \frac{q_{UP}^2}{2 \cdot \varepsilon_0 \cdot A} =$$

$$\frac{Q}{2 \cdot \varepsilon_0 \cdot A \cdot d_{gap}} \cdot (-d_{gap} \cdot Q + A \cdot \varepsilon_0 (V_{D/S} - V_G) + Q \cdot x(t))$$

A constant K can be represented by:

$$K = \sqrt{2 \cdot A \cdot \varepsilon_0 \cdot d_{gap} \cdot m}$$

In one embodiment, the constant K may have a value of about $3.76 \times 10^{-22}$ C·s.

The Motion's equations for the moveable electrode are:

$$\begin{cases} x(t) = \frac{1}{Q} \left( \begin{array}{c} d_{gap} \cdot Q + A \cdot \varepsilon_0 (-V_{D/S} + V_G) + \begin{bmatrix} -d_{gap} \cdot Q + A \cdot \varepsilon_0 \\ (V_{D/S} - V_G) + Q \cdot x(t_0) \end{bmatrix} \cdot \\ \cosh\left(\frac{Q \cdot t}{K}\right) + K \cdot v(t_0) \cdot \sinh\left(\frac{Q \cdot t}{K}\right) \end{array} \right) \\ \frac{dx(t)}{dt} = v(t) = v(t_0) \cdot \cosh\left(\frac{Q \cdot t}{K}\right) + \\ \frac{-d_{gap} \cdot Q + A \cdot \varepsilon_0 (V_{D/S} - V_G) + Q \cdot x(t_0)}{K} \cdot \sinh\left(\frac{Q \cdot t}{K}\right) \end{cases}$$

A relationship between time $t_1$ and time $t_2$ can be represented by:

$$t_2 = t_1 - \frac{K}{Q} \cdot$$

$$\text{Arcsech}\left( \frac{d_{gap} \cdot Q^2 \cdot (-d_{gap} + x_1) + \sqrt{K^2 v_1^2 (K^2 v_1^2 + Q^2 \cdot (2 d_{gap} - x_1) \cdot x_1)}}{d_{gap}^2 \cdot Q^2 + K^2 \cdot v_1^2} \right)$$

whereby
m is mass of the moveable electrode 108;
x is the distance travelled by the moveable electrode 108;
$\varepsilon_0$ is the dielectric constant of vacuum ($8.85 \times 10^{-12}$ F/m);
A is an area of a surface of the moveable electrode 108 facing the at least one first electrode 104 or the at least one second electrode 106;
$d_{gap}$ is the distance between the moveable electrode 108 and the at least one first electrode 104 or the at least one second electrode 106;
$V_{D/S}$ is the voltage applied on the drain electrode 112 and the source electrode 114 respectively;
$V_G$ is the voltage applied on the gate electrode 110;
Q is the charge of the moveable electrode 108;
$Q_{BOTTOM}$ is the charge of the air gap between the moveable electrode 108 and the gate electrode 110;
$Q_{UP}$ is the charge of the air gap between the moveable electrode 108 and the drain electrode 112 and the source electrode 114.

In one embodiment, the mass of the moveable electrode 108 may be about $2 \times 10^{-14}$ kg.

Figure 17:
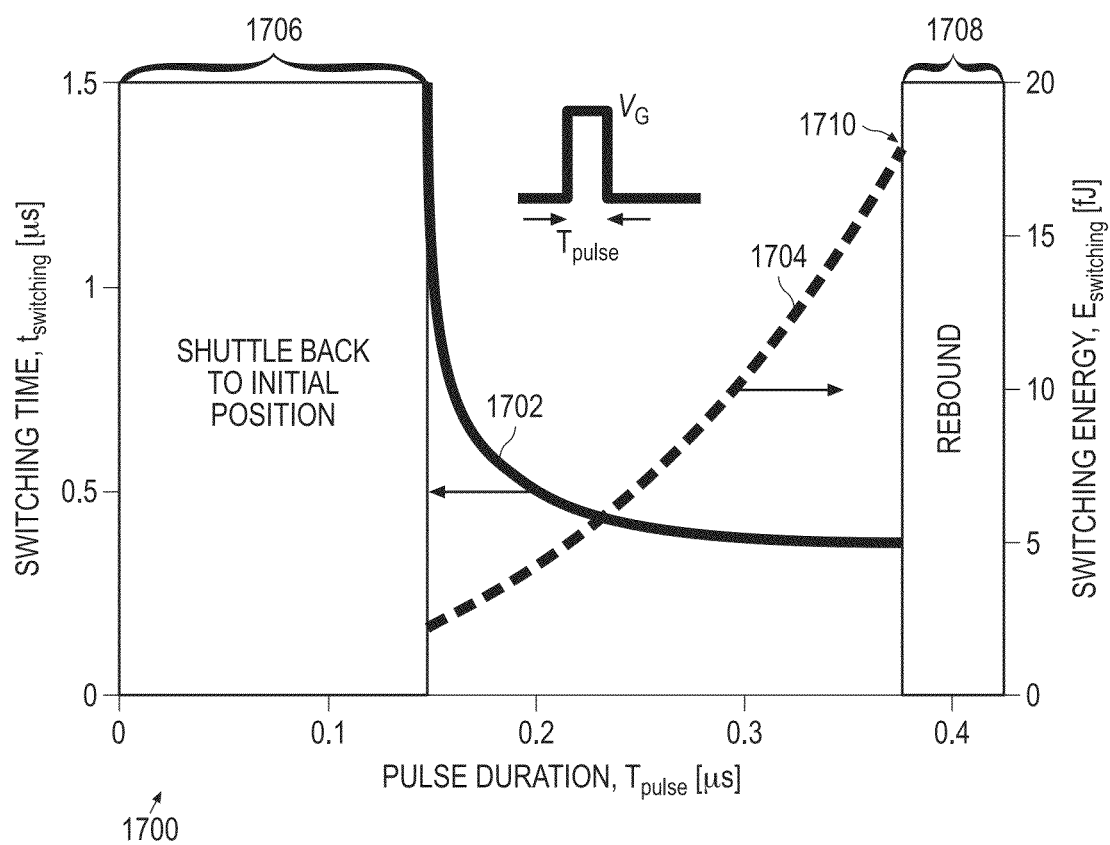
FIG. 17 shows a graph of switching time and switching energy plotted against pulse duration of a voltage applied to a gate electrode of a memory cell according to one embodiment.

Based on Newton's equation of motion, switching time and switching energy are two important parameters. FIG. 17 shows a graph 1700 of switching time and switching energy plotted against pulse duration of the voltage applied to the gate electrode 110. Plot 1702 shows a switching time plotted against pulse duration of the voltage applied to the gate electrode 110. It can be observed from plot 1702 that the switching time decreases as the pulse duration of the voltage applied to the gate electrode 110 increases. Plot 1704 shows a switching energy plotted against pulse duration of the voltage applied to the gate electrode 110. It can be observed from plot 1704 that the switching energy increases as the pulse duration of the voltage applied to the gate electrode 110 increases.

FIG. 17 shows a range 1706 of pulse duration of the voltage applied to the gate electrode 110 which can result in the moveable electrode 108 to return to its initial position (e.g. the drain electrode 112 and the source electrode 114 as shown in FIG. 5a). FIG. 17 also shows a range 1708 of pulse duration of the voltage applied to the gate electrode 110 which can result in the moveable electrode 108 to rebound after contacting its final position (e.g. the gate electrode as shown in FIG. 5i).

Figure 18:
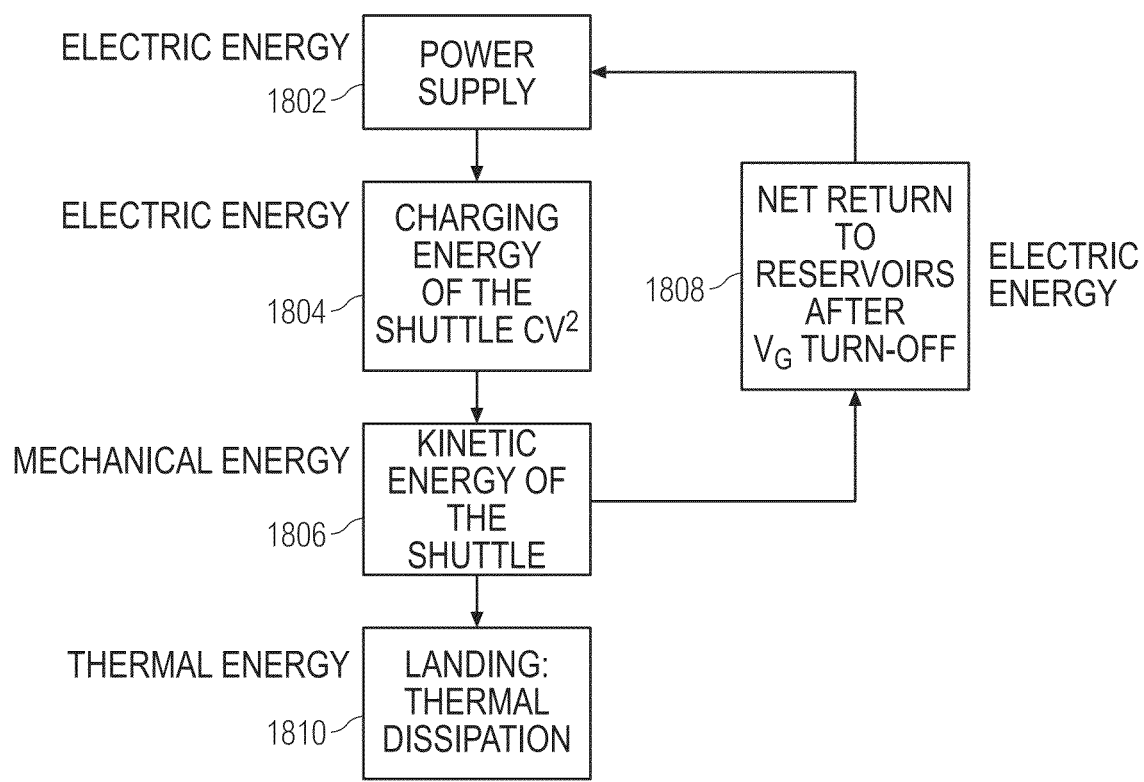
FIG. 18 shows a diagram illustrating an energy transfer of a moveable electrode of a memory cell according to one embodiment.

FIG. 18 shows a diagram illustrating an energy transfer of the moveable electrode 108. A power supply 1802 results in a charging energy 1804 of the moveable electrode 108. The charging energy 1804 can be obtained by $$E = CV^2 = \frac{\varepsilon_0 \cdot A}{2 d_{gap}} \cdot V_G^2.$$

The charging energy 1804 of the moveable electrode 108 is converted into kinetic energy 1806 as the moveable electrode 108 travels towards the gate electrode 110. Kinetic energy 1806 can be calculated via multiple differential equations and Newton's law of motion. Kinetic energy can be obtained using $$\frac{1}{2} m v_{final}^2,$$

where $v_{final}$ is the speed of the moveable electrode 108 when the moveable electrode 108 contacts the gate electrode 110. Energy 1808 may also be returned back to the charge reservoir if the voltage applied to the gate electrode 110 is turned off before the moveable electrode 108 contacts the gate electrode 110. This may be caused by charge redistribution on the gate electrode 110, the drain electrode 112 and the source electrode 114. The kinetic energy 1806 is then converted into thermal energy 1810 when the moveable electrode 108 contacts the gate electrode 110.

Referring back to FIG. 17, plot 1704 corresponds to the kinetic energy of the moveable electrode 108. Point 1710 corresponds to the charging energy of the moveable electrode 108.

Figure 19:
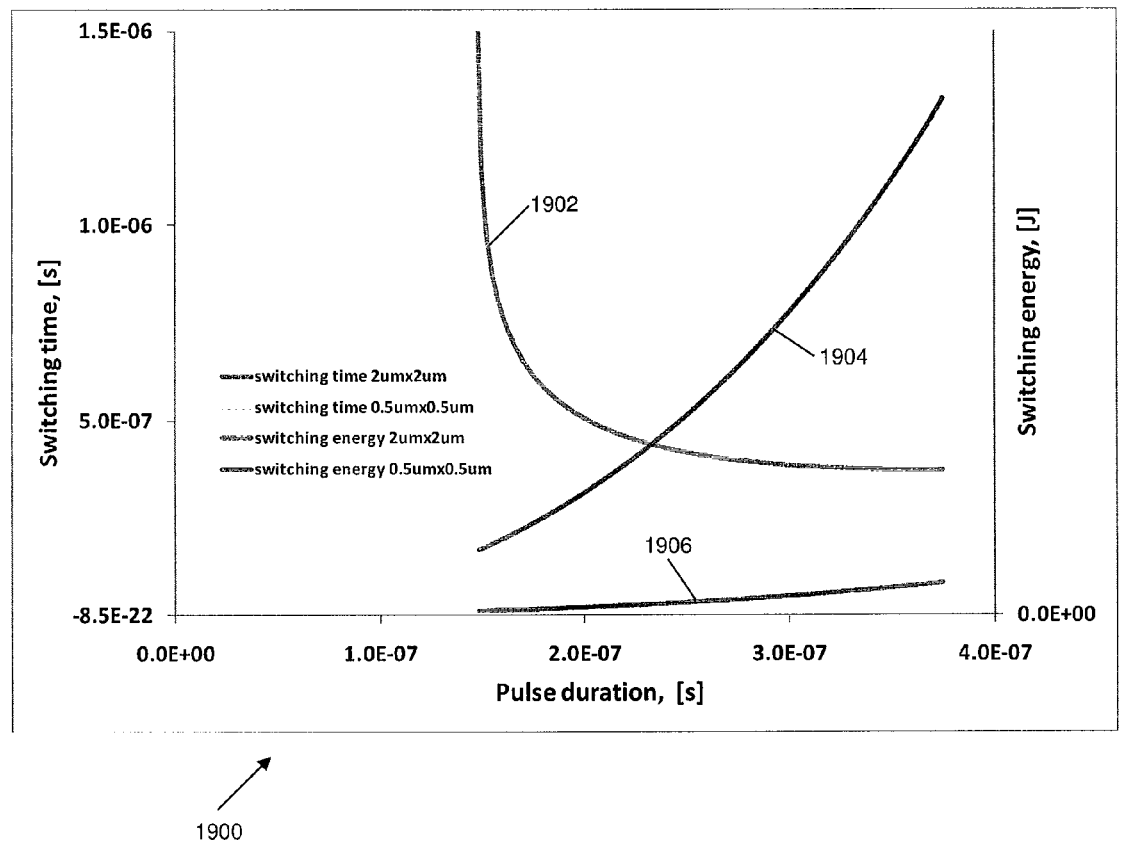
FIG. 19 shows a graph of a switching time and a switching energy of a moveable electrode of a memory cell plotted against pulse duration of a voltage applied on a gate electrode of the memory cell respectively according to one embodiment.

FIG. 19 shows a graph 1900 of a switching time and a switching energy of the moveable electrode 108 plotted against pulse duration of the voltage applied on the gate electrode 110 respectively. Plot 1902 shows a switching time of the moveable electrode 108 having an area of 2 µm×2 µm plotted against pulse duration of the voltage applied on the gate electrode 110. Plot 1902 also shows a switching time of the moveable electrode 108 having an area of 0.5 µm×0.5 µm plotted against pulse duration of the voltage applied on the gate electrode 110. The switching time does not vary due to changes in the area of the moveable electrode 108.

Plot 1904 shows a switching energy of the moveable electrode 108 having an area of 2 µm×2 µm plotted against pulse duration of the voltage applied on the gate electrode 110. Plot 1904 shows a switching energy of the moveable electrode 108 having an area of 0.5 µm×0.5 µm plotted against pulse duration of the voltage applied on the gate electrode 110. The switching energy of the moveable electrode 108 decreases when the area of the moveable electrode 108 is smaller (considering that the mass of the moveable electrode 108 is smaller when the area of the moveable electrode 108 is smaller).

Figure 20:
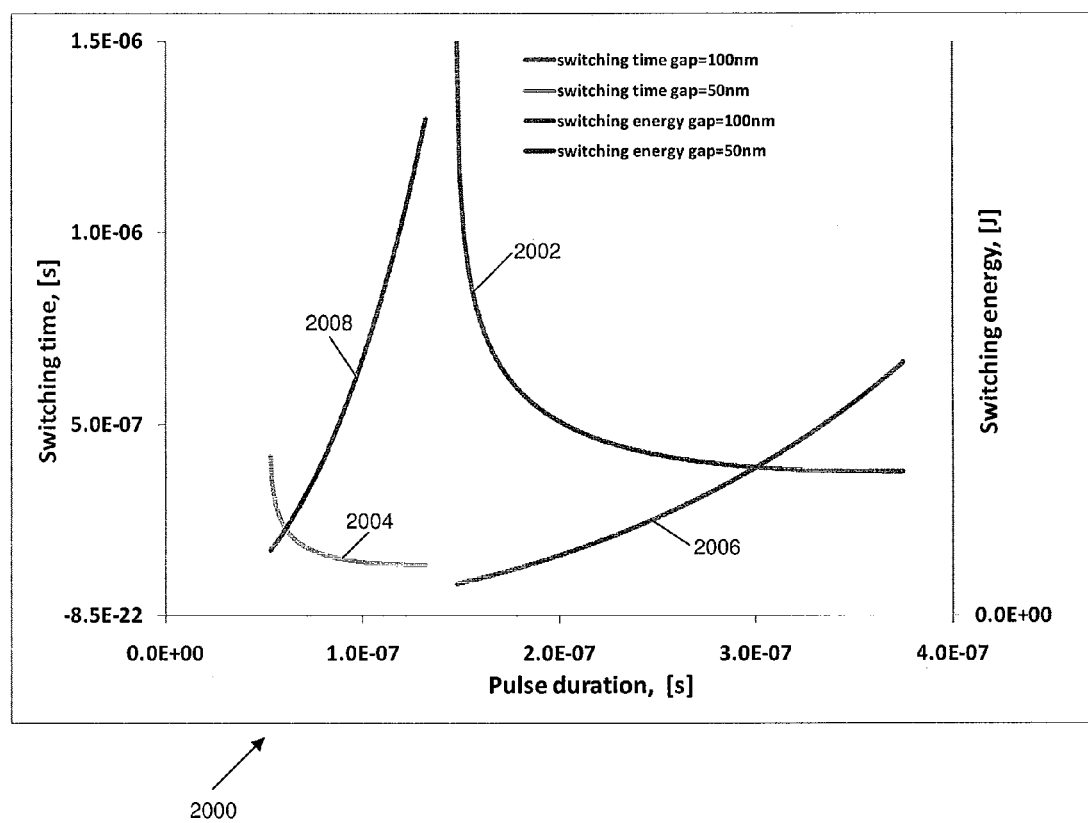
FIG. 20 shows a graph of a switching time and a switching energy of a moveable electrode of a memory cell plotted against pulse duration of a voltage applied on a gate electrode of the memory cell respectively according to one embodiment.

FIG. 20 shows a graph 2000 of a switching time and a switching energy of the moveable electrode 108 plotted against pulse duration of the voltage applied on the gate electrode 110 respectively. Plot 2002 shows a switching time of the moveable electrode 108 plotted against pulse duration of the voltage applied on the gate electrode 110 for an air gap distance $d_{gap}$ of 100 nm. Plot 2004 shows a switching time of the moveable electrode 108 plotted against pulse duration of the voltage applied on the gate electrode 110 for an air gap distance $d_{gap}$ of 50 nm. The switching time of the moveable electrode 108 decreases when the air gap distance $d_{gap}$ is shorter.

Plot 2006 shows a switching energy of the moveable electrode 108 plotted against pulse duration of the voltage applied on the gate electrode 110 for an air gap distance $d_{gap}$ of 100 nm. Plot 2008 shows a switching energy of the moveable electrode 108 plotted against pulse duration of the voltage applied on the gate electrode 110 for an air gap distance $d_{gap}$ of 50 nm. The switching energy increases when the air gap distance $d_{gap}$ is shorter. A smaller air gap distance $d_{gap}$ results in a larger capacitance. Since the switching energy is proportional to the capacitance, the switching energy is higher for a smaller air gap distance $d_{gap}$.

Figure 21:
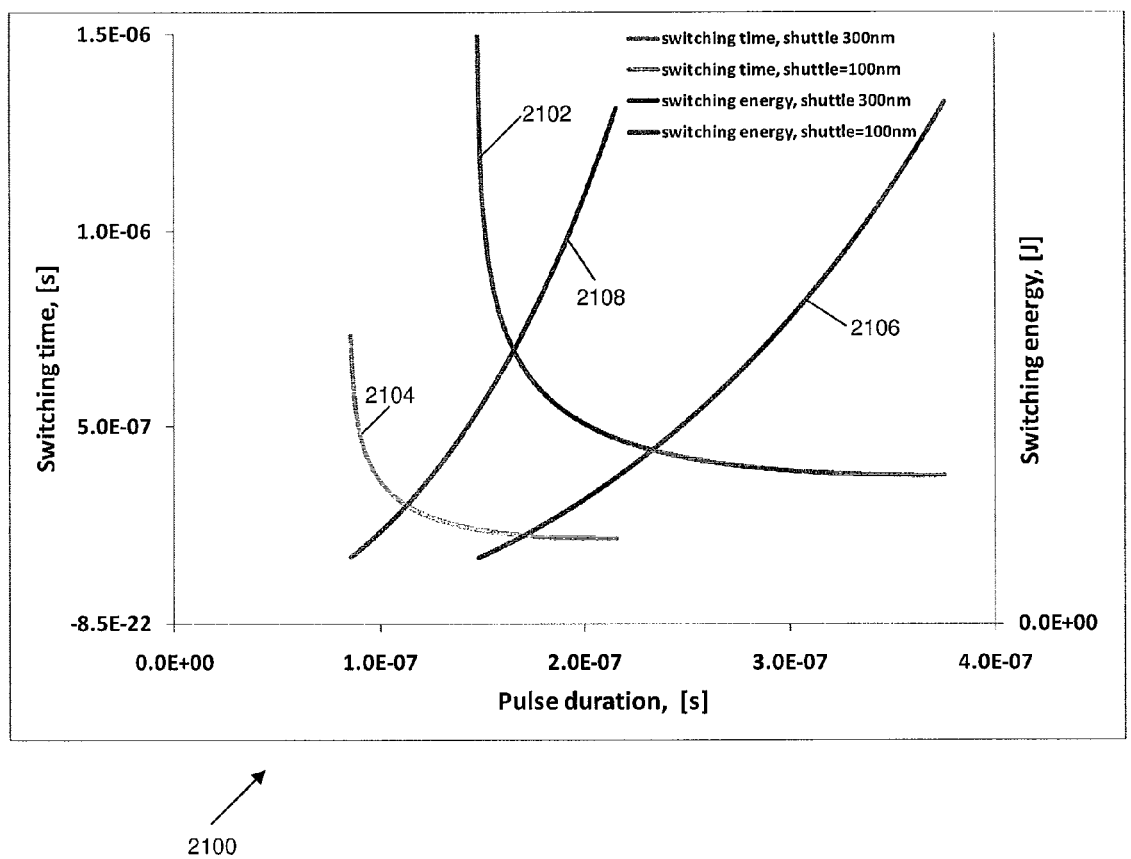
FIG. 21 shows a graph of a switching time and a switching energy of a moveable electrode of a memory cell plotted against pulse duration of a voltage applied on a gate electrode of the memory cell respectively according to one embodiment.

FIG. 21 shows a graph 2100 of a switching time and a switching energy of the moveable electrode 108 plotted against pulse duration of the voltage applied on the gate electrode 110 respectively. Plot 2102 shows a switching time of the moveable electrode 108 having a thickness of 300 nm plotted against pulse duration of the voltage applied on the gate electrode 110. Plot 2104 shows a switching time of the moveable electrode 108 having a thickness of 100 nm plotted against pulse duration of the voltage applied on the gate electrode 110. The switching time decreases when the thickness of the moveable electrode 108 is smaller.

Plot 2106 shows a switching energy of the moveable electrode 108 having a thickness of 300 nm plotted against pulse duration of the voltage applied on the gate electrode 110. Plot 2108 shows a switching energy of the moveable electrode 108 having a thickness of 100 nm plotted against pulse duration of the voltage applied on the gate electrode 110. The switching energy decreases when the thickness of the moveable electrode 108 is smaller.

Figure 22:
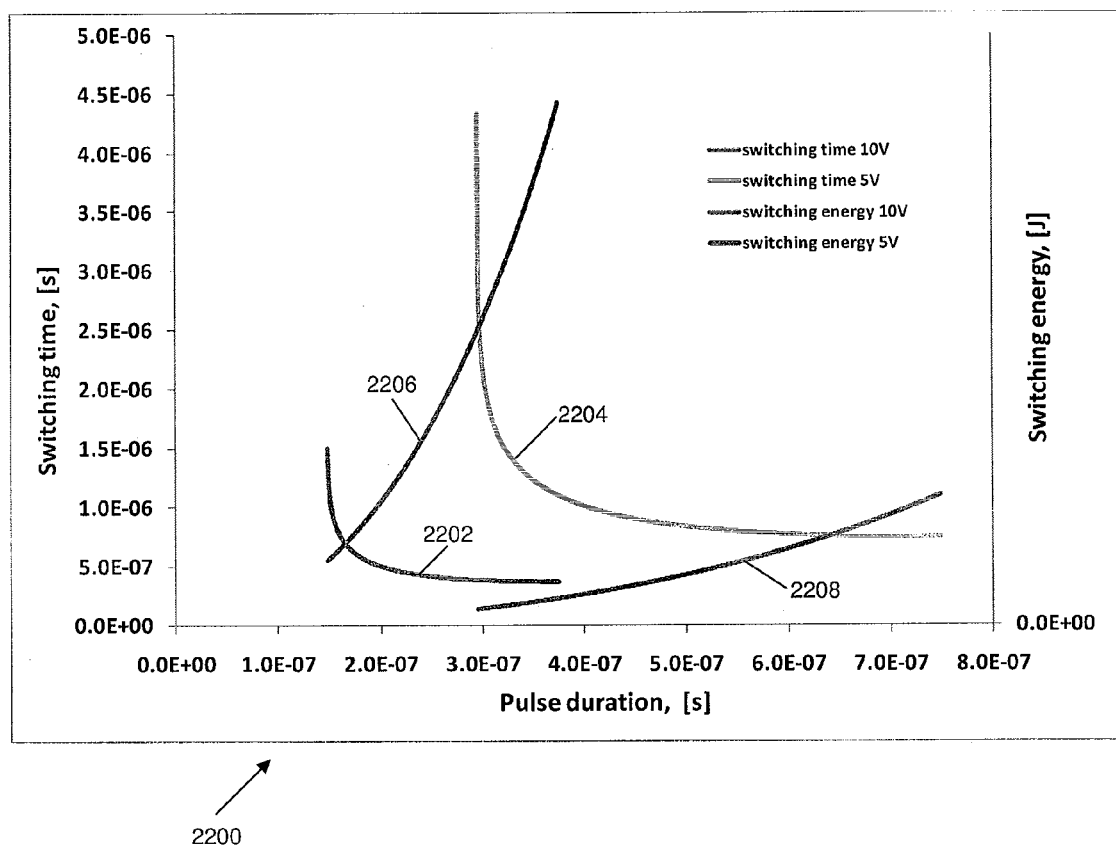
FIG. 22 shows a graph of a switching time and a switching energy of a moveable electrode of a memory cell plotted against pulse duration of a voltage applied on a gate electrode of the memory cell respectively according to one embodiment.

FIG. 22 shows a graph 2200 of a switching time and a switching energy of the moveable electrode 108 plotted against pulse duration of the voltage applied on the gate electrode 110 respectively. Plot 2202 shows a switching time of the moveable electrode 108 plotted against pulse duration of the voltage applied on the gate electrode 110 for a voltage of 10 V applied on the gate electrode 110. Plot 2204 shows a switching time of the moveable electrode 108 plotted against pulse duration of the voltage applied on the gate electrode 110 for a voltage of 5 V applied on the gate electrode 110. The switching time increases when the voltage applied on the gate electrode 110 is lower.

Plot 2206 shows a switching energy of the moveable electrode 108 plotted against pulse duration of the voltage applied on the gate electrode 110 for a voltage of 10 V applied on the gate electrode 110. Plot 2208 shows a switching energy of the moveable electrode 108 plotted against pulse duration of the voltage applied on the gate electrode 110 for a voltage of 5 V applied on the gate electrode 110. The switching energy decreases when the when the voltage applied on the gate electrode 110 is lower.

The memory cell 100 is non-volatile nano-electromechanical (NEM) memory which can exploit both electrical and mechanical properties of nano-scale systems. The memory cell 100 replaces storage media with a bistable mechanical component (e.g. moveable electrode 108). Information is stored in the bistable mechanical structure.

The operation of the shuttle memory cell 100 is based on the commuting of a free flying electrode (the shuttle, e.g. the moveable electrode 108) placed between e.g. a bottom fixed electrode (Gate) and two anchored electrodes (Drain and Source). The anchorless moveable electrode 108 is placed inside a guiding cavity, and vertically switches from e.g. one fixed electrode (e.g. gate electrode 110) to another pair of fixed electrodes (e.g. drain electrode 112 and source electrode 114). The moveable electrode 108 has two stable mechanical positions. The guiding cavity 118 of the memory cell 110 has a double air-gap geometry which can ensure that the moveable electrode 108 is actively actuated towards the two stable positions.

The switching voltage is dependent on the actuation air gaps. A low switching voltage can be achieved. There is no hard-bound limitation in the switching voltage. The switching voltage may be a pulsed voltage. Thus, the memory cell 100 can provide a pulse mode switching of the moveable electrode 108 between the two positions. The switching voltage does not depend on planar dimensions of the moveable electrode 108. In other words, the switching voltage is independent from the area of the moveable electrode 108. Therefore, a large structure of the moveable electrode 108 is not needed. Thus, a compact design of the memory cell 100 can be provided.

Forces acting on the moveable electrode 108 may include (i) the electrostatic force, (ii) adhesion forces between the shuttle and fixed electrodes, (iii) damping forces during transients, and (iv) the gravity. The moveable electrode 108 may be actuated by electrostatic forces. As such, a fast switching and energy efficient way of moving the moveable electrode 108 between the at least one first electrode 104 and the at least one second electrode 106 can be provided. Further, electromechanical bi-stability and permanent retention can be obtained by adhesion forces. Thus, leakage observed in storage layers used in conventional memory cells can be eliminated.

No elastic anchors are used for the moveable electrode 108 as the gravity force is found to be negligible compared to adhesion forces (e.g. at least 4 decades). As such, the memory cell 100 is not sensitive to elastic fatigue. An anchorless design of the memory cell 100 makes the memory cell 100 scalable. The scalability of the memory cell 100 may eliminate many causes of failure or operation drifts (e.g. beam fatigue, residual stress, and device to device mismatch) and may facilitate cell design and modeling. Thus, the free flying moveable electrode 108 can provide a robust, compact and scalable design for the memory cell 100. Using an anchorless shuttle, the design of the memory cell 100 is highly eased compared to conventional NEM structures.

The memory cell 100 can overcome high temperature HT limitations (e.g. having seamless operation from room temperature up to 300° C.). The memory cell 100 can provide high switching speed, high reliability, low variability and high density. The memory cell 100 can be vibration insensitive.

In addition, memory detection/reading may be ohmic, with a large and non-temperature sensitive ratio between ON and OFF levels (e.g. $I_{ON}/I_{OFF}$ ratio). The circuit design (e.g. memory addressing design) may be eased. More than about 10 G ON/OFF cycles may be carried out without failure which is higher than FLASH memory.

A memory bit area in the range of $4F^2$ with a calculated switching time in the range of 10 ns to 100 ns can be achievable for the memory cell 100. Memory reading for the memory cell may be very fast (e.g. <50 ns/bit). Further, the memory cell 100 can provide a symmetrical (bi-directional) read. The memory cell 100 can also provide simple READ, WRITE, HOLD, RESET control.

The memory cell 100 can provide a simple and compact NEM structure for low-cost, high-density and high temperature non-volatile memory (NVM) applications. The memory cell 100 can be used in medium density non-volatile memory arrays for high temperature or harsh applications (e.g. industrial, automotive, oil and gas, defence, aerospace, etc). The memory cell 100 can be used for low voltage and low cost embedded memories.

The memory cell 100 may be used for characterization of adhesion forces, analysis of tunnel/ohmic contacts or nano-electro-mechanical logic operations. The memory cell 100 may be used as a gas sensor, a pressure sensor or a shock detector. The memory cell 100 may also be used for memory bit demonstrator and memory bit optimization.

It is desirable for the memory cell 100 to operate under vacuum in order to avoid air damping effect. The memory cell 100 may be further scaled for high density memory arrays, may be packaged under vacuum to prevent dust, damping or humidity from affecting switching operations (for contact protection and increasing switching speed), may be above-IC integrated for a proper array addressing scheme, may be co-integrated or packaged with CMOS logic and/or may be combined with a NEM based logic or NEM switch. The memory cell 100 (e.g. a MEMS memory) and a MEMS logic may be formed on the same substrate.

Figure 23:
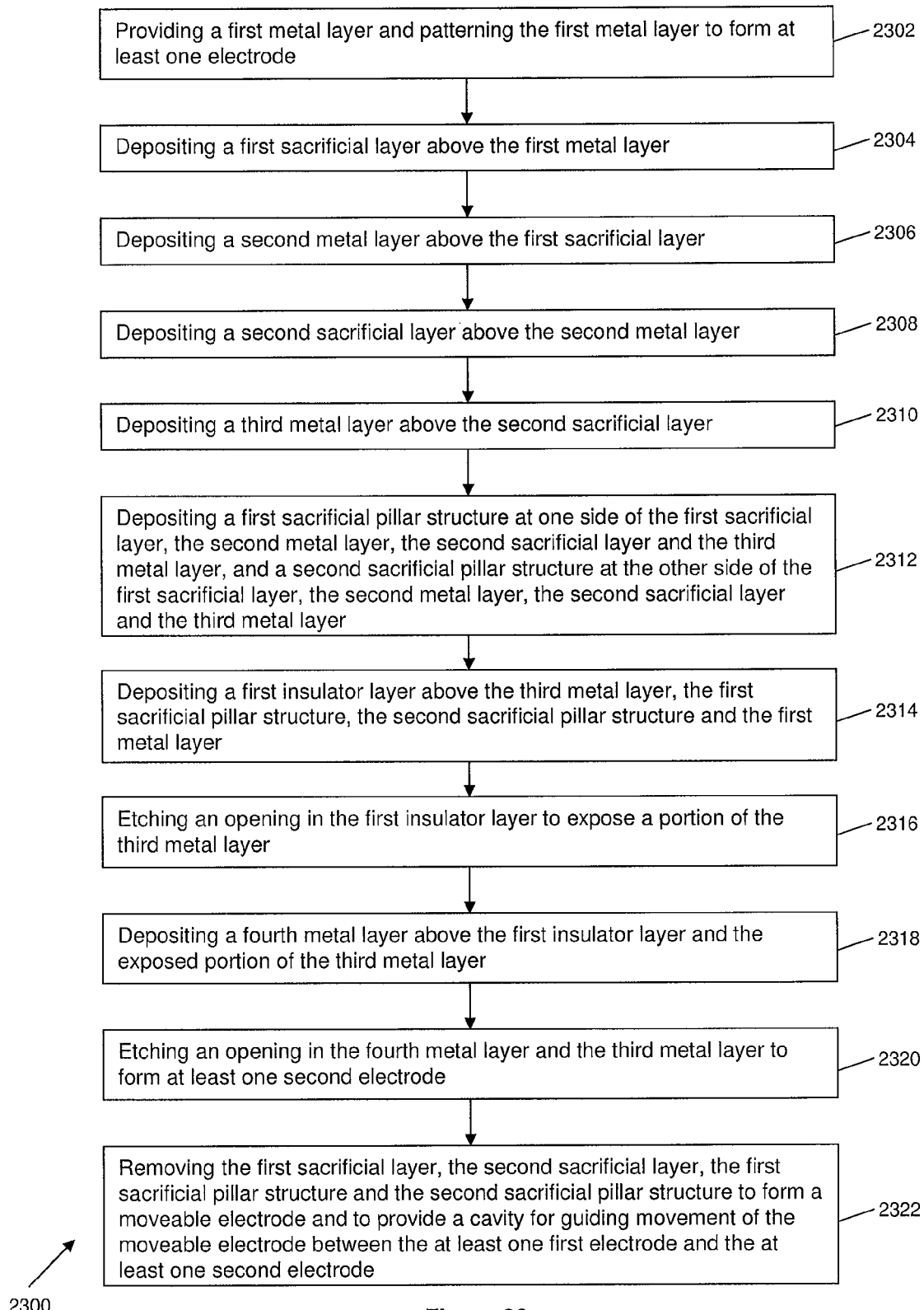
FIG. 23 shows a flowchart of a process for manufacturing a memory cell according to one embodiment.

FIG. 23 shows a flowchart 2300 of a process for manufacturing a memory cell. At 2302, a first metal layer is provided and the first metal layer is patterned to form at least one first electrode. At 2304, a first sacrificial layer is deposited above the first metal layer. At 2306, a second metal layer is deposited above the first sacrificial layer. At 2308, a second sacrificial layer is deposited above the second metal layer. At 2310, a third metal layer is deposited above the second sacrificial layer. At 2312, a first sacrificial pillar structure is deposited at one side of the first sacrificial layer, the second metal layer, the second sacrificial layer and the third metal layer, and a second sacrificial pillar structure is deposited at the other side of the first sacrificial layer, the second metal layer, the second sacrificial layer and the third metal layer. At 2314, a first insulator layer is deposited above the third metal layer, the first sacrificial pillar structure, the second sacrificial pillar structure and the first metal layer. At 2316, an opening is etched in the first insulator layer to expose a portion of the third metal layer. At 2318, a fourth metal layer is deposited above the first insulator layer and the exposed portion of the third metal layer. At 2320, an opening is etched in the fourth metal layer and the third metal layer to form at least one second electrode. At 2322, the first sacrificial layer, the second sacrificial layer, the first sacrificial pillar structure and the second sacrificial pillar structure are removed to form a moveable electrode and to provide a cavity for guiding movement of the moveable electrode between the at least one first electrode and the at least one second electrode.

In one embodiment, the first insulator layer may be deposited by plasma enhanced chemical vapor deposition. The first sacrificial layer, the second sacrificial layer, the first sacrificial pillar structure and the second sacrificial pillar structure may be removed using hydrofluoric acid vapor. The first metal layer may be deposited above a second insulator layer. The second insulator layer may be deposited above a substrate. The first metal layer may be deposited by physical vapor deposition. The second insulator layer may be deposited by low pressure chemical vapor deposition.

The first metal layer, the second metal layer, the third metal layer and the fourth metal layer may include but are not limited to tantalum nitride, titanium nitride, ruthenium and molybdenum. The first sacrificial layer, the second sacrificial layer, the first sacrificial pillar structure and the second sacrificial pillar structure may include silicon dioxide. The first insulator layer and the second insulator layer may include but are not limited to silicon nitride, aluminum oxide and amorphous silicon. The substrate may include but is not limited to silicon and glass.

In one embodiment, the at least one first electrode may include a gate electrode, and the at least one second electrode may include a drain electrode and a source electrode. In another embodiment, the at least one first electrode may include a drain electrode and a source electrode, and the at least one second electrode may include a gate electrode. In yet another embodiment, the at least one first electrode may include a gate electrode, a drain electrode and a source electrode, and the at least one second electrode may include a drain electrode and a source electrode.

FIG. 24 shows an exemplary process for manufacturing a memory cell. FIG. 24a shows an insulator layer 2402 deposited above a substrate 2404. The insulator layer 2402 may be deposited by low pressure chemical vapor deposition (LPCVD). The insulator layer 2402 may include but is not limited to silicon nitride, aluminum oxide and amorphous silicon. The substrate 2404 may include but is not limited to silicon and glass. A first metal layer 2406 may be deposited above the insulator layer 2402. The first metal layer 2406 may be deposited by physical vapor deposition (PVD). The first metal layer 2406 may be patterned to form at least one first electrode 104. The first metal layer 2406 may include but is not limited to tantalum nitride, titanium nitride, ruthenium and molybdenum.

Figure 24A:
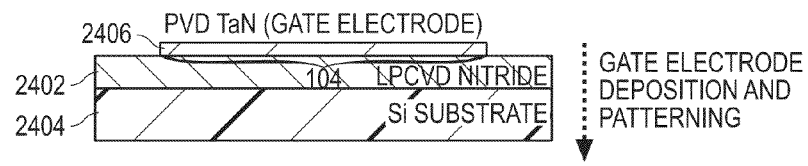
FIG. 24 shows a process for manufacturing a memory cell according to one embodiment.
Figure 24B:
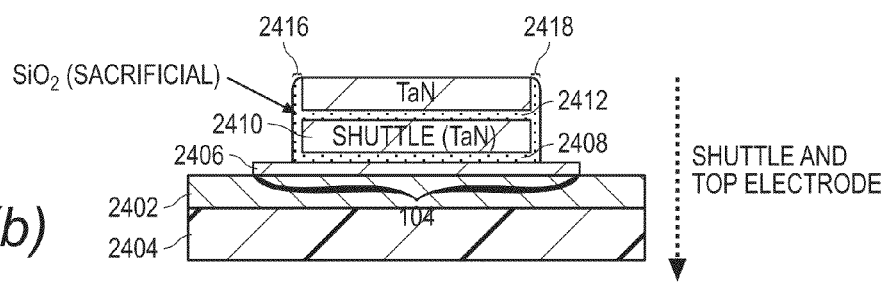

FIG. 24b shows a first sacrificial layer 2408 deposited above the first metal layer 2406. A second metal layer 2410 may be deposited above the first sacrificial layer 2408. A second sacrificial layer 2412 may be deposited above the second metal layer 2410. A third metal layer 2414 may be deposited above the second sacrificial layer 2412. A first sacrificial pillar structure 2416 may be deposited at one side of the first sacrificial layer 2408, the second metal layer 2410, the second sacrificial layer 2412 and the third metal layer 2414. A second sacrificial pillar structure 2418 may be deposited at the other side of the first sacrificial layer 2408, the second metal layer 2410, the second sacrificial layer 2412 and the third metal layer 2414. The first sacrificial layer 2408, the second sacrificial layer 2412, the first sacrificial pillar structure 2416 and the second sacrificial pillar structure 2418 may include silicon dioxide. The second metal layer 2410 and the third metal layer 2414 may include but are not limited to tantalum nitride, titanium nitride, ruthenium and molybdenum.

Figure 24C:
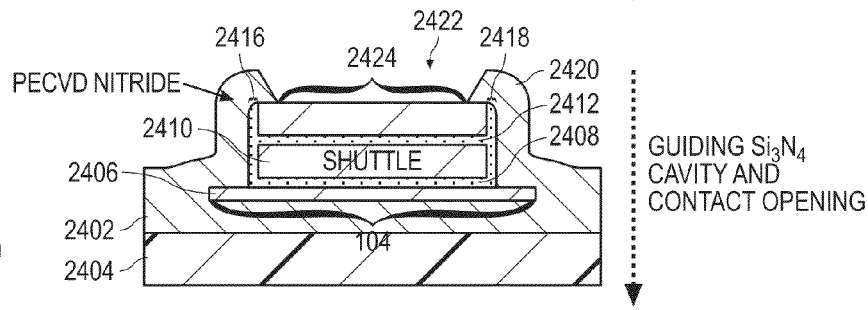

FIG. 24c shows a further insulator layer 2420 deposited above the third metal layer 2414, the first sacrificial pillar structure 2416, the second sacrificial pillar structure 2418 and the insulator layer 2202. The further insulator layer 2420 may be deposited by plasma enhanced chemical vapor deposition (PECVD). An opening 2422 may be etched in the further insulator layer 2420 to expose a portion 2424 of the third metal layer 2414. The further insulator layer 2420 may include but is not limited to silicon nitride, aluminum oxide and amorphous silicon.

Figure 24D:
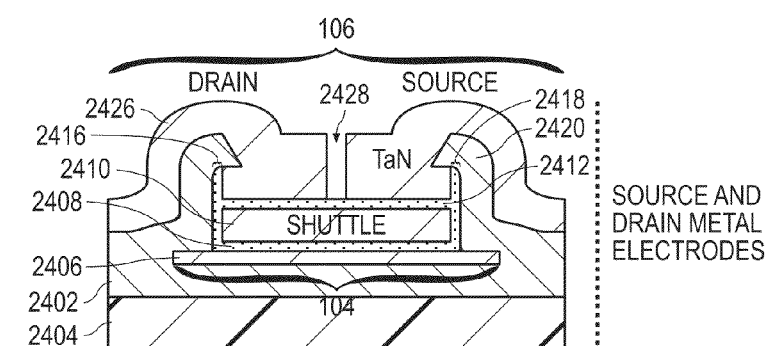

FIG. 24d shows a fourth metal layer 2426 deposited above the further insulator layer 2420 and the exposed portion 2424 of the third metal layer 2414. In other words, the fourth metal layer 2426 may be deposited in the opening 2422. An opening 2428 may be etched in the fourth metal layer 2426 and the third metal layer 2414 to form at least one second electrode 106. The fourth metal layer 2426 may include but is not limited to tantalum nitride, titanium nitride, ruthenium and molybdenum.

Figure 24E:
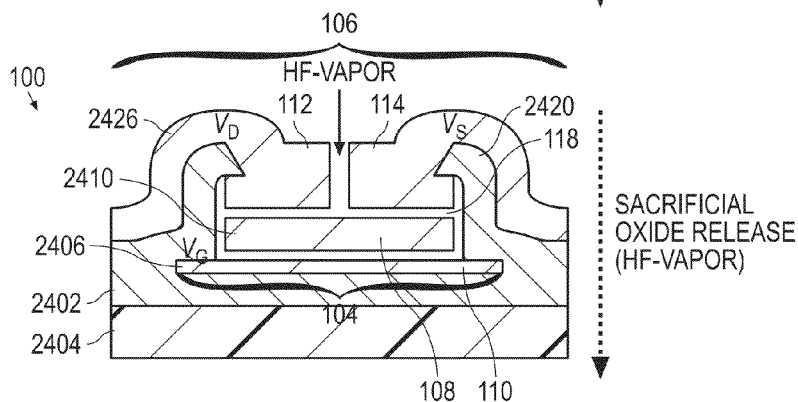

FIG. 24e shows the first sacrificial layer 2408, the second sacrificial layer 2412, the first sacrificial pillar structure 2416 and the second sacrificial pillar structure 2418 being removed to form a moveable electrode 108 and to provide a cavity 118 for guiding movement of the moveable electrode 108 between the at least one first electrode 104 and the at least one second electrode 106. The first sacrificial layer 2408, the second sacrificial layer 2412, the first sacrificial pillar structure 2416 and the second sacrificial pillar structure 2418 may be removed using hydrofluoric acid vapor. A memory cell 100 is formed. The at least one first electrode 104 includes a gate electrode 110 and the at least one second electrode 106 includes a drain electrode 112 and a source electrode 114. The memory cell 100 shown in FIG. 24e corresponds to the memory cell 100 of FIG. 1.

In summary, FIG. 24 describes a 4-mask process using silicon nitride as buffer material and guiding pod, metal for electrodes and the shuttle, and silicon oxide as sacrificial material. The structure of the memory cell 100 is processed by standard micro-machining steps of layer deposition, photolithography, etching and annealing. In one embodiment, tantalum nitride (TaN) is used for metal electrodes as it is a hard material and does not tarnish or oxidize easily, even at high temperature. The process of manufacturing the memory cell 100 is simple and inexpensive. No expensive materials are used for manufacturing the memory cell 100.

FIG. 27 shows an exemplary process for manufacturing a memory cell. FIG. 27a shows that a first insulator layer 2702 is deposited above a substrate 2704 and a second insulator layer 2706 is deposited above the first insulator layer 2702. The first insulator 2702 may be deposited by low pressure chemical vapor deposition (LPCVD). The first insulator 2702 may include silicon nitride. The first insulator 2702 may have a thickness of about 300 nm. The second insulator layer 2706 may be deposited by atomic layer deposition (ALD). The second insulator layer 2706 may include aluminum oxide. The second insulator layer 2706 may have a thickness of about 50 nm.

Figure 27A:
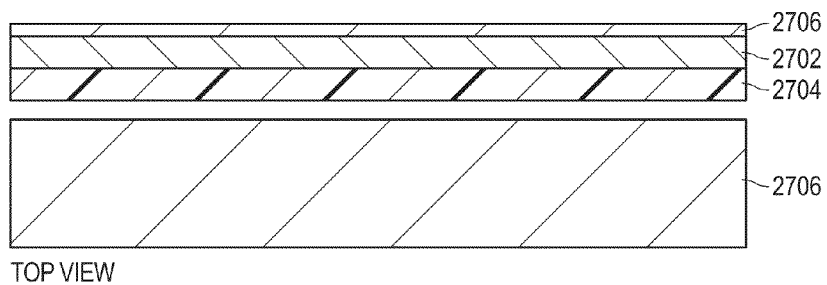
FIG. 27 shows a process for manufacturing a memory cell according to one embodiment.
Figure 27B:
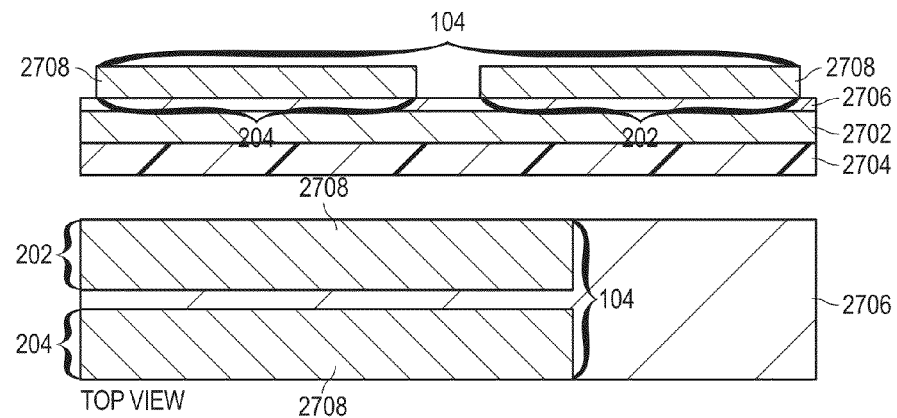

FIG. 27b shows that a first metal layer 2708 is deposited above the second insulator layer 2706 and is etched to form at least one first electrode 104. The at least one first electrode 104 includes a drain electrode 202 and a source electrode 204. The first metal layer 2708 may be deposited by physical vapor deposition (PVD). The first metal layer 2708 may include molybdenum. The first metal layer 2708 may have a thickness of about 300 nm.

Figure 27C:
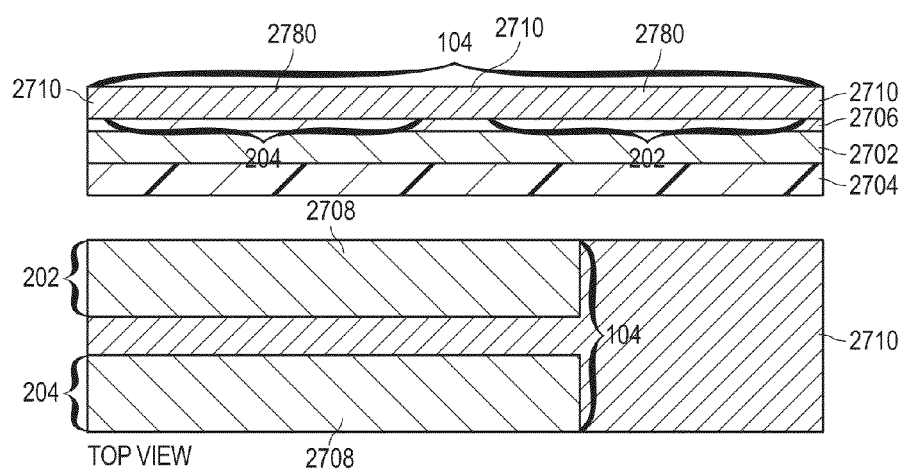

FIG. 27c shows that a first sacrificial layer 2710 is deposited above the first metal layer 2708 and the second insulator layer 2706 and is etched to planarize the first sacrificial layer 2710. The first sacrificial layer 2710 is etched to expose the first metal layer 2708. The first sacrificial layer 2710 may be deposited by plasma enhanced chemical vapor deposition (PECVD). The first sacrificial layer 2710 may be etched by chemical mechanical planarization/polishing (CMP). The first sacrificial layer 2710 may include silicon dioxide. The first sacrificial layer 2710 may a thickness equal to or more than 300 nm.

Figure 27D:
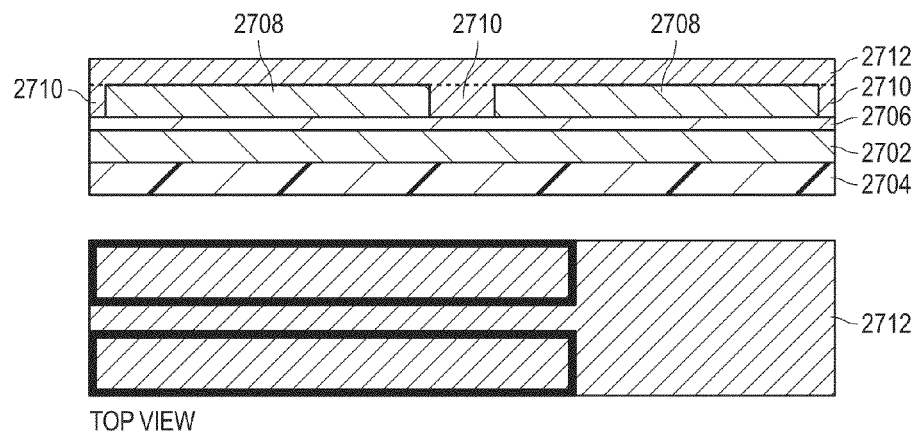

FIG. 27d shows that a second sacrificial layer 2712 is deposited above the first sacrificial layer 2710. The second sacrificial layer 2712 may be deposited by plasma enhanced chemical vapor deposition (PECVD). The second sacrificial layer 2712 may include silicon dioxide. The second sacrificial layer 2712 may a thickness of about 150 nm.

Figure 27E:
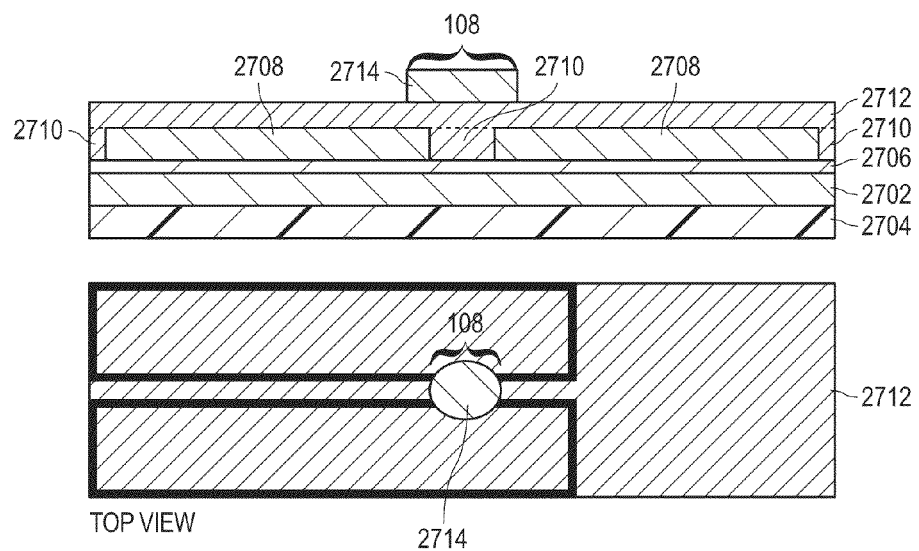

FIG. 27e shows that a second metal layer 2714 is deposited above the second sacrificial layer 2712 and is etched to desired dimensions for a moveable electrode 108. The second metal layer 2714 may be deposited by physical vapor deposition (PVD). The second metal layer 2714 may include molybdenum. The second metal layer 2714 may have a thickness of about 300 nm.

Figure 27F:
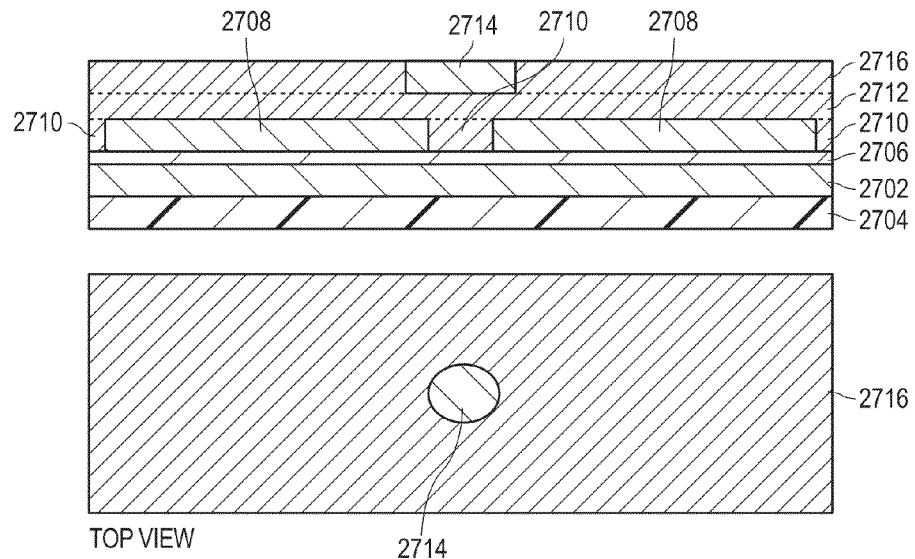

FIG. 27f shows a third sacrificial layer 2716 is deposited above the second metal layer 2714 and the second sacrificial layer 2712. The third sacrificial layer 2716 is etched to expose the second metal layer 2714 and to planarize the third sacrificial layer 2716. The third sacrificial layer 2716 may be deposited by plasma enhanced chemical vapor deposition (PECVD). The third sacrificial layer 2716 may be etched by chemical mechanical planarization/polishing (CMP). The third sacrificial layer 2716 may include silicon dioxide. The third sacrificial layer 2716 may a thickness equal to or more than 300 nm.

Figure 27G:
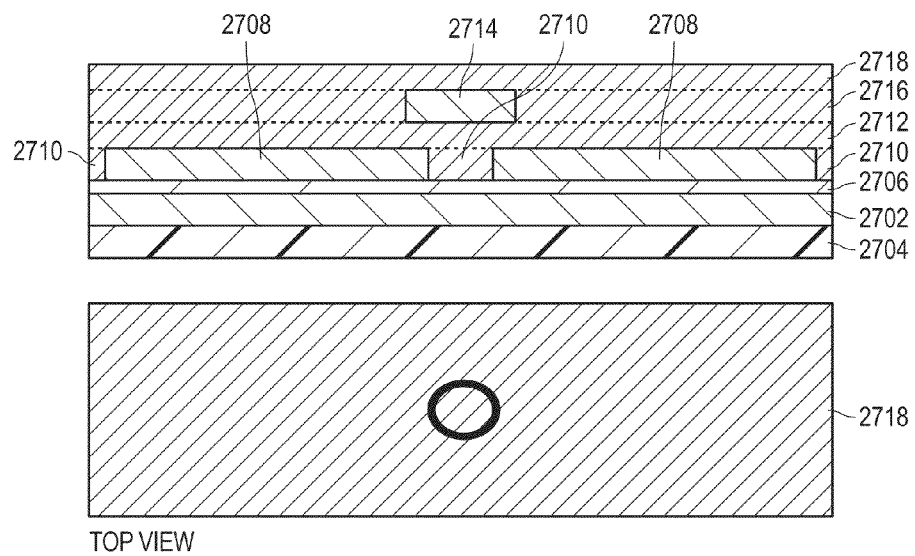

FIG. 27g shows a fourth sacrificial layer 2718 is deposited above the second metal layer 2714 and the third sacrificial layer 2716. The fourth sacrificial layer 2718 may be deposited by plasma enhanced chemical vapor deposition (PECVD). The fourth sacrificial layer 2718 may include silicon dioxide. The fourth sacrificial layer 2718 may have a thickness of about 150 nm.

Figure 27H:
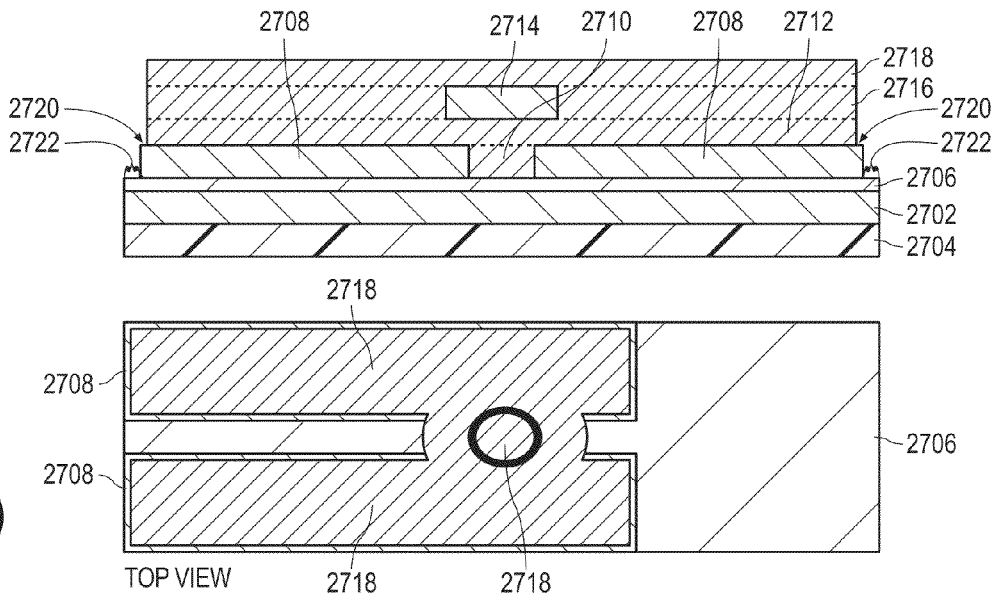

FIG. 27h shows that the first sacrificial layer 2710, the second sacrificial layer 2712, the third sacrificial layer 2716 and the fourth sacrificial layer 2718 are etched to expose portions 2720 of the first metal layer 2708 and portions 2722 of the second insulator layer 2706. The first metal layer 2708 may be slightly etched to allow proper etching of oxide in all areas.

Figure 27I:
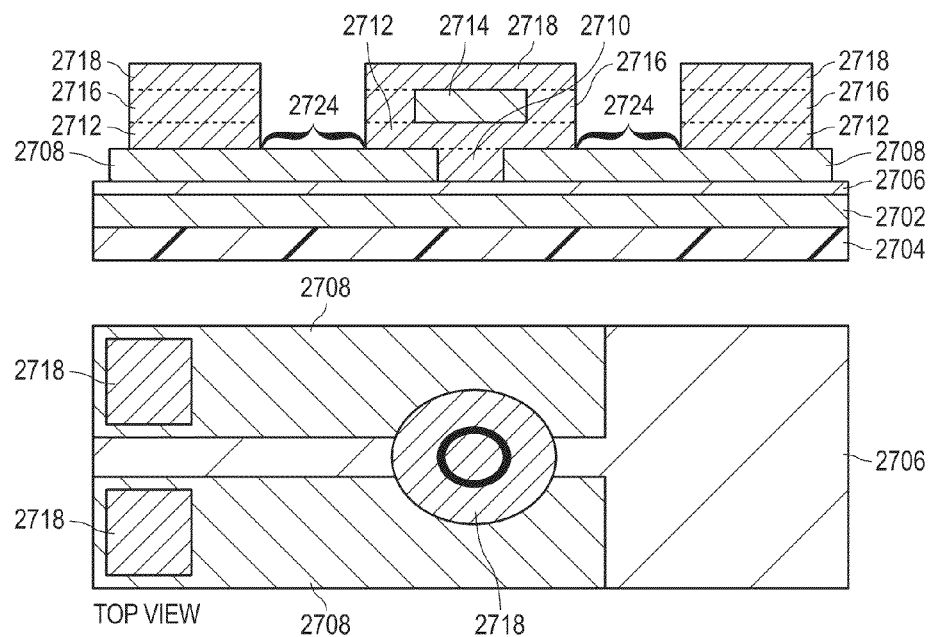

FIG. 27i shows that the first sacrificial layer 2710, the second sacrificial layer 2712, the third sacrificial layer 2716 and the fourth sacrificial layer 2718 are etched to define spacer and contact pad area 2724. An overlap of the spacer may be negligible if the spacer is larger than the moveable electrode 108.

Figure 27J:
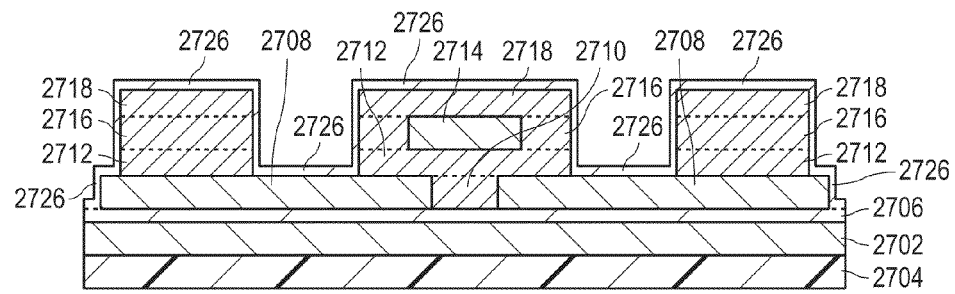
Figure 27J:
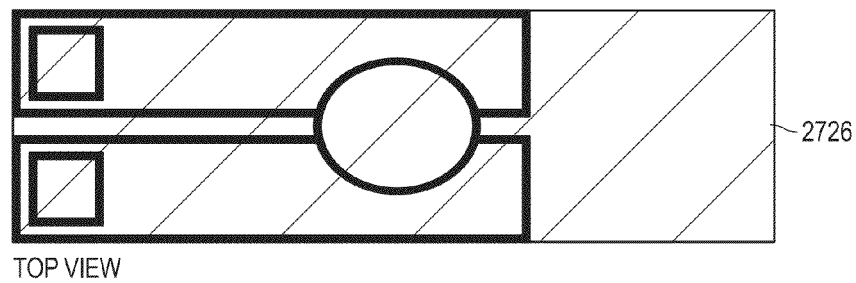

FIG. 27j shows that a third insulator layer 2726 is deposited along a boundary of the second insulator layer 2706, the first metal layer 2708, the second sacrificial layer 2712, the third sacrificial layer 2716 and the fourth sacrificial layer 2718. The third insulator layer 2726 may be deposited by atomic layer deposition (ALD). The third insulator layer 2726 may include aluminum oxide. The third insulator layer 2726 may have a thickness of about 50 nm.

Figure 27K:
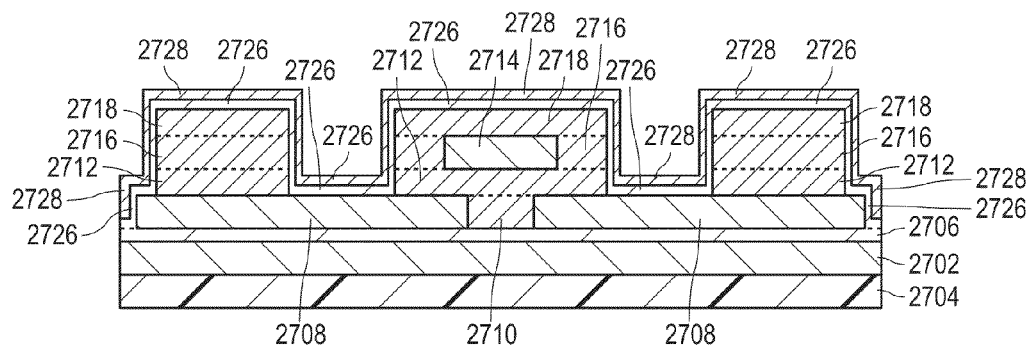
Figure 27K:
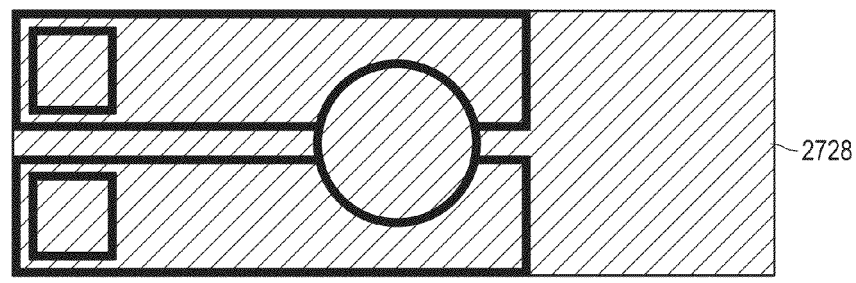

FIG. 27k shows that a dielectric layer 2728 is deposited above the third insulator layer 2726. The dielectric layer 2728 may include silicon dioxide. The dielectric layer 2728 may have a high density and may have a thickness of about 1000 Å.

Figure 27L:
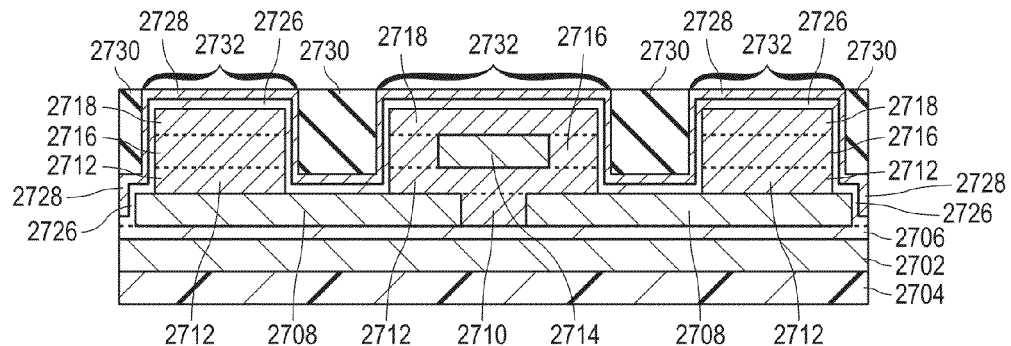
Figure 27L:
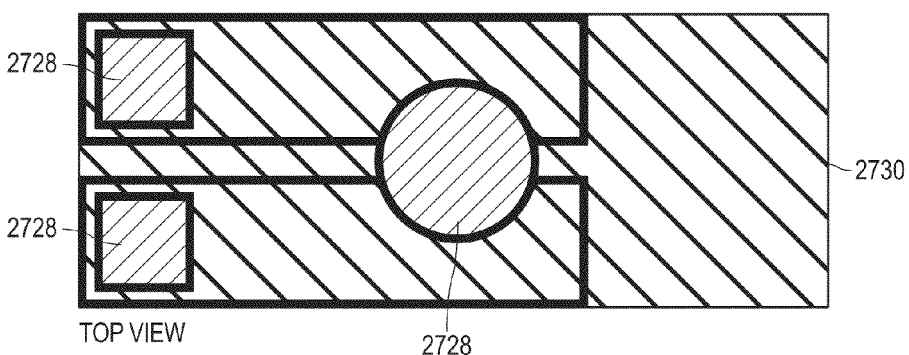

FIG. 27l shows that a fourth insulator layer 2730 is deposited above the dielectric layer 2728 and is etched to expose portions 2732 of the dielectric layer 2728. The fourth insulator layer 2730 may be deposited by plasma enhanced chemical vapor deposition (PECVD). The fourth insulator layer 2730 may be etched by chemical mechanical planarization/polishing (CMP). The fourth insulator layer 2730 may include amorphous silicon. The fourth insulator layer 2730 may have a thickness of about 8000 Å. Annealing may be carried out for the fourth insulator layer 2730 at a temperature of about 600° C. to relieve stresses in the fourth insulator layer 2730.

Figure 27M:
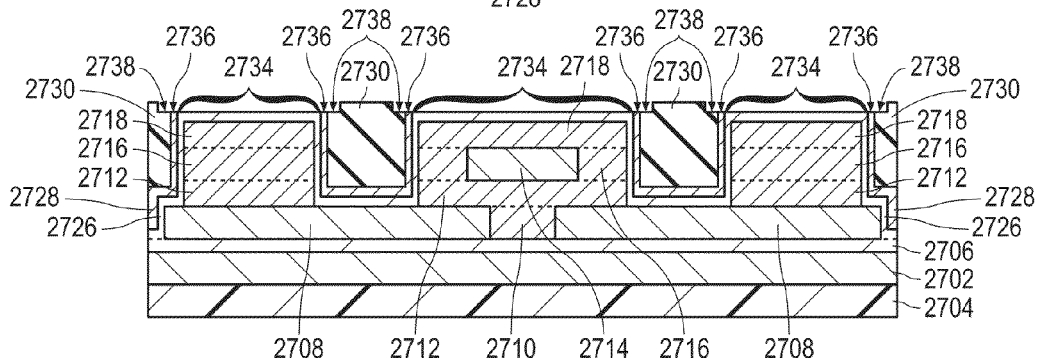
Figure 27M:
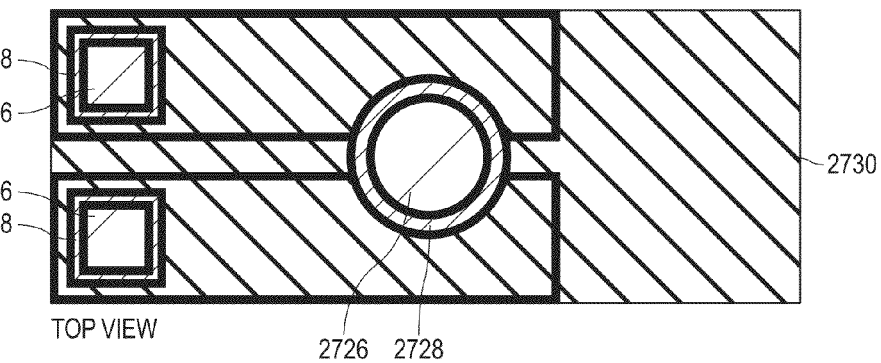

FIG. 27m shows that the exposed portions 2732 of the dielectric layer 2728 are etched to expose portions 2734 of the third insulator layer 2726 and portions 2736 of the dielectric layer 2728. Portions 2738 of the fourth insulator layer 2730 are also etched.

Figure 27N:
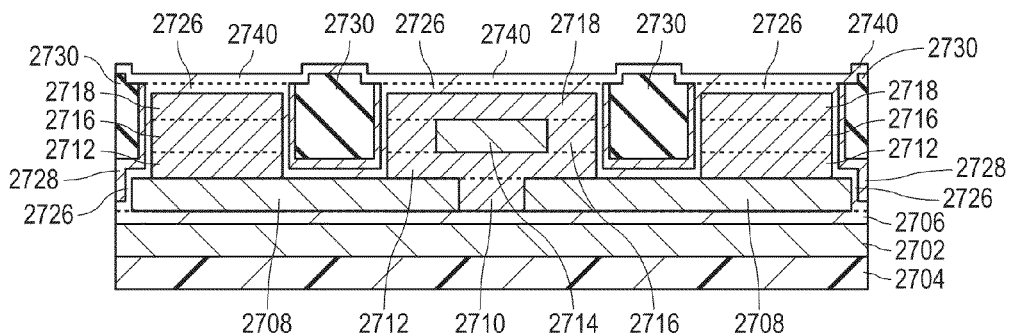
Figure 27N:
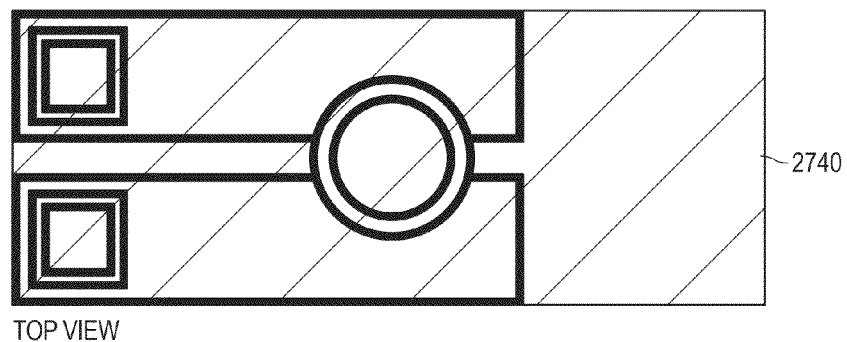

FIG. 27n shows that a fifth insulator layer 2740 is deposited above the exposed portions 2734 of the third insulator layer 2726, the exposed portions 2736 of the dielectric layer 2728 and the fourth insulator layer 2730. The fifth insulator layer 2740 may be deposited to seal and protect the dielectric layer 2728 and the fourth insulator layer 2730. The fifth insulator layer 2740 may be deposited by atomic layer deposition (ALD). The fifth insulator layer 2740 may include aluminum oxide. The fifth insulator layer 2740 may have a thickness of about 50 nm.

Figure 27O:
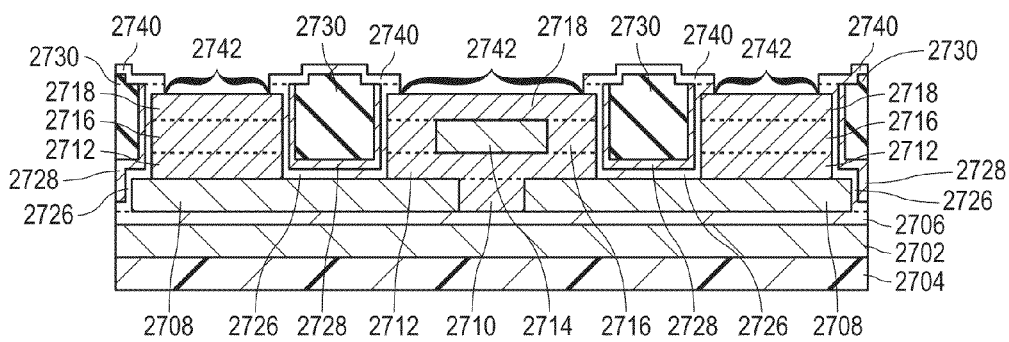
Figure 27O:
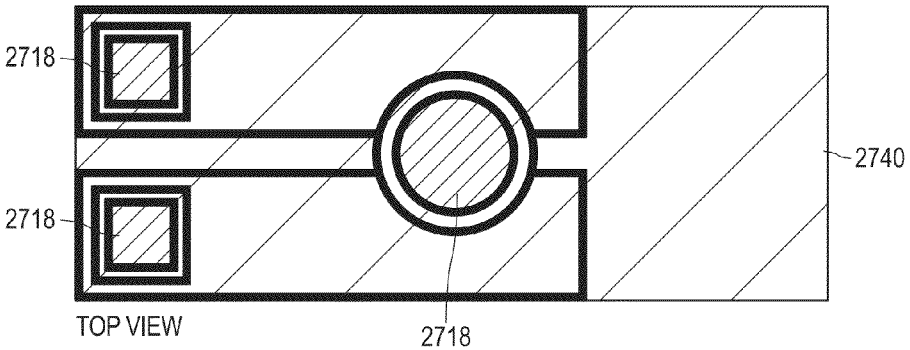

FIG. 27o shows that the third insulator layer 2726 and the fifth insulator layer 2740 are etched to expose portions 2742 of the fourth sacrificial layer 2718.

Figure 27P:
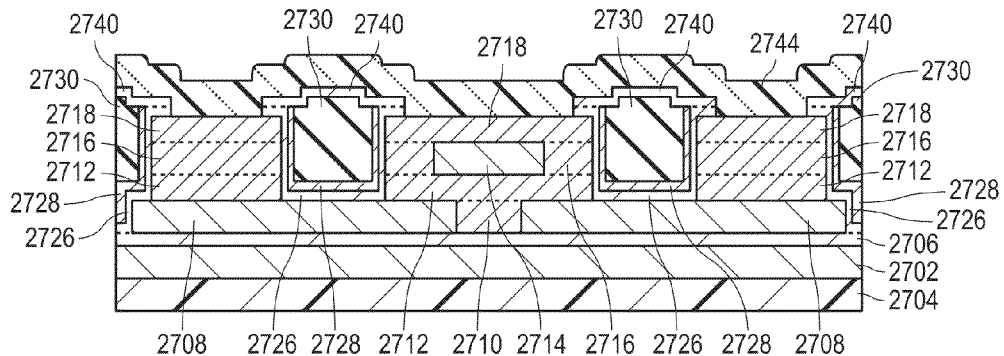
Figure 27P:
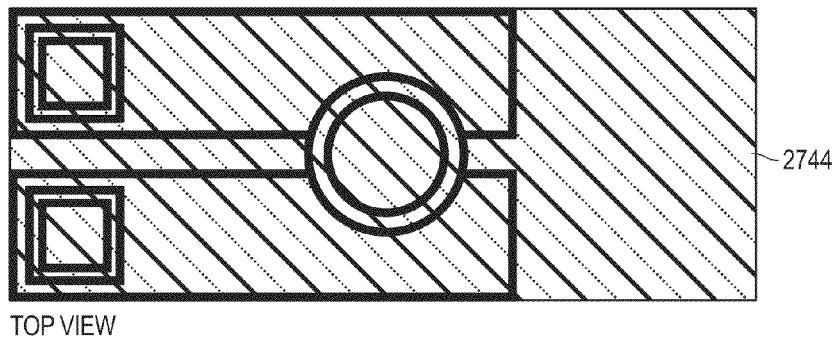

FIG. 27p shows that a third metal layer 2744 is deposited above the fifth insulator layer 2740 and the exposed portions 2742 of the fourth sacrificial layer 2718. The third metal layer 2744 may be deposited by physical vapor deposition. The third metal layer 2744 may include molybdenum. The third metal layer 2744 may have a thickness of about 300 nm.

Figure 27Q:
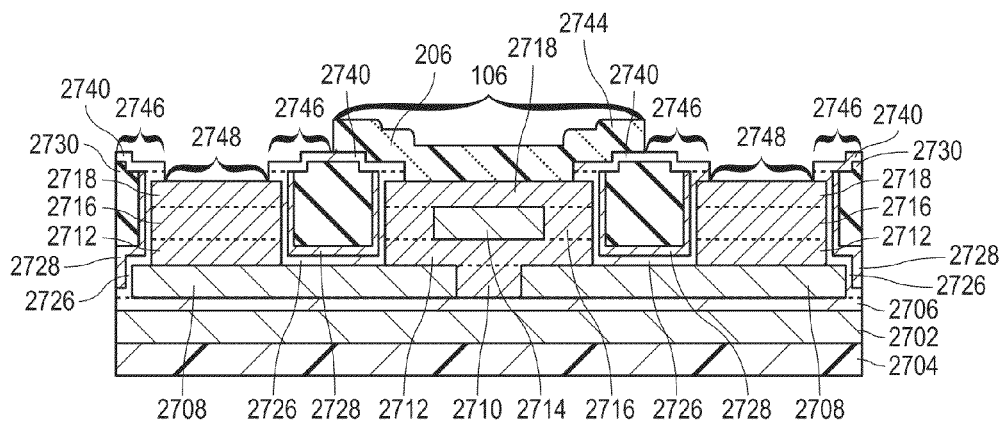
Figure 27Q:
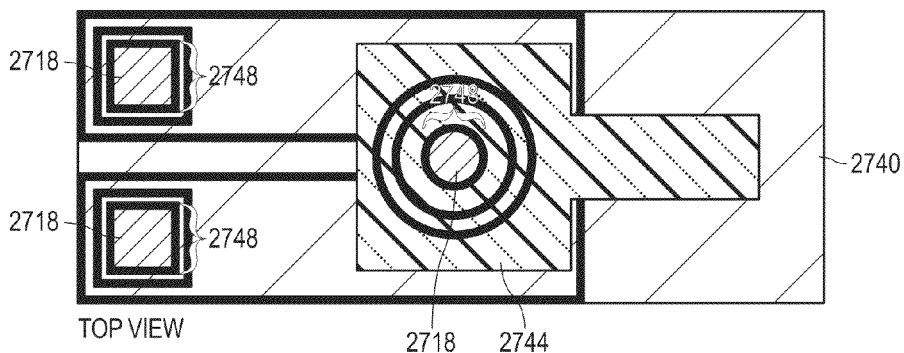

FIG. 27q shows that the third metal layer 2744 is etched to form at least one second electrode 106. The at least one second electrode 106 includes a gate electrode 206. Portions 2746 of the fifth insulator layer 2740 and portions 2748 of the fourth sacrificial layer 2718 are exposed. The third metal layer 2744 may be dry etched.

Figure 27R:
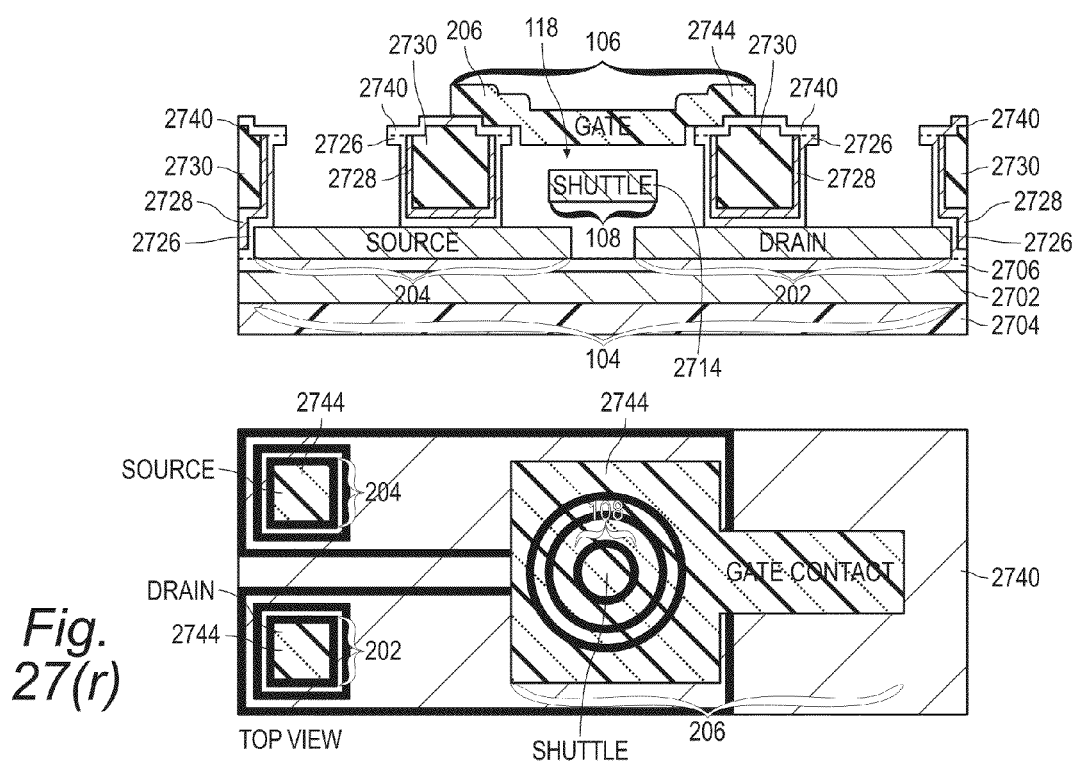

FIG. 27r shows that the first sacrificial layer 2710, the second sacrificial layer 2712, the third sacrificial layer 2716 and the fourth sacrificial layer 2718 are removed to form a moveable electrode 108 and to provide a cavity 118 for guiding movement of the moveable electrode 108 between the at least one first electrode 104 (e.g. the drain electrode 202 and the source electrode 204) and the at least one second electrode 106 (e.g. the gate electrode 206). The first sacrificial layer 2710, the second sacrificial layer 2712, the third sacrificial layer 2716 and the fourth sacrificial layer 2718 may be removed using hydrofluoric acid vapor. A memory cell 100 is formed. The memory cell 100 shown in FIG. 27r corresponds to the memory cell 100 of FIG. 2.

In summary, an exemplary fabrication process for e.g. the memory cell 100 of FIG. 2 may include depositing at least two fixed electrodes on top of an insulator layer, which is deposited on a substrate. A first sacrificial layer may be deposited and polished. An electrode may be deposited and etched to the designed dimensions of an anchorless shuttle (e.g. moveable electrode 108), A second sacrificial layer may be deposited and polished. The two sacrificial layers may be etched to the design dimensions. An insulator layer may be deposited. A structural material of the memory cell may be deposited. Then, the structure may be planarized and the guiding insulator may be locally etched to access the second sacrificial layer. A top conductive electrode may be deposited and etched. All sacrificial layers may be released by a specific etchant selective to other materials.

In one embodiment, the memory cell 100 shown in FIG. 24e may include a further gate electrode disposed above the drain electrode 112 and the source electrode 114. Thus, the memory cell 100 shown in FIG. 24e may correspond to the memory cell 100 of FIG. 3.

In another embodiment, the at least one first electrode 104 may include a gate electrode, a drain electrode and a source electrode, and the at least one second electrode 106 may include a drain electrode and a source electrode (e.g. the memory cell 100 of FIG. 4).

A skilled person would be able to derive the process of manufacturing the various embodiments of the memory cell from the processes described above.

Figure 25:
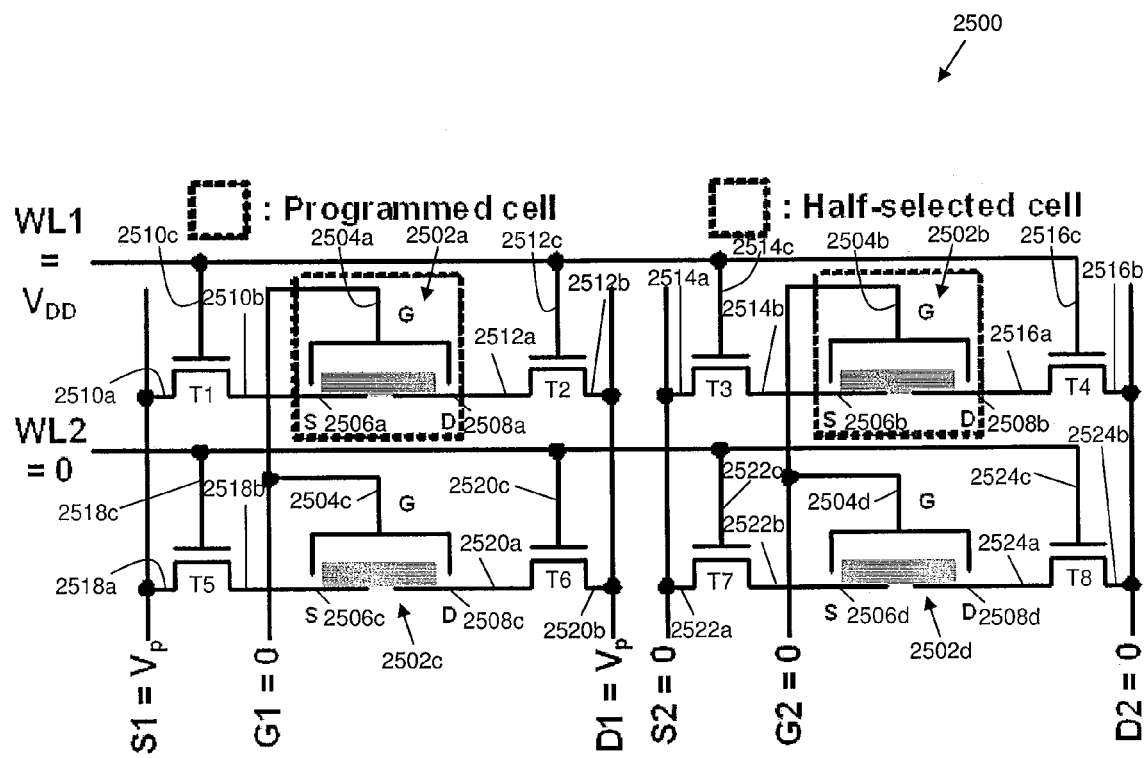
FIG. 25 shows a schematic diagram of a memory array having memory cells according to one embodiment.

FIG. 25 shows a schematic diagram of a memory array 2500. The memory array 2500 includes a plurality of memory cells (e.g. a first memory cell 2502a, a second memory cell 2502b, a third memory cell 2502c, and a fourth memory cell 2502d). Each memory cell 2502a, 2502b, 2502c, 2502d may be the memory cell 100 shown in FIG. 1, the memory cell 100 shown in FIG. 2, the memory cell 100 shown in FIG. 3 or memory cell 100 shown in FIG. 4. In one embodiment, each memory cell 2502a, 2502b, 2502c, 2502d may have a respective gate electrode 2504a, 2504b, 2504c, 2504d, a respective source electrode 2506a, 2506b, 2506c, 2506d, and a respective drain source 2508a, 2508b, 2508c, 2508d.

In one embodiment, the memory array 2500 uses two transistors per bit. Thus, the first memory cell 2502a is coupled to a first transistor T1 and a second transistor T2. The first transistor T1 has a first terminal 2510a, a second terminal 2510b and a controlled terminal 2510c. The second transistor T2 has a first terminal 2512a, a second terminal 2512b and a controlled terminal 2512c. The second terminal 2510b of the first transistor T1 is coupled to the source electrode 2506a of the first memory cell 2502a. The first terminal 2512a of the second transistor T2 is coupled to the drain electrode 2508a of the first memory cell 2502a.

The second memory cell 2502b is coupled to a third transistor T3 and a fourth transistor T4. The third transistor T3 has a first terminal 2514a, a second terminal 2514b and a controlled terminal 2514c. The fourth transistor T4 has a first terminal 2516a, a second terminal 2516b and a controlled terminal 2516c. The second terminal 2514b of the third transistor T3 is coupled to the source electrode 2506b of the second memory cell 2502b. The first terminal 2516a of the fourth transistor T4 is coupled to the drain electrode 2508b of the second memory cell 2502b.

The third memory cell 2502c is coupled to a fifth transistor T5 and a sixth transistor T6. The fifth transistor T5 has a first terminal 2518a, a second terminal 2518b and a controlled terminal 2518c. The sixth transistor T6 has a first terminal 2520a, a second terminal 2520b and a controlled terminal 2520c. The second terminal 2518b of the fifth transistor T5 is coupled to the source electrode 2506c of the third memory cell 2502c. The first terminal 2520a of the sixth transistor T6 is coupled to the drain electrode 2508c of the third memory cell 2502c.

The fourth memory cell 2502d is coupled to a seventh transistor T7 and an eighth transistor T8. The seventh transistor T7 has a first terminal 2522a, a second terminal 2522b and a controlled terminal 2522c. The eighth transistor T8 has a first terminal 2524a, a second terminal 2524b and a controlled terminal 2524c. The second terminal 2522b of the seventh transistor T7 is coupled to the source electrode 2506d of the fourth memory cell 2502d. The first terminal 2524a of the eighth transistor T8 is coupled to the drain electrode 2508d of the fourth memory cell 2502d.

The memory array 2500 may include a plurality of word lines (e.g. a first word line WL1 and a second word line WL2). The first word line WL1 is coupled to the first transistor T1, the second transistor T2, the third transistor T3 and the fourth transistor T4. The first word line WL1 is coupled to the first transistor T1, the second transistor T2, the third transistor T3 and the fourth transistor T4 via the respective controlled terminals 2510c, 2512c, 2514c, 2516c. The second word line WL2 is coupled to the fifth transistor T5, the sixth transistor T6, the seventh transistor T7 and the eighth transistor T8. The second word line WL2 is coupled to the fifth transistor T5, the sixth transistor T6, the seventh transistor T7 and the eighth transistor T8 via the respective gate terminals 2518c, 2520c, 2522c, 2524c.

The memory array 2500 may include a plurality of bit lines (e.g. a first bit line S1, a second bit line G1, a third bit line D1, a fourth bit line S2, a fifth bit line G2, and a sixth bit line D2). The first bit line S1 is coupled to the first terminal 2510a of the first transistor T1 and the first terminal 2518a of the fifth transistor T5. The second bit line G1 is coupled to the gate electrode 2504a of the first memory cell 2502a and the gate electrode 2504c of the third memory cell 2502c. The third bit line S1 is coupled to the second terminal 2512b of the second transistor T2 and the second terminal 2520b of the sixth transistor T6. The fourth bit line S2 is coupled to the first terminal 2514a of the third transistor T3 and the first terminal 2520a of the seventh transistor T7. The fifth bit line G2 is coupled to the gate electrode 2504b of the second memory cell 2502b and the gate electrode 2504d of the fourth memory cell 2502d. The sixth bit line D2 is coupled to the second terminal 2516b of the fourth transistor T4 and the second terminal 2524b of the eighth transistor T8.

The memory array 2500 may use a complementary metal oxide semiconductor (CMOS) addressing scheme to read/write/hold bit cells. Fully-depleted SOI may be used for the memory array 400 in order to be an effective logic device even at high temperature (T<300° C.).

FIG. 26 shows a logic table 2600 of the addressing scheme of the memory array 2400. Row 2602 shows the conditions of a writing 'down' state. In one embodiment, for the writing 'down' state, a supply voltage $V_{DD}$ is applied to the word line, a switching voltage $V_p$ is applied to the bit lines S1/S2 and D1/D2, and no voltage (0V) is applied to the bit line G1/G2. The supply voltage $V_{DD}$ is greater than the switching voltage $V_p$. The supply voltage $V_{DD}$ may be about 3V or smaller.

Referring to FIG. 24, the first memory cell 2402a is in the writing 'down' state with a supply voltage $V_{DD}$ applied to the first word line WL1, a switching voltage $V_p$ applied to the first bit line S1 and the third bit line D1, and 0V applied to the second bit line G1. In the writing 'down' state, a moveable electrode 2450a of the first memory cell 2402a may be contacting the source electrode 2406a and the drain electrode 2408a of the first memory cell 2402a. The first memory cell 2402a is programmed in the writing 'down' state.

Row 2604 shows the conditions of a writing 'up' state. In one embodiment, for the writing 'up' state, a supply voltage $V_{DD}$ is applied to the word line, no voltage (0V) is applied to the bit lines S1/S2 and D1/D2, and a switching voltage $V_p$ is applied to the bit line G1/G2. The supply voltage $V_{DD}$ is greater than the switching voltage $V_p$.

For example, the first memory cell 2402a is in the writing 'down' state if a supply voltage $V_{DD}$ is applied to the first word line WL1, 0V is applied to the first bit line S1 and the third bit line D1, and a switching voltage $V_p$ is applied to the second bit line G1. In the writing 'up' state, the moveable electrode 2450a of the first memory cell 2402a may be contacting the gate electrode 2404a of the first memory cell 2402a. The first memory cell 2402a is programmed in the writing 'up' state.

Row 2606 shows the conditions of a half-selected state. In one embodiment, for the half-selected state, a supply voltage $V_{DD}$ is applied to the word line and no voltage (0V) is applied to the bit lines S1/S2, G1/G2 and D1/D2.

Referring back to FIG. 24, the second memory cell 2402b is in the half-selected state with a supply voltage $V_{DD}$ applied to the first word line WL1 and 0V applied to the fourth bit line S2, the fifth bit line G2 and the sixth bit line D2. The second memory cell 2402b may not be programmed if a same voltage is applied to the gate electrode 2404b, the source electrode 2406b and the drain electrode 2408b of the second memory cell 2402b (e.g. no potential difference between the gate electrode 2404b, the source electrode 2406b and the drain electrode 2408b of the second memory cell 2402b).

Row 2608 shows the conditions of an unselected state. In one embodiment, for the unselected state, no voltage (0V) is applied to the word line and no voltage (0V) or a switching voltage $V_p$ is applied to the bit line G1/G2.

Referring back to FIG. 24, the third memory cell 2402c is in the unselected state with 0V applied to the second word line WL2 and 0V applied to the second bit line G1. The fourth memory cell 2402d is also in the unselected state with 0V applied to the second word line WL2 and 0V applied to the fifth bit line G2. There may be floating source or drain following a voltage change applied to the gate.

The READ time and the WRITE time of the memory array 2400 may be dependent on the addressing scheme. In one embodiment, the READ time may be equal or less than 50 ns/bit, and the WRITE time may be equal or less than 100 ns/bit.

While the preferred embodiments of the devices and methods have been described in reference to the environment in which they were developed, they are merely illustrative of the principles of the inventions. Other embodiments and configurations may be devised without departing from the spirit of the inventions and the scope of the appended claims.

We claim:

1. A memory cell, comprising:
   a substrate;
   at least one first electrode disposed above the substrate;
   at least one second electrode disposed above the at least one first electrode; and
   a moveable electrode disposed between the at least one first electrode and the at least one second electrode;
   wherein the moveable electrode is configured to move between the at least one first electrode and the at least one second electrode;
   wherein the moveable electrode comprises metal;
   wherein the at least one first electrode comprises a gate electrode, and wherein the at least one second electrode comprises a drain electrode and a source electrode.

2. The memory cell of claim 1, wherein the moveable electrode is configured to move from the at least one first electrode to the at least one second electrode when a voltage applied to the at least one second electrode is larger than a voltage applied to the at least one first electrode.

3. The memory cell of claim 2, wherein the voltage applied to the at least one second electrode causes a first electrostatic force in a direction towards the at least one second electrode to be applied to the moveable electrode.

4. The memory cell of claim 3, wherein the voltage applied to the at least one first electrode causes a second electrostatic force in a direction towards the at least one first electrode to be applied to the moveable electrode.

5. The memory cell of claim 4, wherein the first electrostatic force is larger than the second electrostatic force and an adhesion force between the moveable electrode and the at least one first electrode.

6. The memory cell of claim 2, wherein the moveable electrode is configured to contact the at least one second electrode when no voltage is applied to the at least one first electrode and the at least one second electrode.

7. The memory cell of claim 1, wherein the moveable electrode is configured to move from the at least one second electrode to the at least one first electrode when a voltage applied to the at least one first electrode is larger than a voltage applied to the at least one second electrode.

8. The memory cell of claim 7, wherein the voltage applied to the at least one first electrode causes a first electrostatic force in a direction towards the at least one first electrode to be applied to the moveable electrode.

9. The memory cell of claim 8, wherein the voltage applied to the at least one second electrode causes a second electrostatic force in a direction towards the at least one second electrode to be applied to the moveable electrode.

10. The memory cell of claim 9, wherein the first electrostatic force is larger than the second electrostatic force and an adhesion force between the moveable electrode and the at least one second electrode.

11. The memory cell of claim 7, wherein the moveable electrode is configured to contact the at least one first electrode when no voltage is applied to the at least one first electrode and the at least one second electrode.

12. The memory cell of claim 1, further comprising an insulator layer disposed between the at least one first electrode and the at least one second electrode.

13. The memory cell of claim 12, wherein the insulator layer, the at least one first electrode and the at least one second electrode define a cavity for guiding the movement of the moveable electrode between the at least one first electrode and the at least one second electrode.

14. The memory cell of claim 12, further comprising a further insulator layer disposed between the substrate and the at least one first electrode.

15. The memory cell of claim 1, further comprising a further gate electrode disposed above the drain electrode and the source electrode.

16. A method of manufacturing a memory cell, the method comprising:
   providing a first metal layer and patterning the first metal layer to form at least one first electrode;
   depositing a first sacrificial layer above the first metal layer;
   depositing a second metal layer above the first sacrificial layer;
   depositing a second sacrificial layer above the second metal layer;
   depositing a third metal layer above the second sacrificial layer;
   depositing a first sacrificial pillar structure at one side of the first sacrificial layer, the second metal layer, the second sacrificial layer and the third metal layer, and a second sacrificial pillar structure at the other side of the first sacrificial layer, the second metal layer, the second sacrificial layer and the third metal layer;
   depositing a first insulator layer above the third metal layer, the first sacrificial pillar structure, the second sacrificial pillar structure and the first metal layer;
   etching an opening in the first insulator layer to expose a portion of the third metal layer;
   depositing a fourth metal layer above the first insulator layer and the exposed portion of the third metal layer;
   etching an opening in the fourth metal layer and the third metal layer to form at least one second electrode;
   removing the first sacrificial layer, the second sacrificial layer, the first sacrificial pillar structure and the second sacrificial pillar structure to form a moveable electrode and to provide a cavity for guiding movement of the moveable electrode between the at least one first electrode and the at least one second electrode;
   wherein the at least one first electrode comprises a gate electrode, and wherein the at least one second electrode comprises a drain electrode and a source electrode.

17. The method of claim 16:
   wherein the first metal layer is deposited above a second insulator layer; and
   wherein the second insulator layer is deposited above a substrate.

* * * * *